(12) United States Patent
Kim et al.

(10) Patent No.: US 8,647,753 B2
(45) Date of Patent: Feb. 11, 2014

(54) ORGANIC ELECTROLUMINESCENCE DEVICE

(75) Inventors: Jung Keun Kim, Seoul (KR); Jeong Dae Seo, Gwacheon-si (KR); Hyun Cheol Jeong, Jinju-si (KR); Chun Gun Park, Seoul (KR); Jong Kwan Bin, Yong-Ion-si (KR)

(73) Assignee: LG Display Co., Ltd., Seoul (KR)

( * ) Notice: Subject to any disclaimer, the term of this patent is extended or adjusted under 35 U.S.C. 154(b) by 889 days.

(21) Appl. No.: 11/545,732

(22) Filed: Oct. 11, 2006

(65) Prior Publication Data
US 2007/0087222 A1    Apr. 19, 2007

(30) Foreign Application Priority Data

Oct. 12, 2005  (KR) .......... 10-2005-0096003
Oct. 12, 2005  (KR) .......... 10-2005-0096004

(51) Int. Cl.
*H01L 51/54*  (2006.01)
(52) U.S. Cl.
USPC ............ 428/690; 428/917; 313/504; 313/506
(58) Field of Classification Search
None
See application file for complete search history.

(56) References Cited

U.S. PATENT DOCUMENTS

| | | | |
|---|---|---|---|
| 5,935,721 A * | 8/1999 | Shi et al. ............... | 428/690 |
| 6,818,329 B1 * | 11/2004 | Liao et al. ............. | 428/690 |
| 2003/0072966 A1 * | 4/2003 | Hosokawa et al. ..... | 428/690 |
| 2003/0118866 A1 * | 6/2003 | Oh et al. ............... | 428/690 |
| 2003/0157365 A1 * | 8/2003 | Kinoshita et al. ..... | 428/690 |
| 2004/0001969 A1 * | 1/2004 | Cosimbescu et al. .. | 428/690 |
| 2004/0076853 A1 * | 4/2004 | Jarikov ................. | 428/690 |
| 2004/0209118 A1 * | 10/2004 | Seo et al. .............. | 428/690 |
| 2005/0048313 A1 * | 3/2005 | Sotoyama .............. | 428/690 |
| 2005/0104511 A1 * | 5/2005 | Liao et al. ............. | 313/504 |
| 2005/0175857 A1 * | 8/2005 | Coggan et al. ........ | 428/690 |
| 2005/0260442 A1 | 11/2005 | Yu et al. ............... | 428/690 |
| 2006/0008672 A1 * | 1/2006 | Jarikov ................. | 428/690 |
| 2006/0040131 A1 * | 2/2006 | Klubek et al. ........ | 428/690 |
| 2007/0092759 A1 * | 4/2007 | Begley et al. ......... | 428/690 |
| 2007/0252516 A1 * | 11/2007 | Kondakova et al. ... | 313/504 |

FOREIGN PATENT DOCUMENTS

| | | |
|---|---|---|
| CN | 1292022 A | 4/2001 |
| CN | 1395454 A | 2/2002 |
| CN | 1583691 A | 2/2005 |
| EP | 1 061 112 A1 | 12/2000 |
| JP | 07-109449 | 4/1995 |
| JP | 2004-91334 | 3/2004 |

OTHER PUBLICATIONS

Machine translation for JP 07-109449, published Apr. 1995.*
European Office Action dated Feb. 14, 2007.

* cited by examiner

*Primary Examiner* — Dawn L. Garrett
(74) *Attorney, Agent, or Firm* — Morgan, Lewis & Bockius LLP

(57) ABSTRACT

Disclosed is an organic electroluminescent device comprising a structure having an anode, an emitting layer, and a cathode stacked therein, wherein a fluorescent compound represented by Formula 1 is used as a emitting material of the emitting layer or used as a dopant of the emitting layer:

(Formula 1)

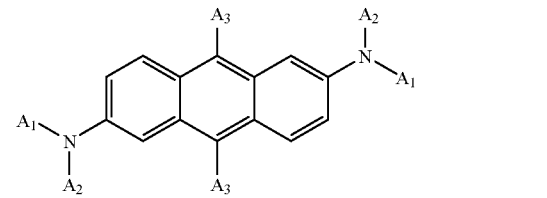

wherein $A_1$ and $A_2$ are independently selected from a substituted or unsubstituted $C_1$-$C_6$ aliphatic group, a $C_6$-$C_{20}$ aromatic group and a $C_5$-$C_{19}$ heterocyclic group containing N, S or O, $A_3$ is selected from a substituted or unsubstituted $C_1$-$C_6$ aliphatic group, a $C_6$-$C_{20}$ aromatic group, a $C_5$-$C_{19}$ heterocyclic group containing N, S or O, and a hydrogen atom, and substituents of $A_1$, $A_2$ and $A_3$ are respectively one or more and the substituent is selected from the group consisting of $C_1$-$C_{10}$ alkyl, $C_1$-$C_1$ alkoxy, $C_1$-$C_{10}$ alkylamino, $C_1$-$C_{10}$ alkylsilyl, a halogen atom, $C_6$-$C_{10}$ aryl, $C_6$-$C_{10}$ aryloxy, $C_6$-$C_{10}$ arylamino, $C_6$-$C_{10}$ arylsilyl and a hydrogen atom.

16 Claims, 1 Drawing Sheet

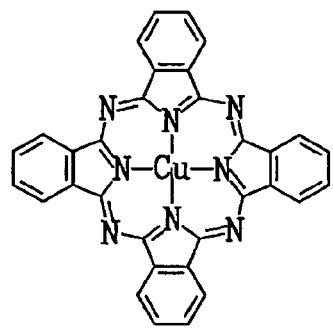
CuPC
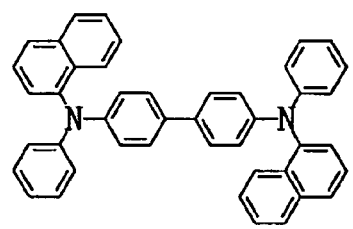
NPC
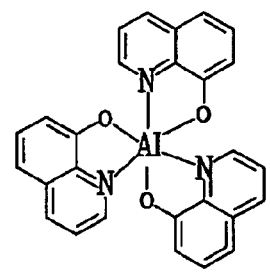
Alq$_3$
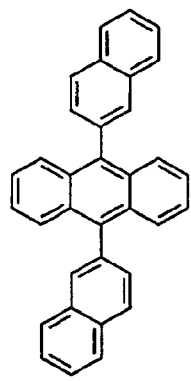
H-1
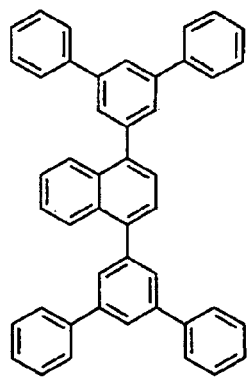
H-2
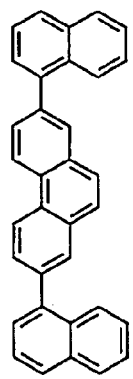
H-3
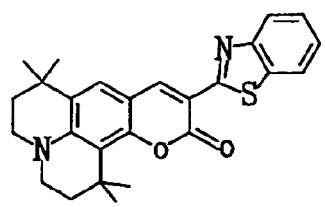
D-1

ORGANIC ELECTROLUMINESCENCE DEVICE

This application claims the benefit of Korean Patent Application No. 10-2005-0096003, and 10-2005-0096004 filed on Oct. 12, 2005, which is hereby incorporated by reference as if fully set forth herein.

BACKGROUND OF THE INVENTION

1. Field of the Invention

The present invention relates to an organic electroluminescent device, and more particularly, to an organic electroluminescent (EL) device comprising a structure having an anode, an emitting layer, and a cathode stacked therein, wherein a fluorescent compound of Formula 1 is used as a emitting material of the emitting layer of the EL device, or used as a dopant of the emitting layer of the EL device, a fluorescent compound of Formula 1 is used as a dopant and a fluorescent compound of Formula 2 is used as a host of the emitting layer of the EL device.

Recently, an increase in sizes of displays has raised an increasing need for flat-panel displays taking up a small space. There have been rapid developments in the technology of organic electroluminescent (EL) devices, also called organic light emitting diodes (OLEDs), among these including flat-panel displays, and various pilot products thereof have already been released.

2. Discussion of the Related Art

An organic electroluminescent (EL) device is a system that emits light when electrons recombine with holes to thereby form electron-hole pairs and then they disappear, via injection of electric charges into an organic film formed between an electron-injection electrode (cathode) and a hole-injection electrode (anode). The organic electroluminescent device exhibits advantages such as capability to fabricate the device on a flexible and transparent substrate such as plastic materials, capability to operate at a lower voltage (less than 10 volts) compared to plasma display panels or inorganic EL displays, relatively low consumption of electric power, and superior tunability of colors of emitting light to desired colors. In addition, organic EL devices can display light of three colors, i.e., green, blue and red light, and thus have been receiving a great deal of attention as a next generation of displays capable of emitting various colors.

A method for fabricating a conventional organic EL device will be briefly reviewed as follows.

First, an anode material is deposited on a transparent substrate. As the anode material, indium tin oxide (ITO) is commonly used.

Next, a hole-injection layer (HIL) is deposited thereon. As the hole-injection layer, copper phthalocyanine (CuPc) is usually deposited to a thickness of 10 to 30 nm on the anode.

Next, a hole-transport layer (HTL) is deposited on the hole-injection layer. 4,4'-bis[N-(1-naphthyl)-N-phenylamino]biphenyl (NPB), as the hole-transport layer (HTL), is deposited to a thickness of 30 to 60 nm on the hole-injection layer.

An organic emitting layer is then formed on the hole-transport layer. Herein, if necessary, a dopant may be added to the organic emitting layer. For example, if it is desired to fabricate the organic EL device emitting green light, tris(8-hydroxy-quinolate)aluminum (hereinafter, referred to simply as $Alq_3$) as the organic emitting layer is deposited to a thickness of about 30 to 60 nm. Herein, N-methylquinacridone (MQD) is primarily employed as the dopant.

Then, an electron-transport layer (ETL) and an electron-injection layer (EIL) are sequentially deposited on the organic emitting layer, or otherwise an electron-injection/transport layer is formed thereon. If it is desired to emit green light, an electron-injection layer (EIL)/electron-transport layer (ETL) may not necessary because $Alq_3$ used for the organic emitting layer has high electron-transporting ability.

Then, a cathode is formed thereon and finally, a protective film is additionally coated on the resulting structure.

Depending upon how the emitting layer is formed in the resulting structure, it is possible to fabricate a blue-, green- or red-emitting device as desired. Meanwhile, materials used as emitting compounds to realize conventional emitting devices have suffered from problems associated with poor operating lifetime and luminous efficiency.

SUMMARY OF THE INVENTION

Accordingly, the present invention is directed to an organic electroluminescent device that substantially obviates one or more problems due to limitations and disadvantages of the related art.

An object of the present invention is to provide an organic electroluminescent device having high-color purity, high luminance and long lifetime via syntheses of compounds of Formula 1 and Formula 2.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawing.

To achieve these objects and other advantages and in accordance with the purpose of the invention, as embodied and broadly described herein, the present invention provides an organic electroluminescent device comprising a structure having an anode, an emitting layer, and a cathode stacked therein, wherein a fluorescent compound represented by Formula 1 below is used a emitting material of the emitting layer of the EL device.

The present invention also provides an organic electroluminescent device comprising a structure having an anode, an emitting layer, and a cathode stacked therein, wherein a fluorescent compound represented by Formula 1 below is used as a dopant of the emitting layer of the EL device.

Where said Formula 1 is used as a emitting material of the emitting layer of the EL device, said EL device will emit orange color, and a coordinates of orange color is CIE X=0.45~0.60, CIE Y=0.30~0.50. Where said Formula 1 is used as a dopant of the emitting layer of the EL device, said EL device will emit green color, and a coordinates of green color is CIE X=0.45~0.60, CIE Y=0.30~0.50.

(Formula 1)

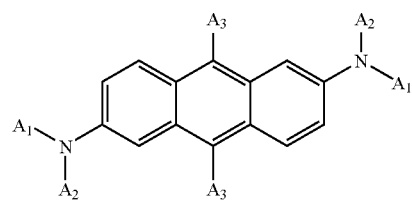

wherein $A_1$ and $A_2$ are independently selected from a substituted or unsubstituted $C_1$-$C_6$ aliphatic group, a $C_6$-$C_{20}$ aromatic group and a $C_5$-$C_{19}$ heterocyclic group containing N, S or O, and $A_3$ is selected from a substituted or unsubstituted $C_1$-$C_6$ aliphatic group, a $C_6$-$C_{20}$ aromatic group, a $C_5$-$C_{19}$ heterocyclic group containing N, S or O, and a hydrogen atom.

In Formula 1, substituents of $A_1$, $A_2$ and $A_3$ may be one or more, respectively and the substituent is selected from the group consisting of $C_1$-$C_{10}$ alkyl, $C_1$-$C_{10}$ alkoxy, $C_1$-$C_{10}$ alkylamino, $C_1$-$C_{10}$ alkylsilyl, a halogen atom, $C_6$-$C_{10}$ aryl, $C_6$-$C_{10}$ aryloxy, $C_6$-$C_{10}$ arylamino, $C_6$-$C_{10}$ arylsilyl and a hydrogen atom.

The present invention also provides an organic electroluminescent device comprising a structure having an anode, an emitting layer, and a cathode stacked therein, wherein a fluorescent compound represented by Formula 1 above is used as a dopant and a fluorescent compound represented by Formula 2 below is used as a host of the emitting layer of the EL device.

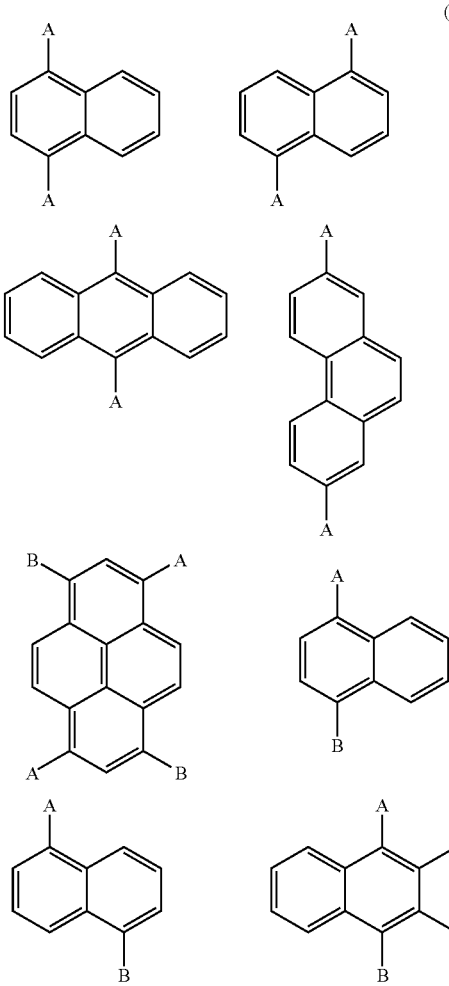

(Formula 2)

Wherein A is independently selected from a substituted or unsubstituted $C_6$-$C_{30}$ aromatic group, B is independently selected from a substituted or unsubstituted $C_6$-$C_{30}$ aromatic group and a hydrogen atom.

In Formula 2, substituents of A and B may be one or more, respectively, and the substituent is selected from the group consisting of $C_1$-$C_{10}$ alkyl and a hydrogen atom.

Where the compound of Formula 1 is used as the dopant of the emitting layer, a doping concentration thereof is preferably in a range of 0.5 to 10% by weight.

Specific examples of the compound represented by Formula 1 include the following compounds G-01 through G-156:

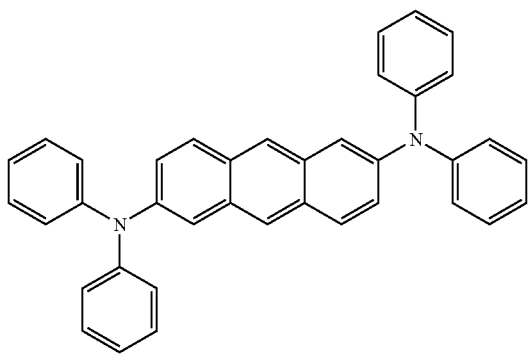

G-01

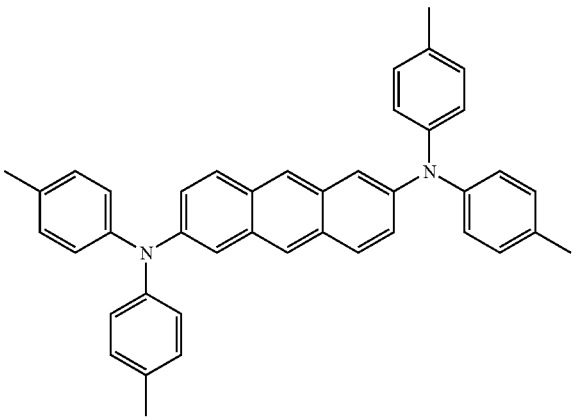

G-02

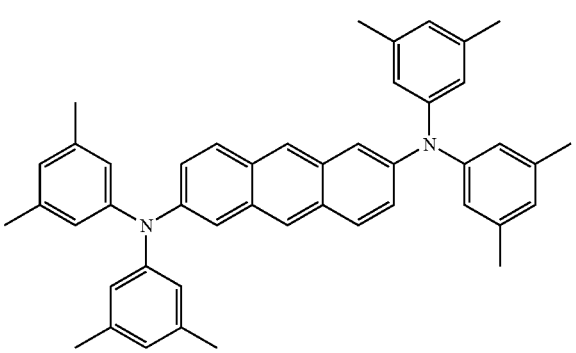

G-03

G-04
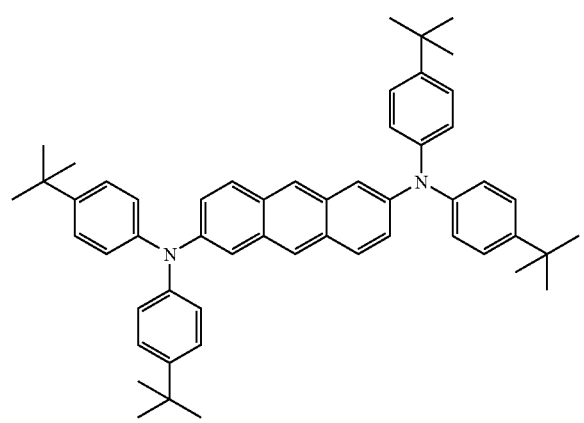
G-05
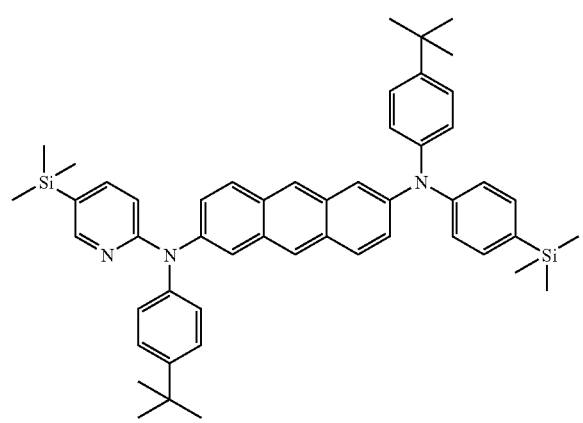
G-06
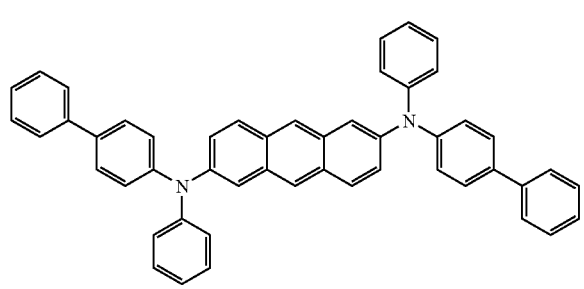
G-07
G-08
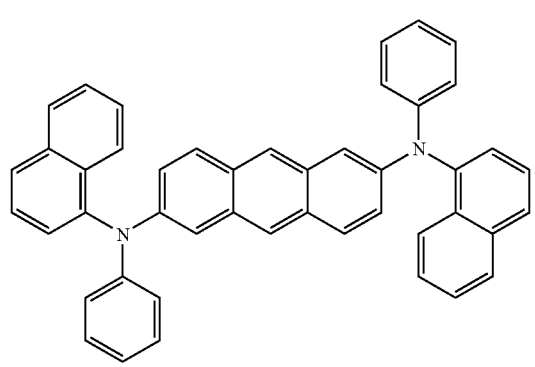
G-09
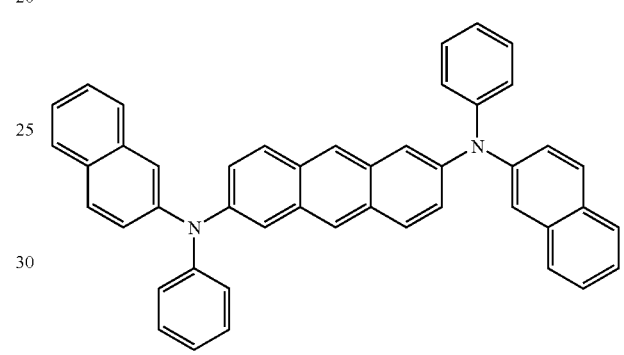
G-10
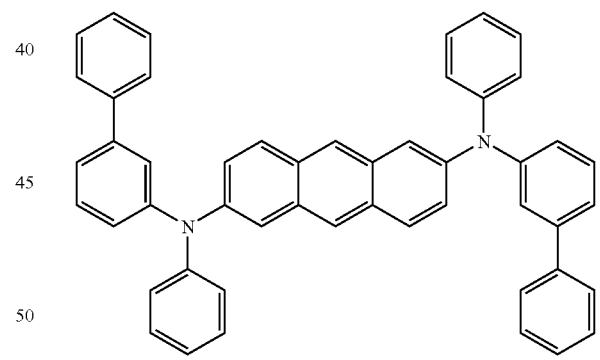
G-11
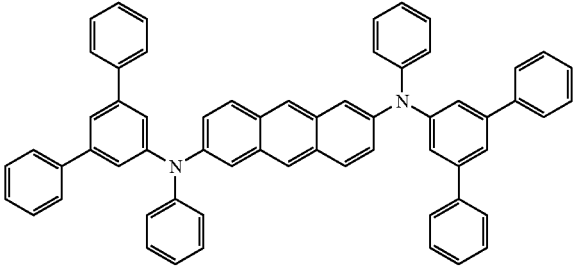

G-12
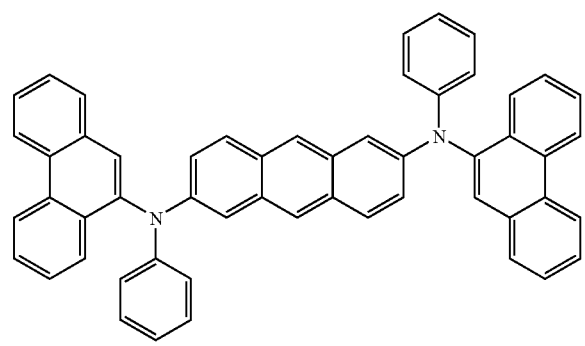
G-13
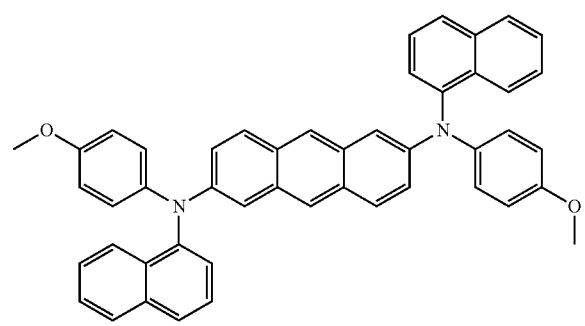
G-14
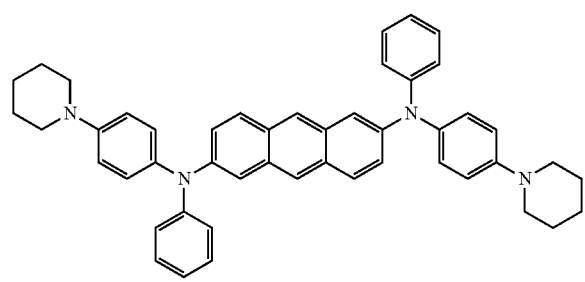
G-15
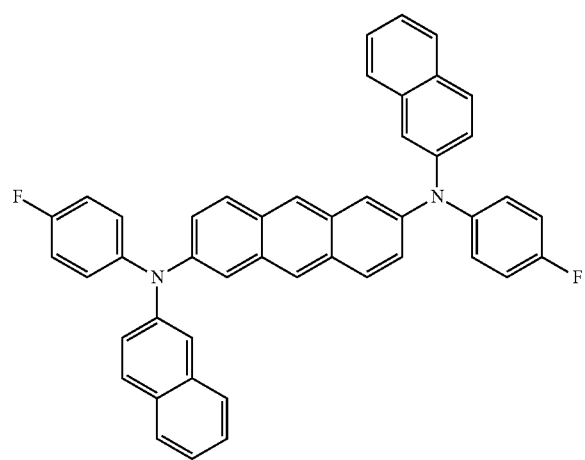
G-16
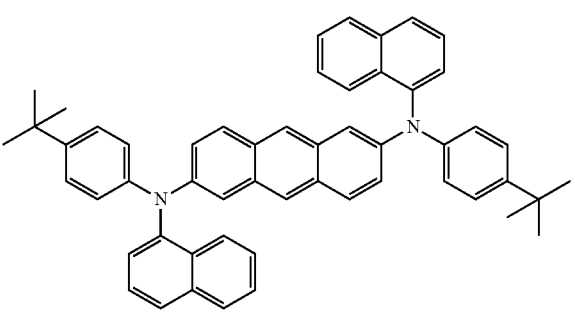
G-17
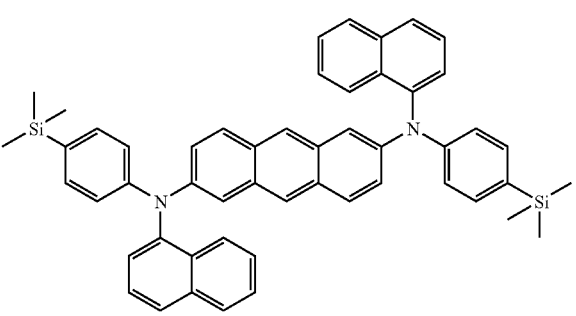
G-18
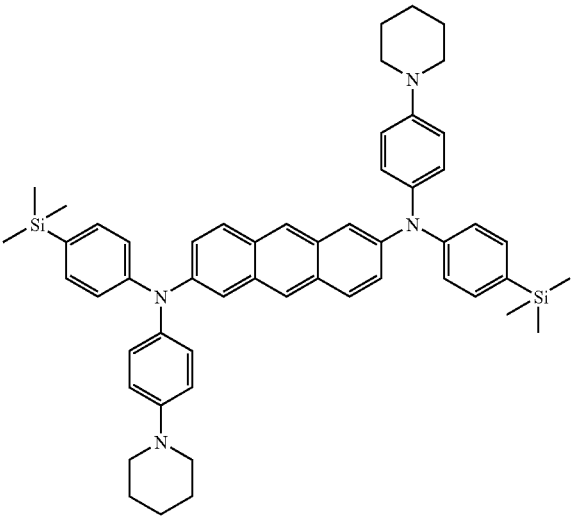
G-19
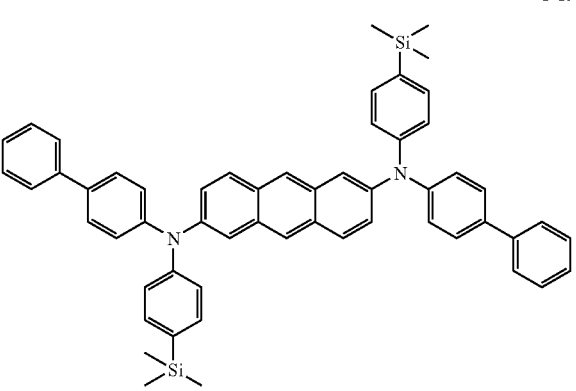

G-20
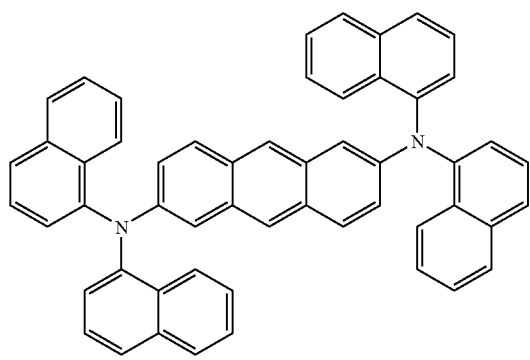
G-21
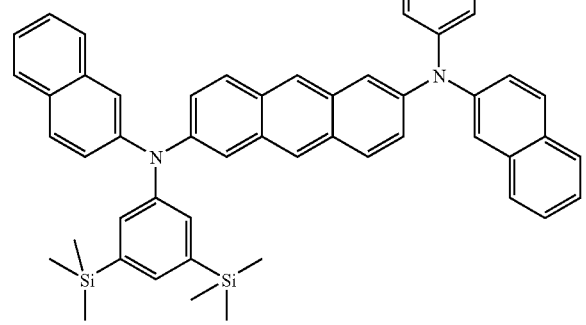
G-22
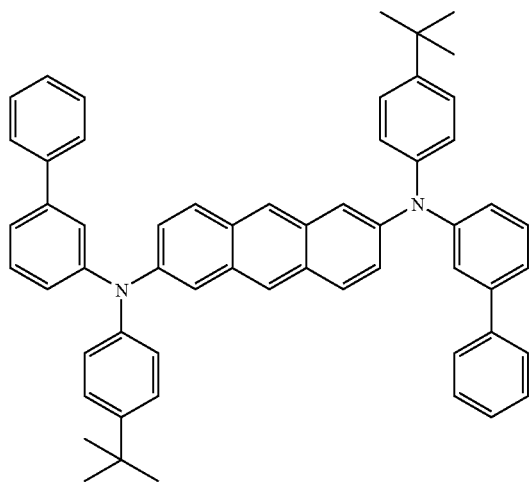
G-23
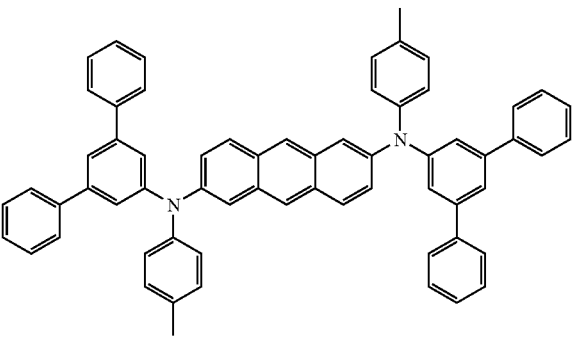
G-24
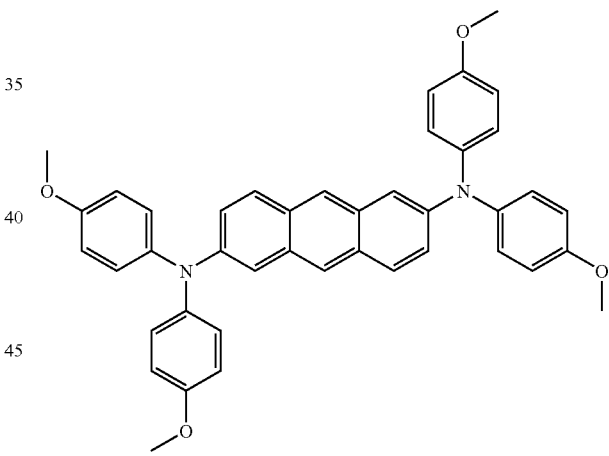
G-25
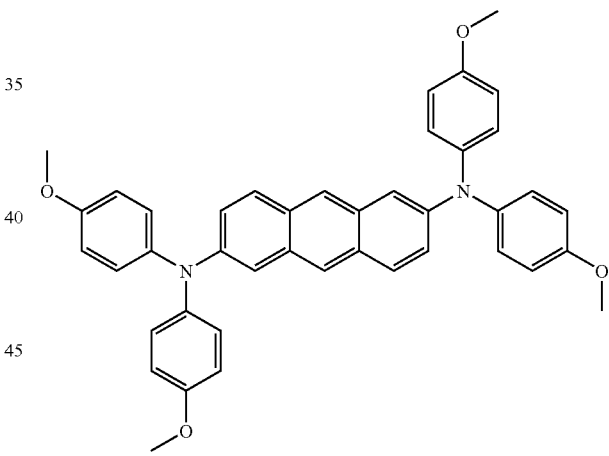
G-26
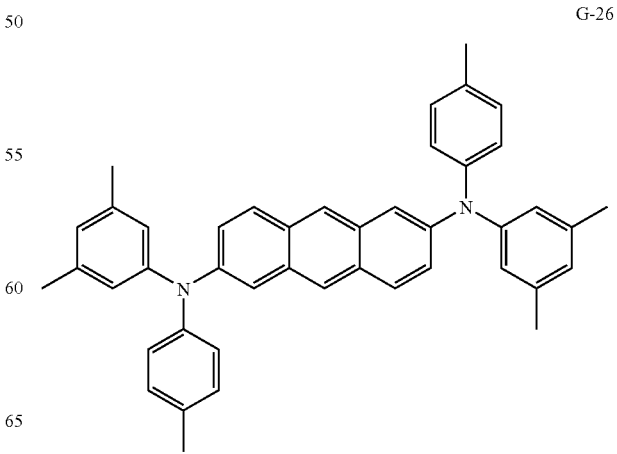

G-27 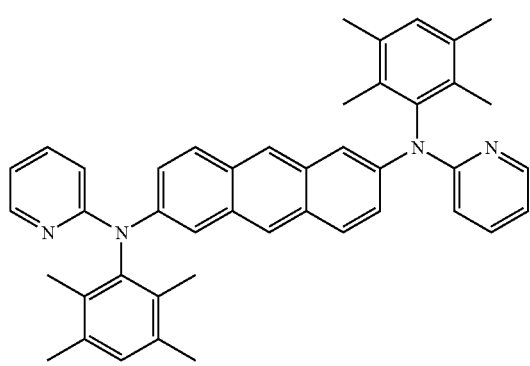
G-28 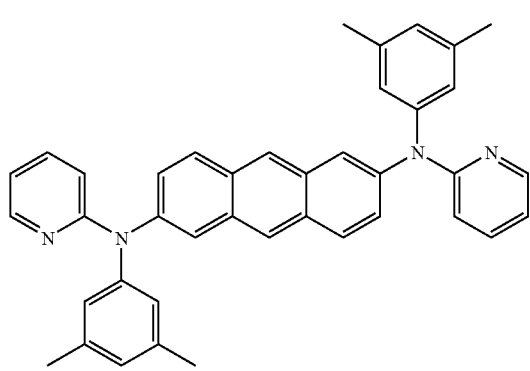
G-29 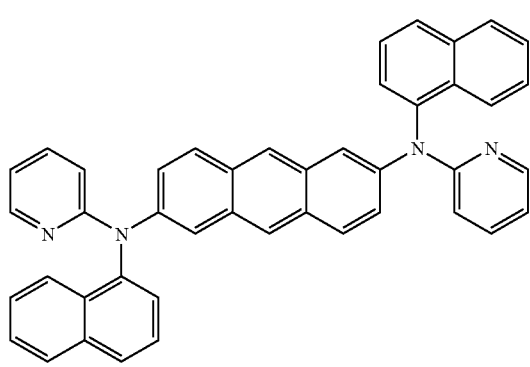
G-30 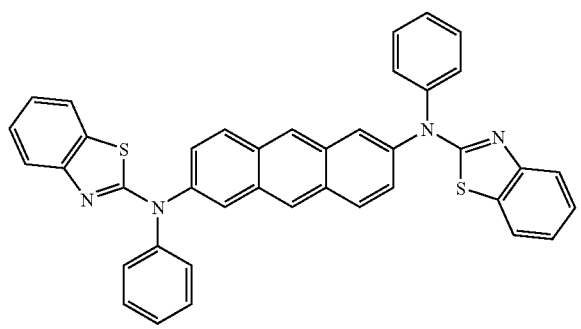
G-31 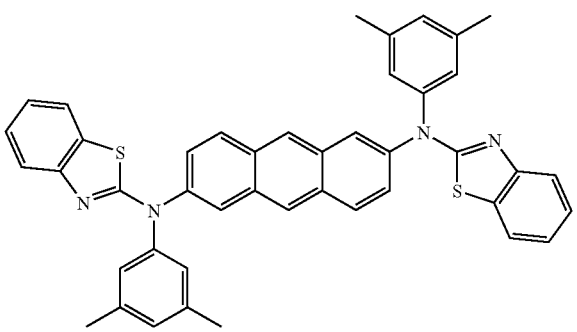
G-32 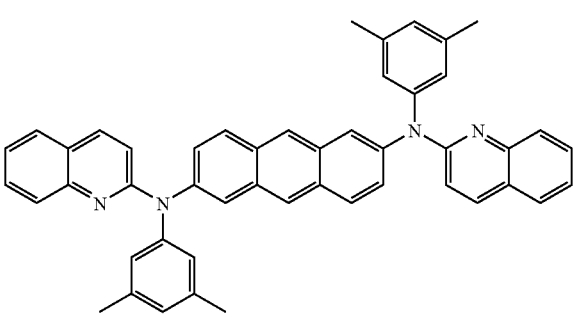
G-33 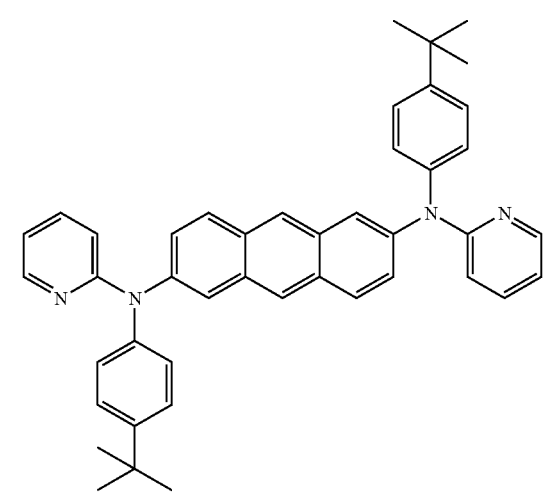
G-34 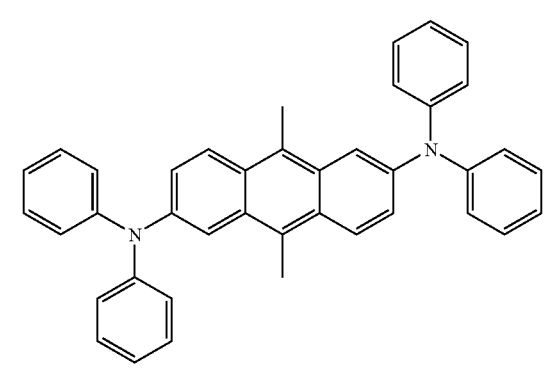

G-35

G-36

G-37

G-38

G-39

G-40

G-41

G-42

G-43
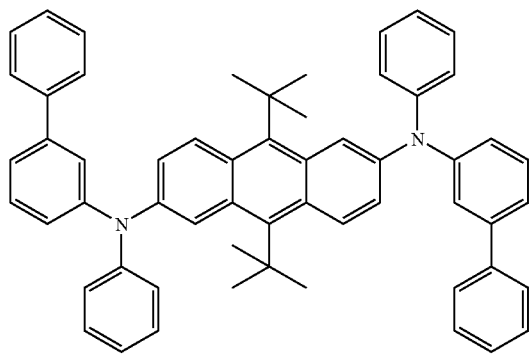
G-47
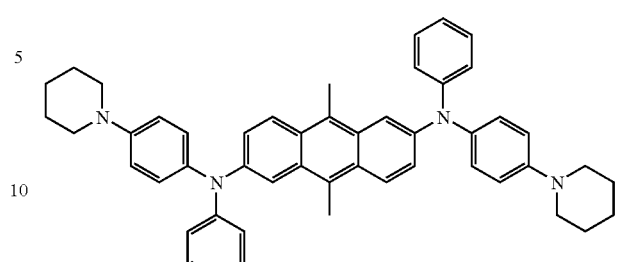
G-44
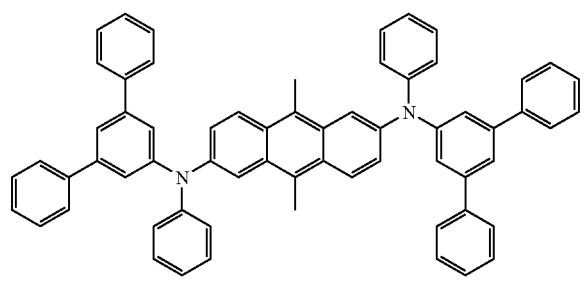
G-48
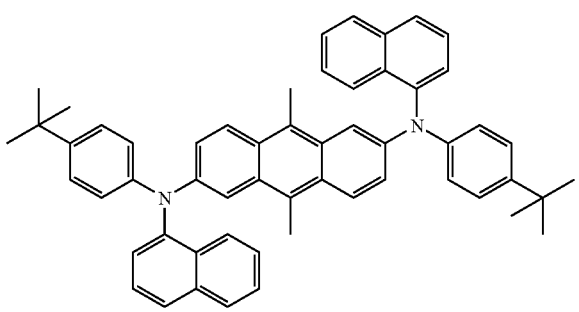
G-45
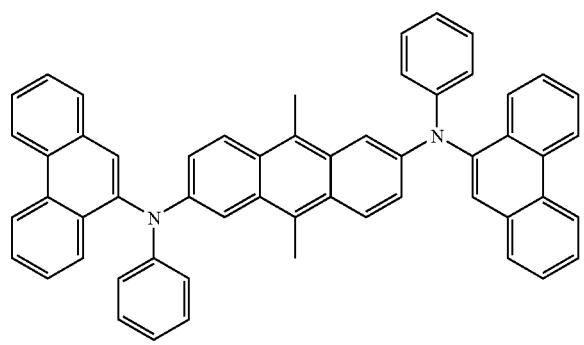
G-49
G-46
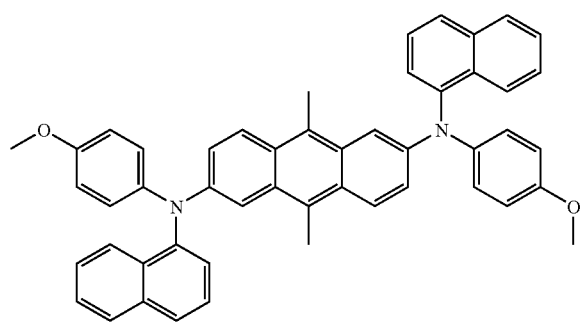
G-50
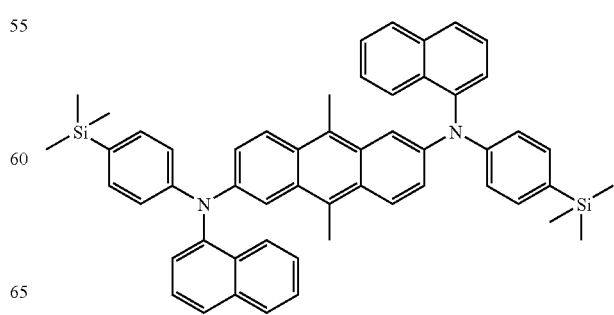

G-51
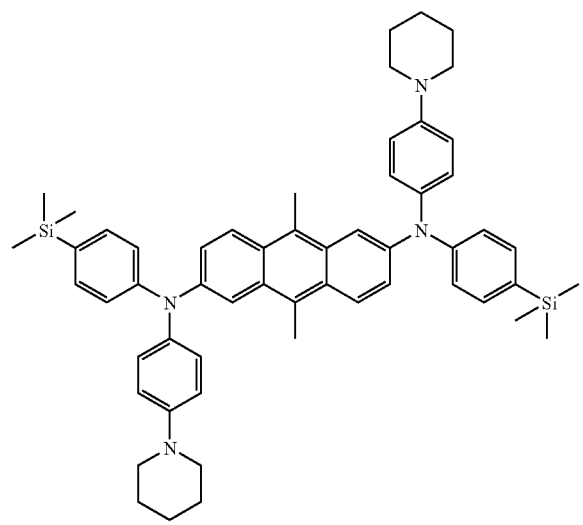
G-52
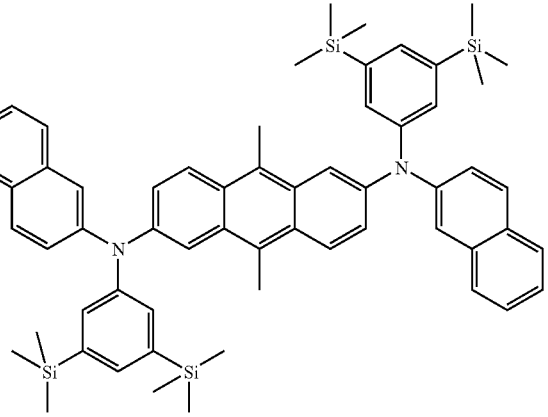
G-53
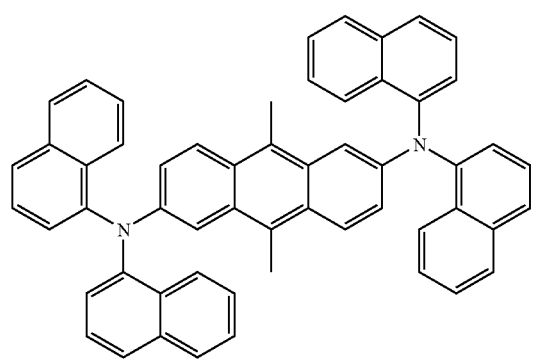
G-54
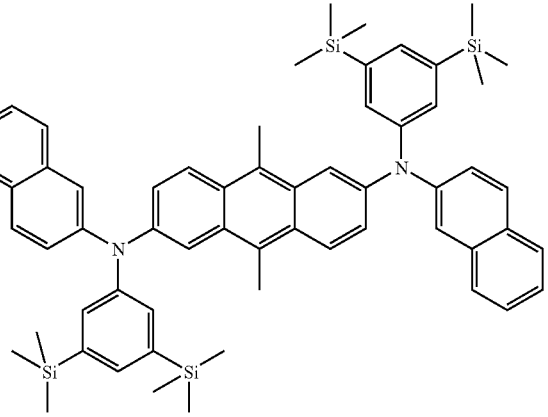
G-55
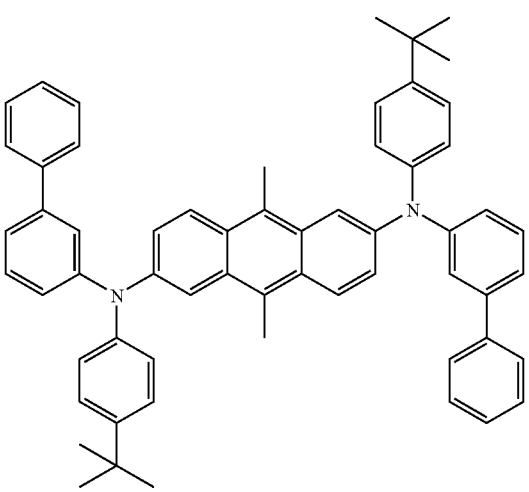
G-56
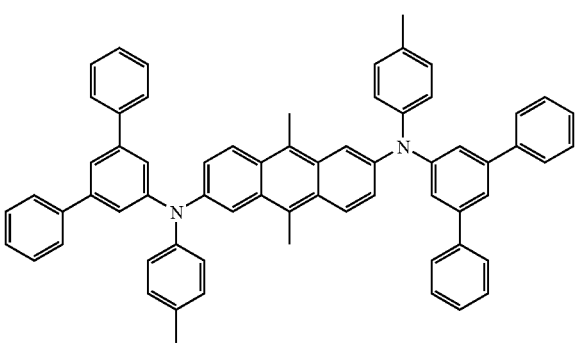
G-57
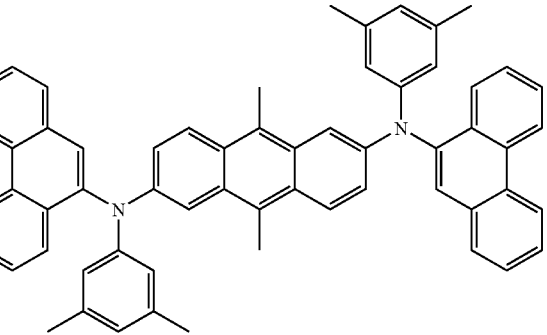

G-58
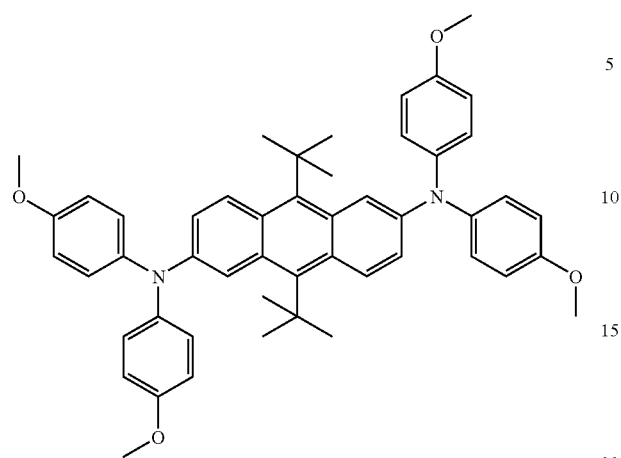
G-62
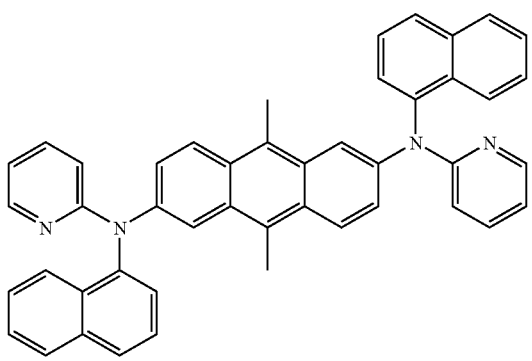
G-59
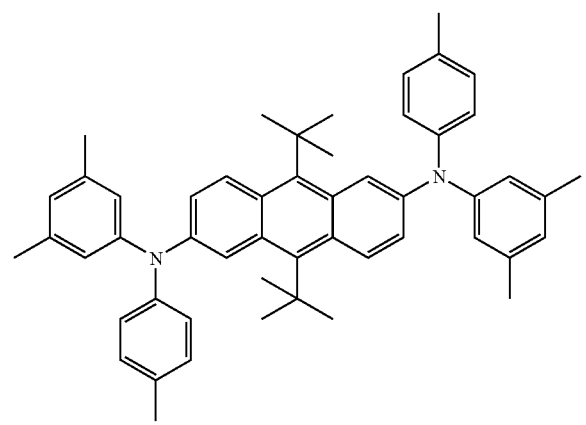
G-63
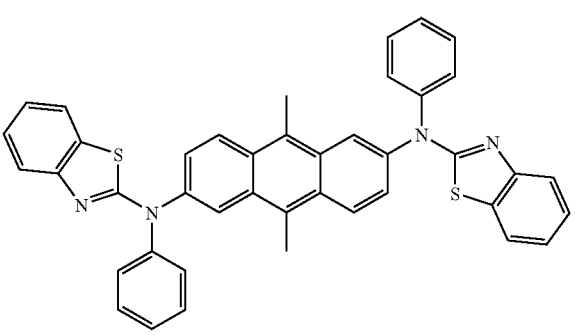
G-60
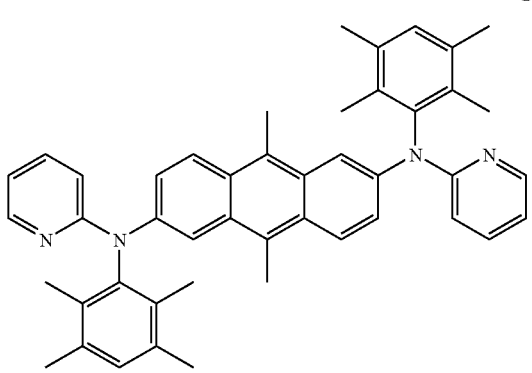
G-64
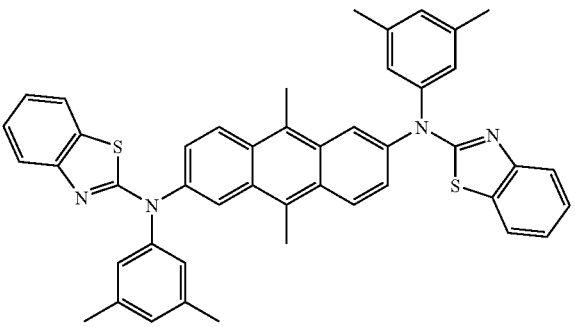
G-61
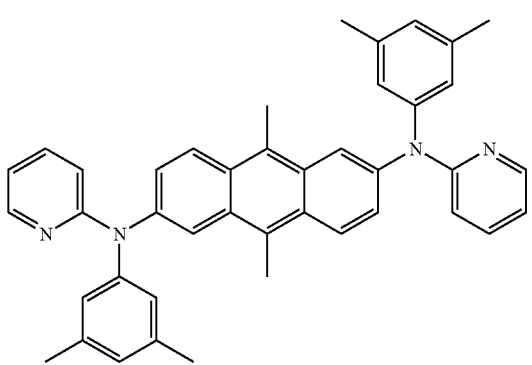
G-65
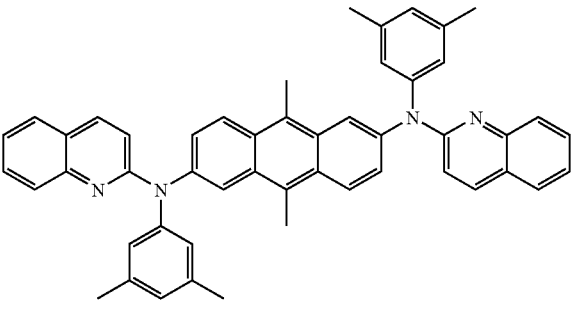

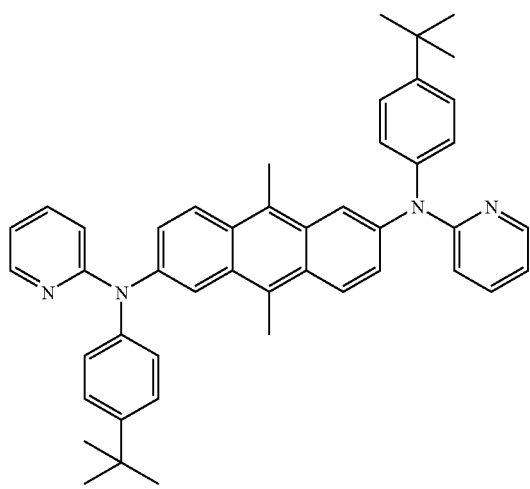
G-66
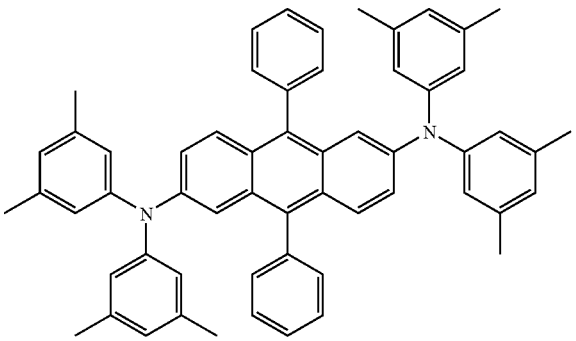
G-69
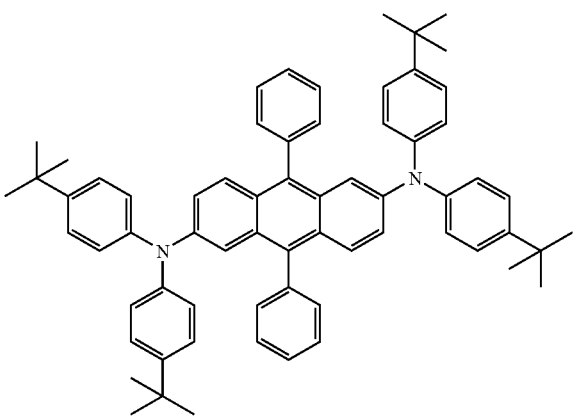
G-70
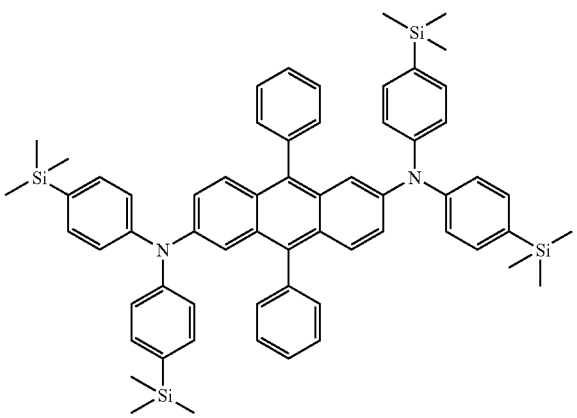
G-71
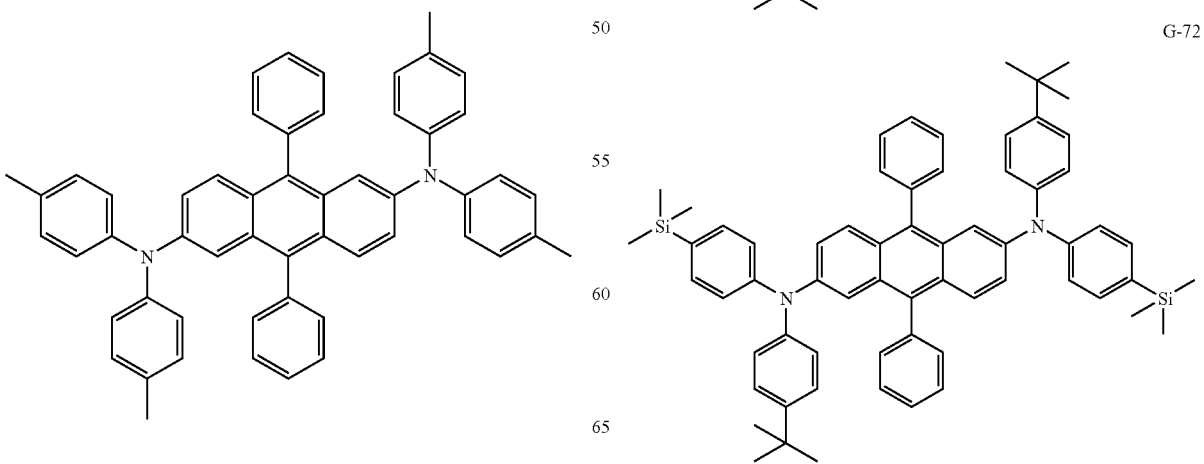
G-67, G-68, G-72

-continued
G-73
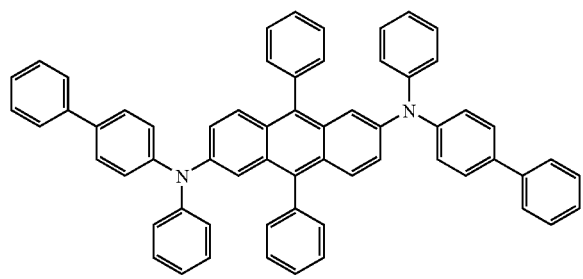
G-77
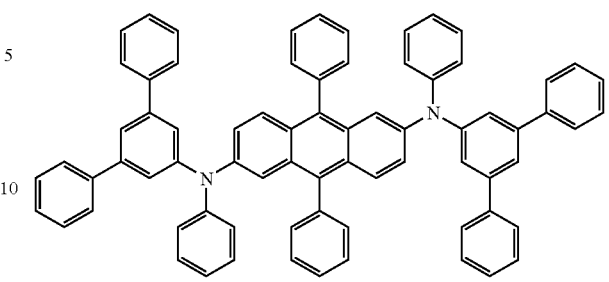
G-74
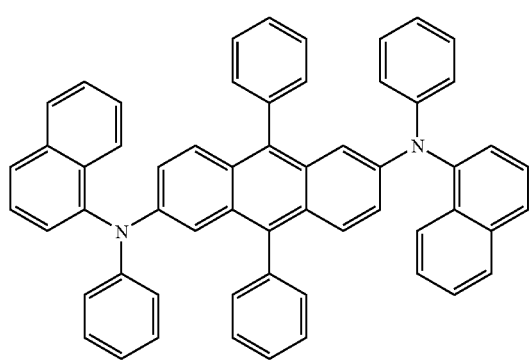
G-78
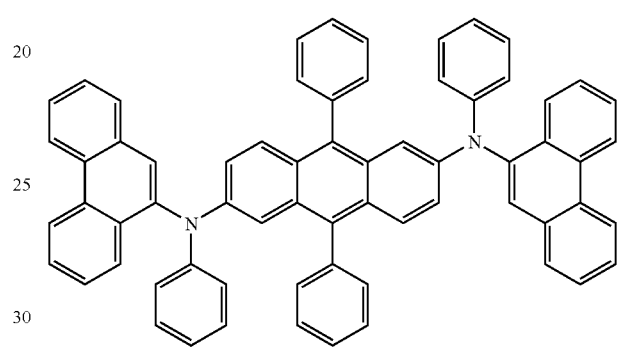
G-75
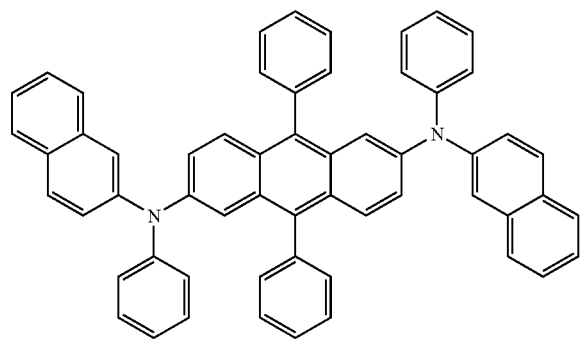
G-79
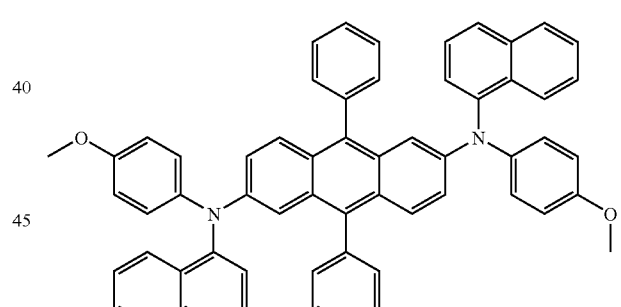
G-76
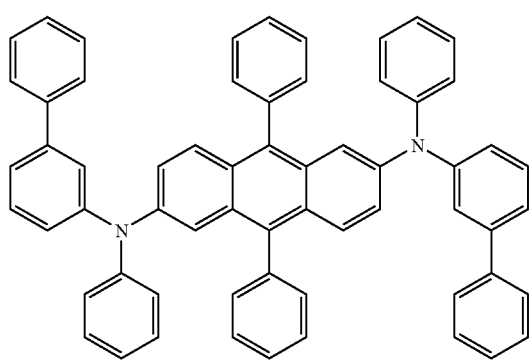
G-80
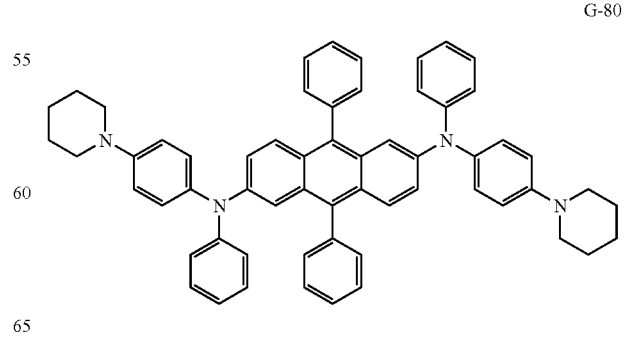

-continued
G-81
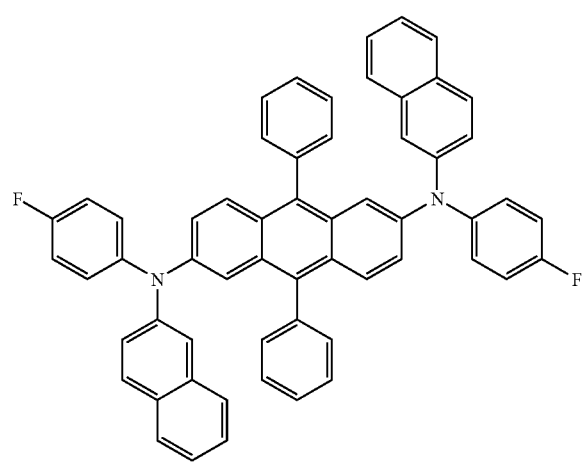
G-82
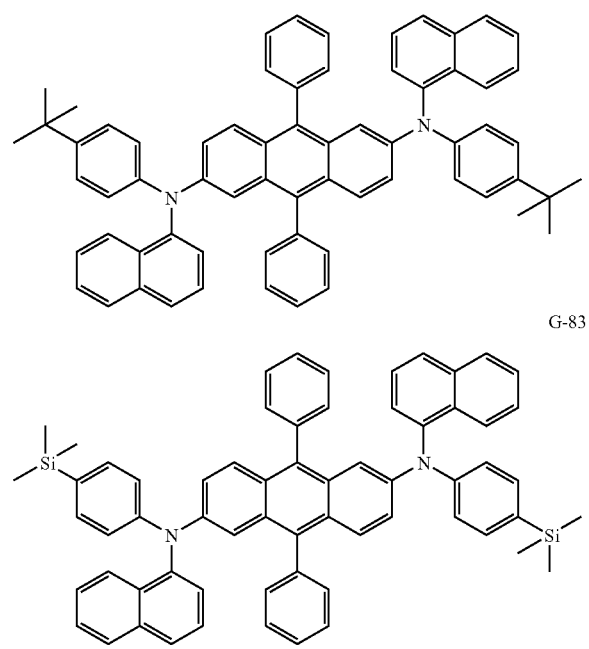
G-83
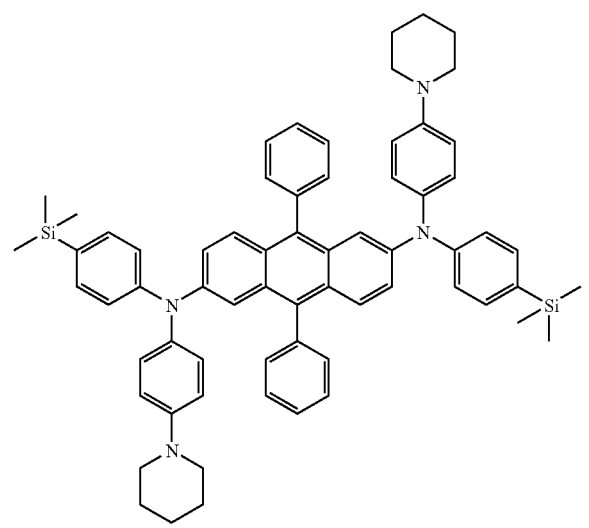
-continued
G-85
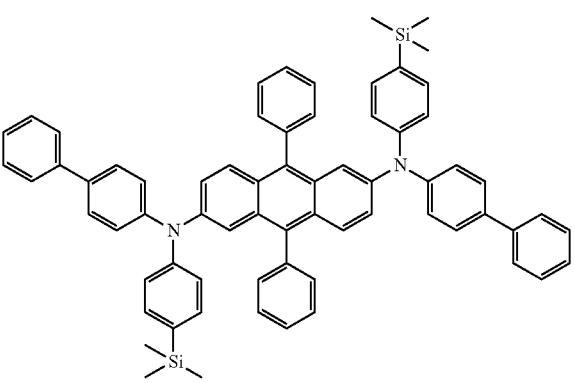
G-86
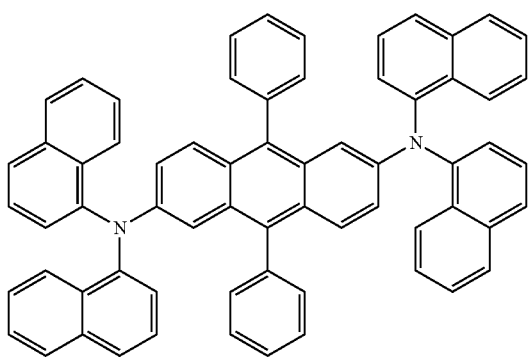
G-87
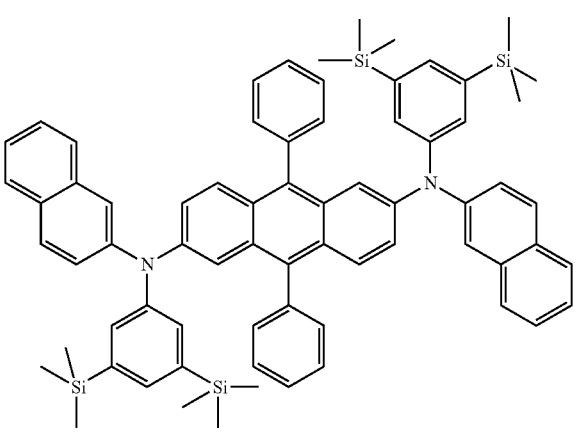
G-84

G-88
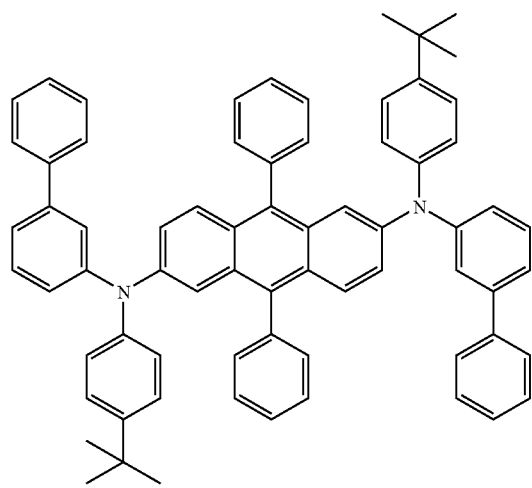
G-91
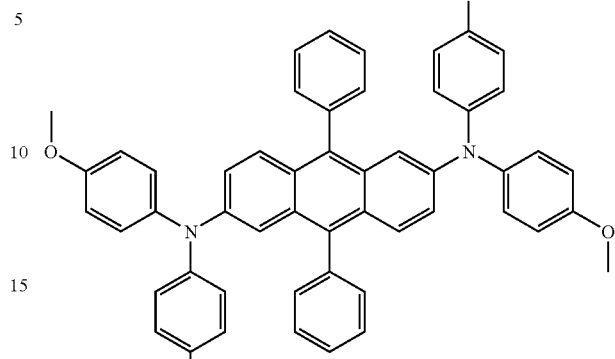
G-89
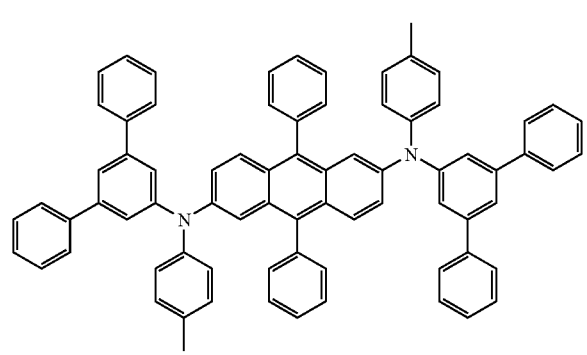
G-92
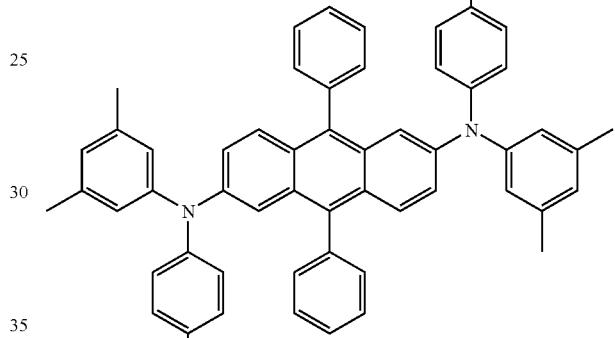
G-93
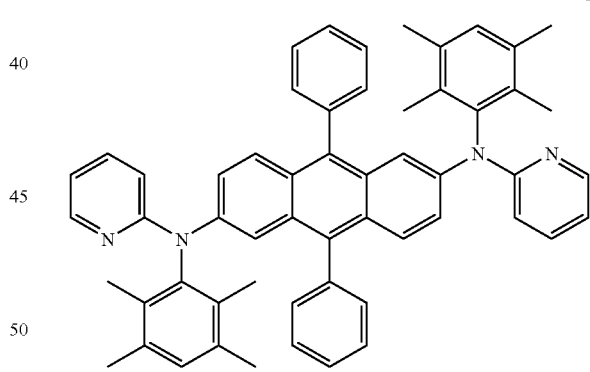
G-90
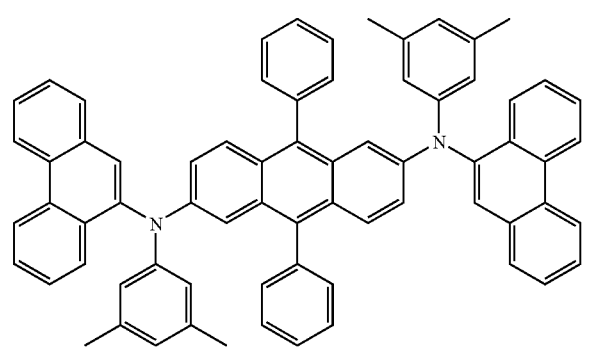
G-94
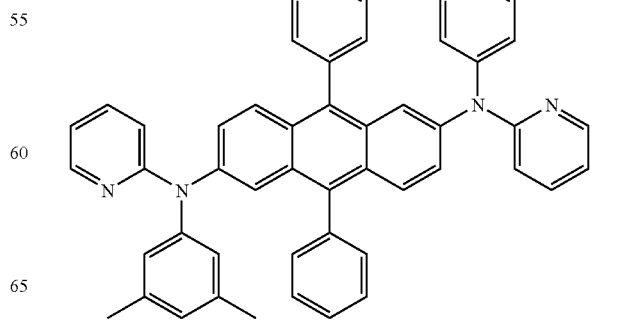

G-95
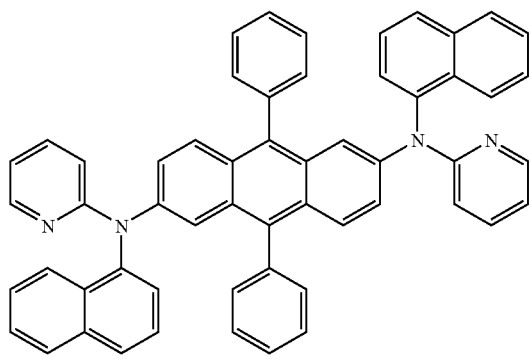
G-96
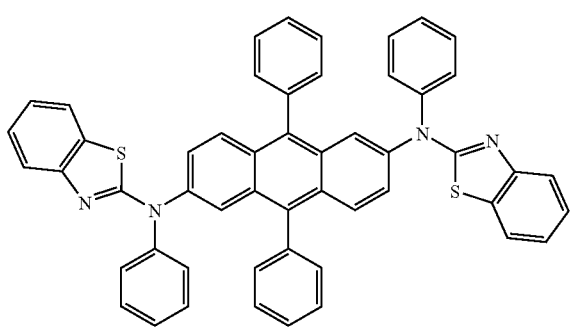
G-97
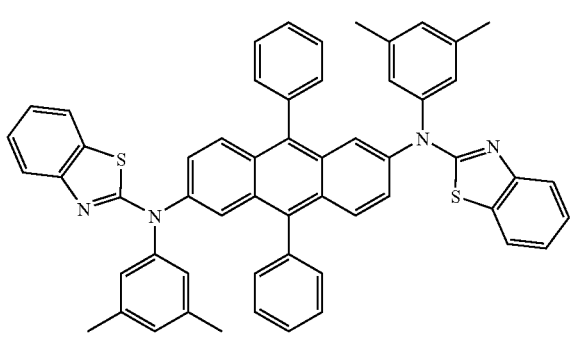
G-98
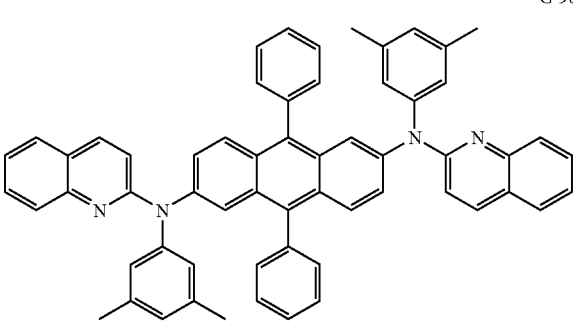
G-99
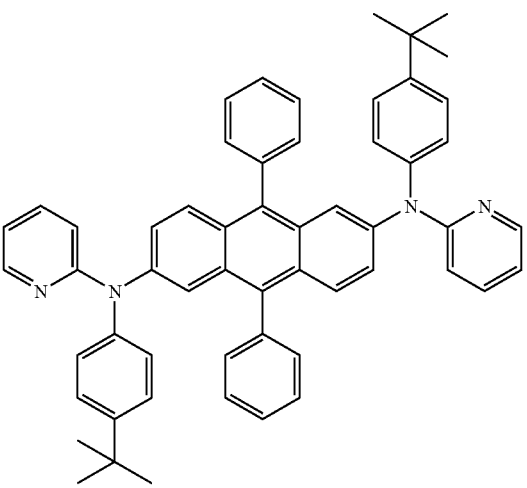
G-100
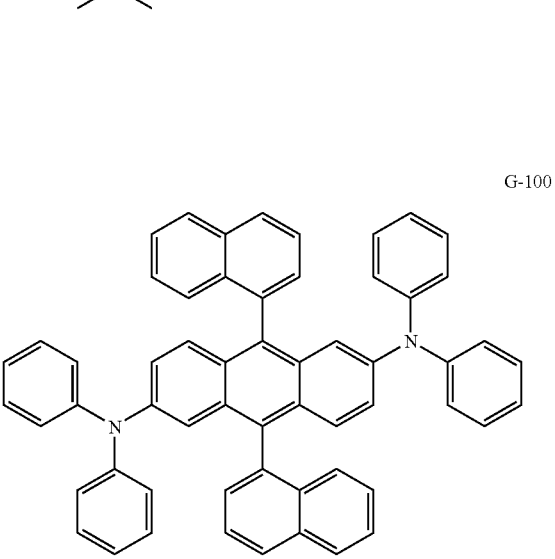
G-101
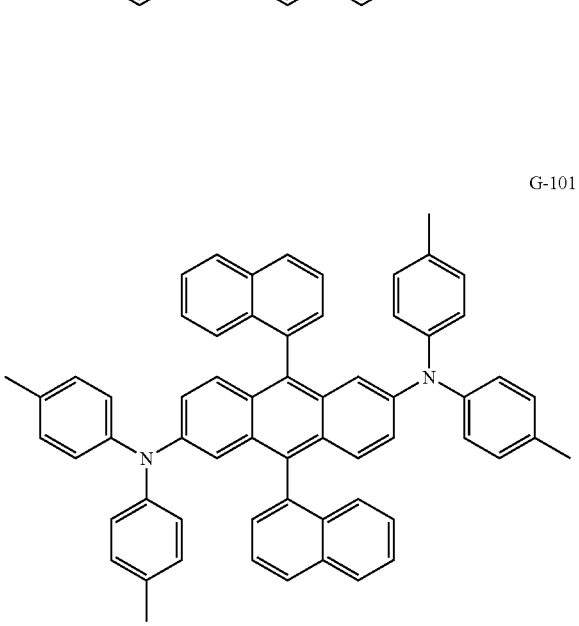

-continued
G-102
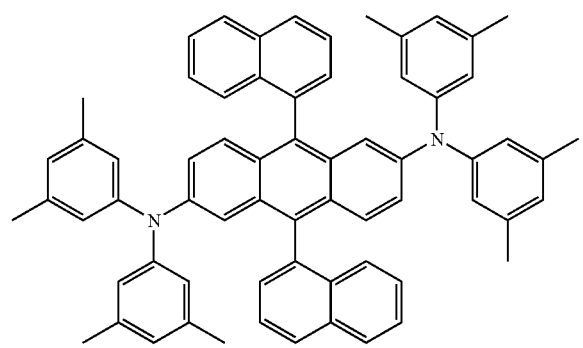
G-106
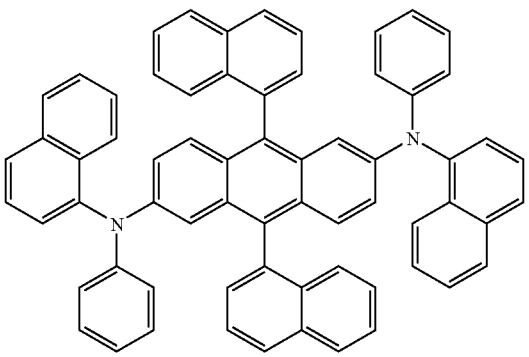
G-103
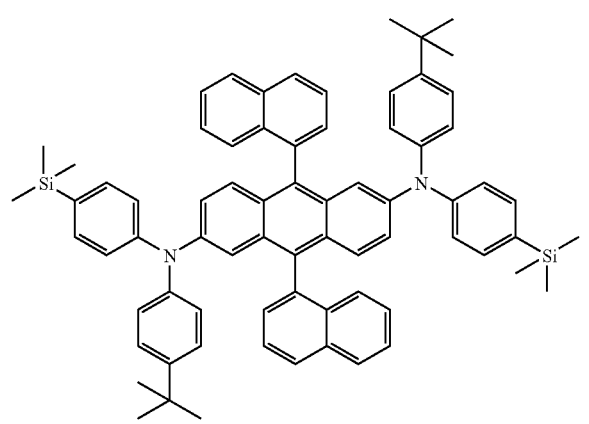
G-107
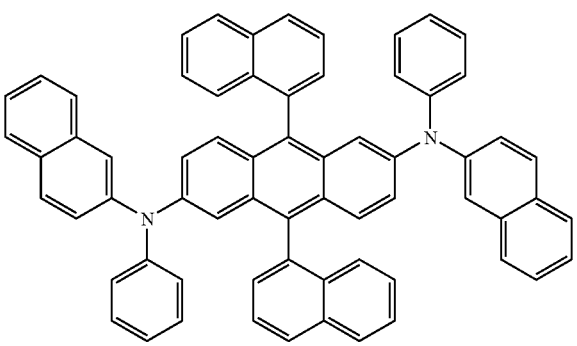
G-104
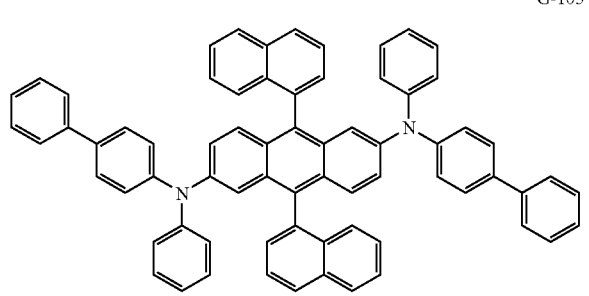
G-108
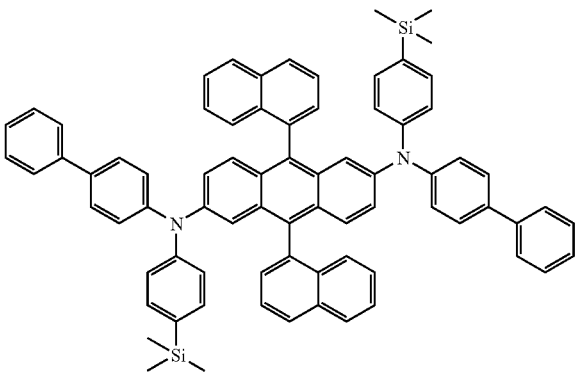
G-105
G-109
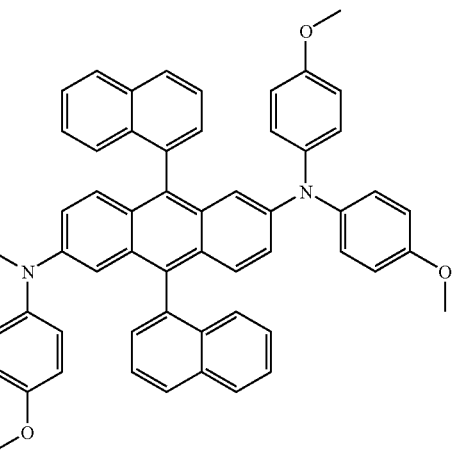

G-110
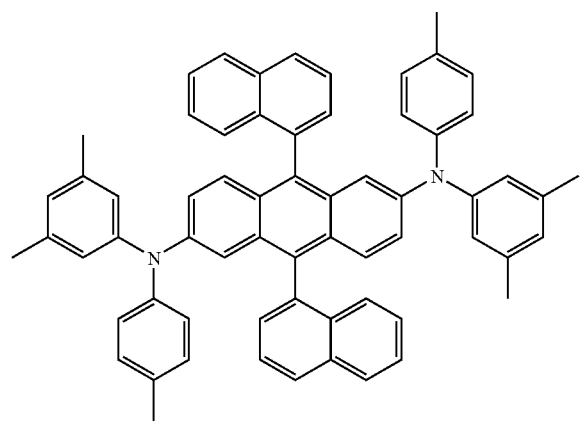
G-111
G-112
G-113
G-114
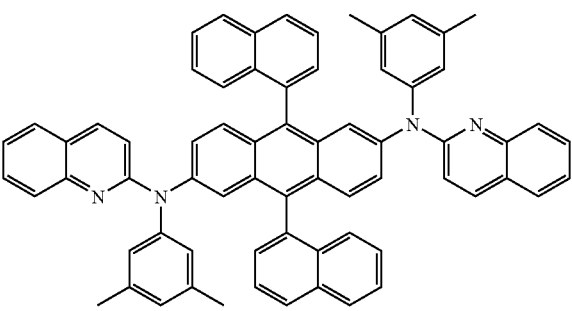
G-115
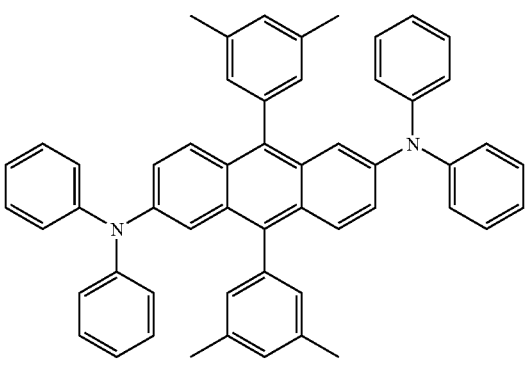
G-116
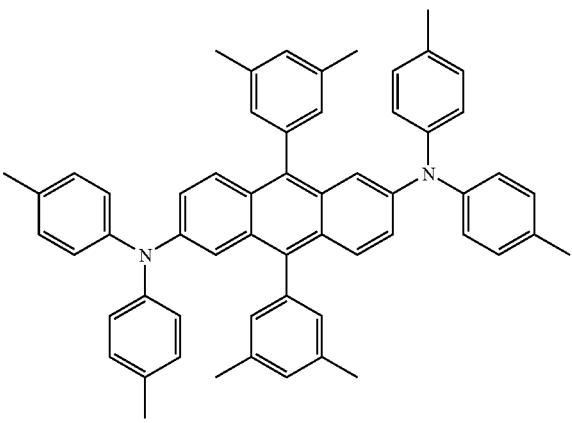
G-117
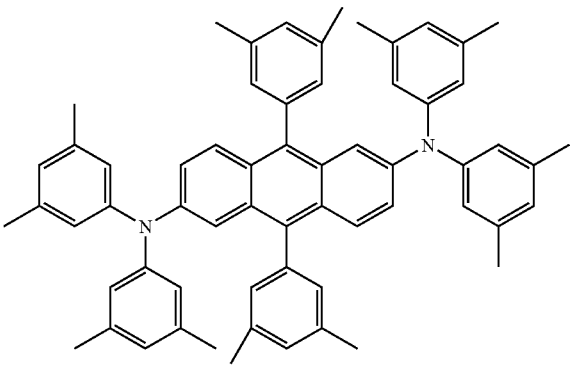

-continued
G-118
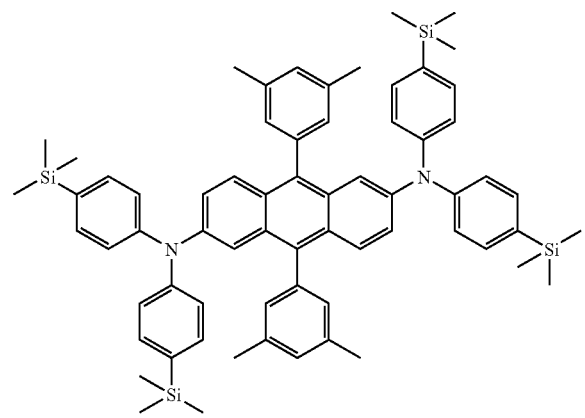
G-119
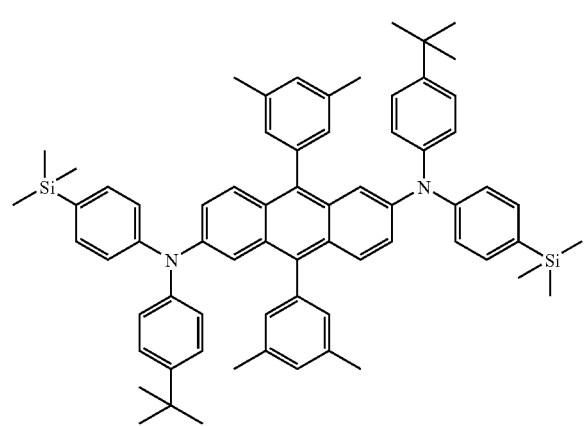
G-120
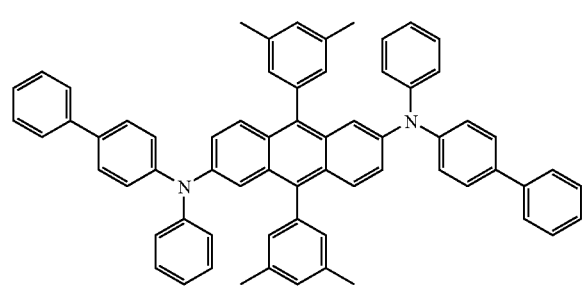
G-121
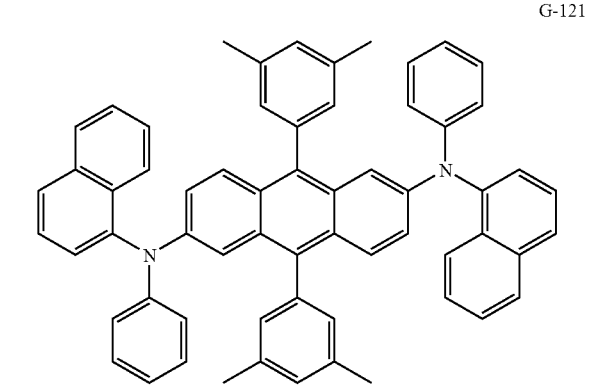
-continued
G-122
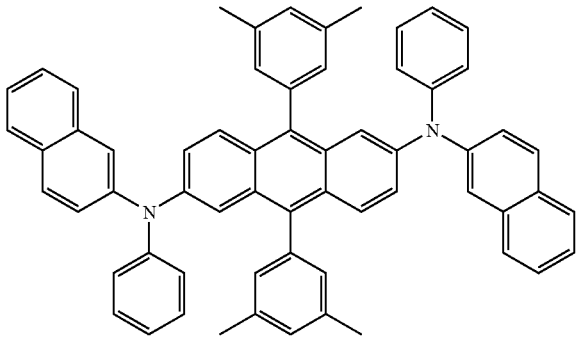
G-123
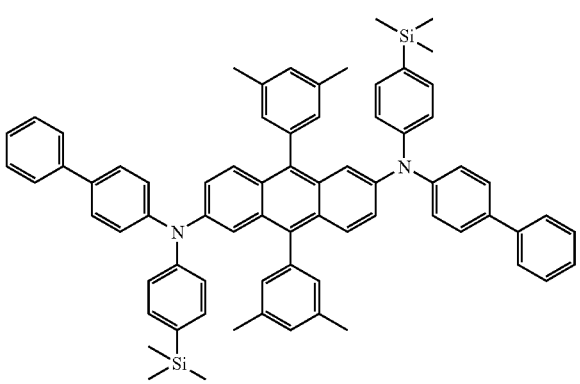
G-124
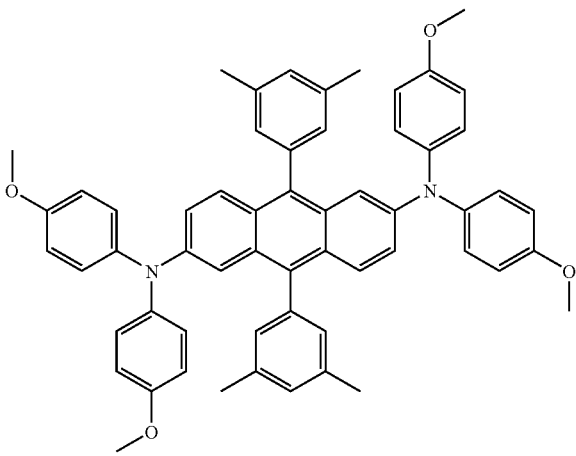
G-125
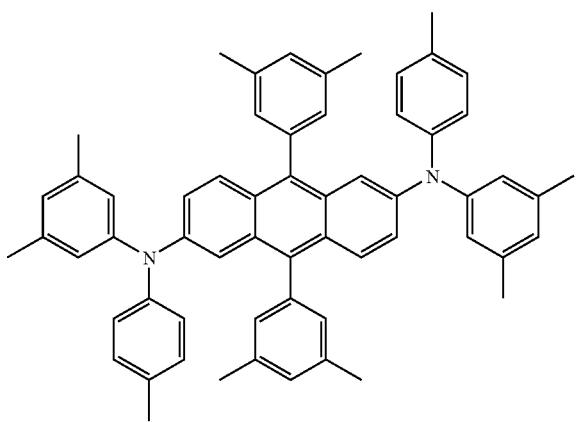

G-126
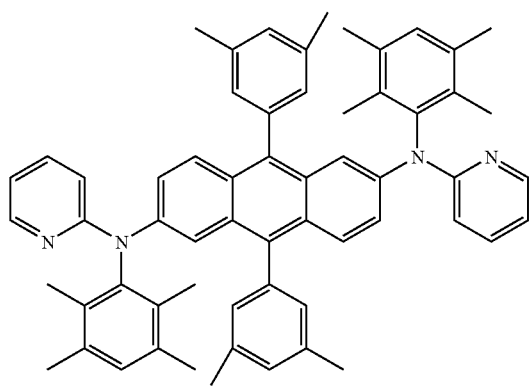
G-127
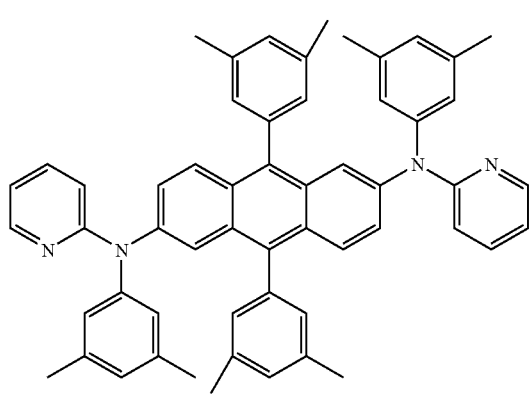
G-128
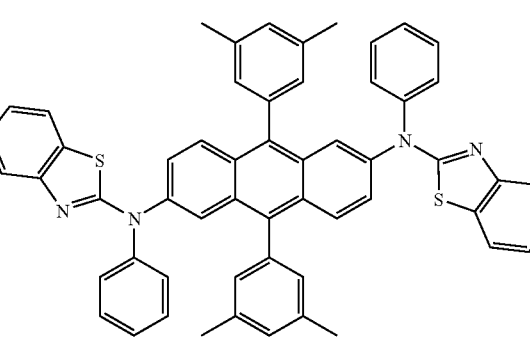
G-129
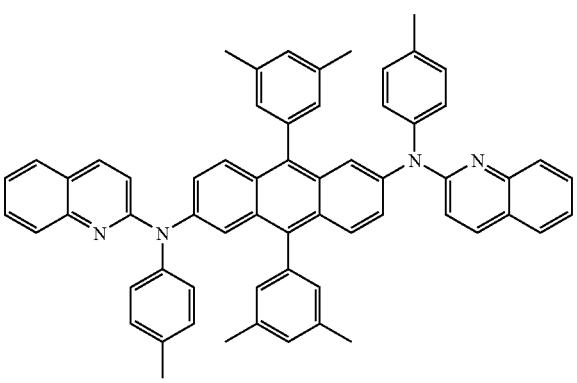
G-130
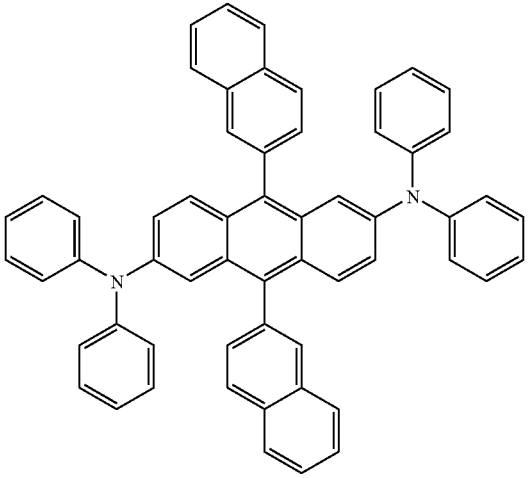
G-131
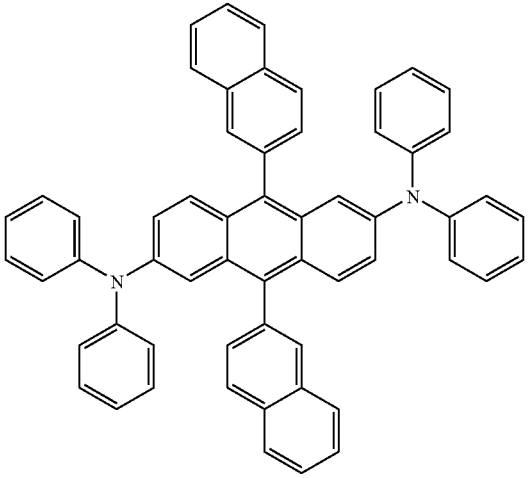
G-132
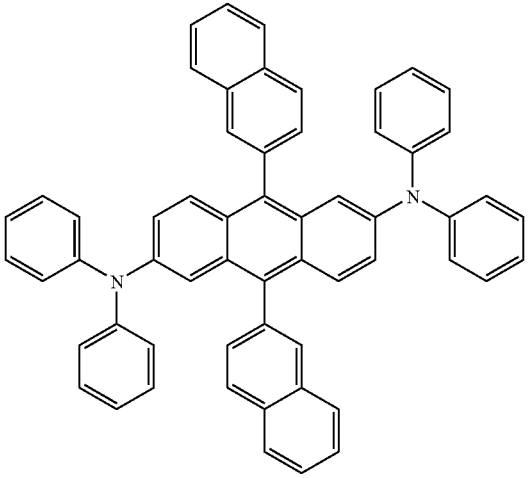

G-133
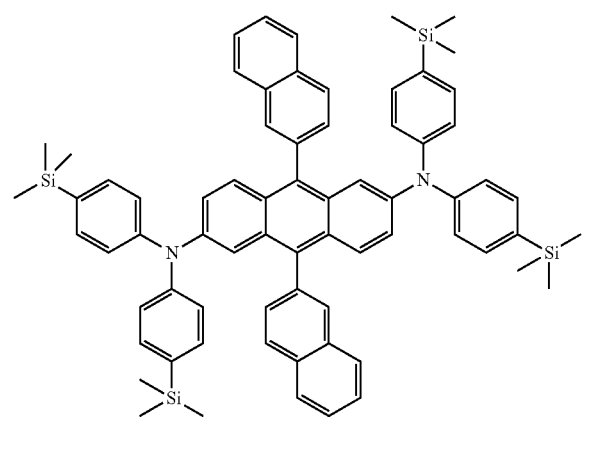
G-136
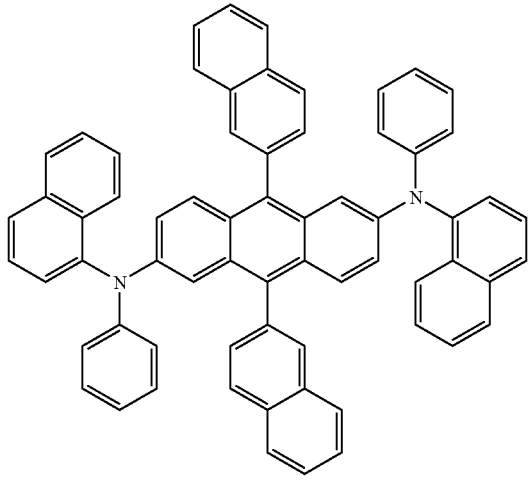
G-134
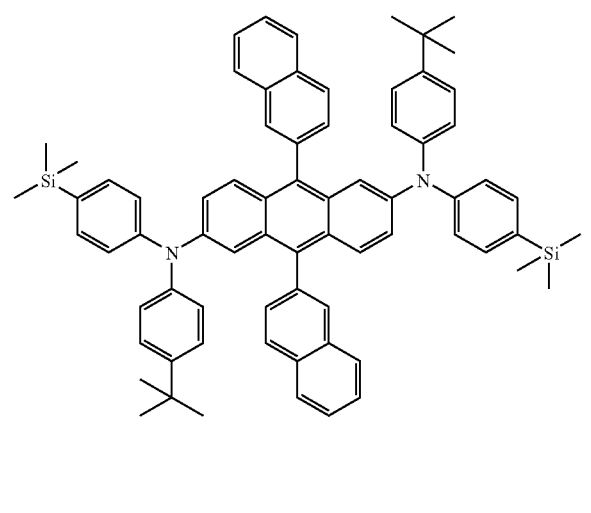
G-137
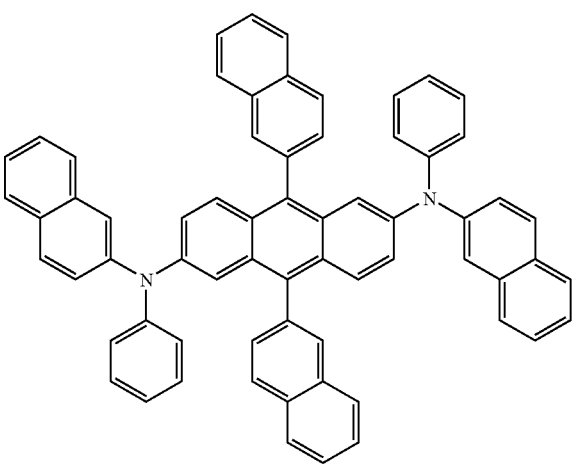
G-135
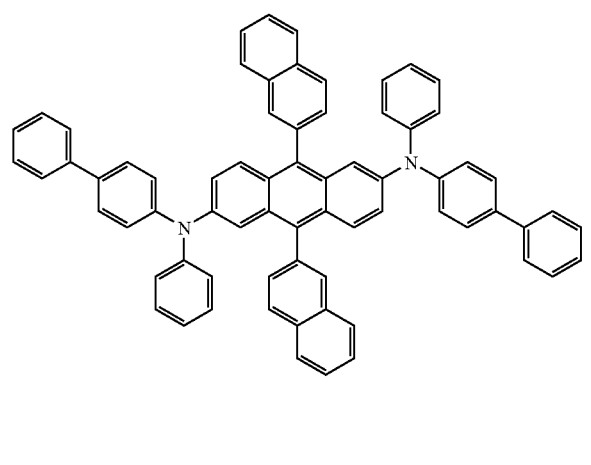
G-138
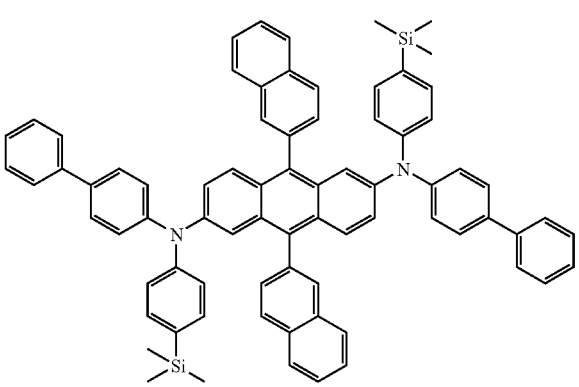

G-139
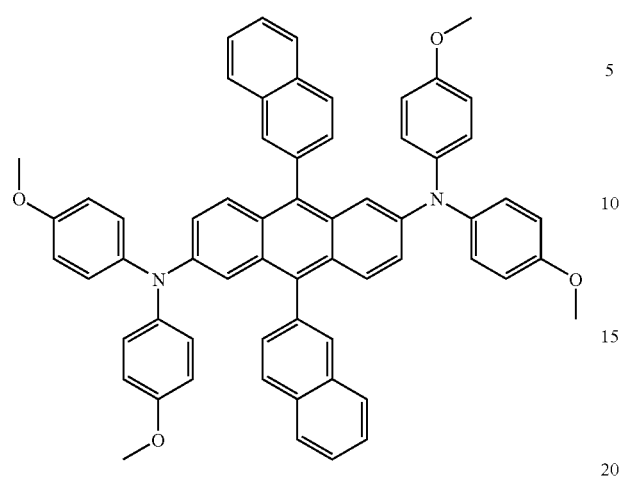
G-142
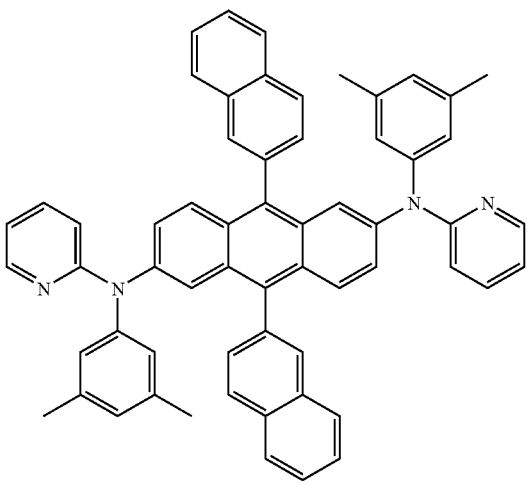
G-140
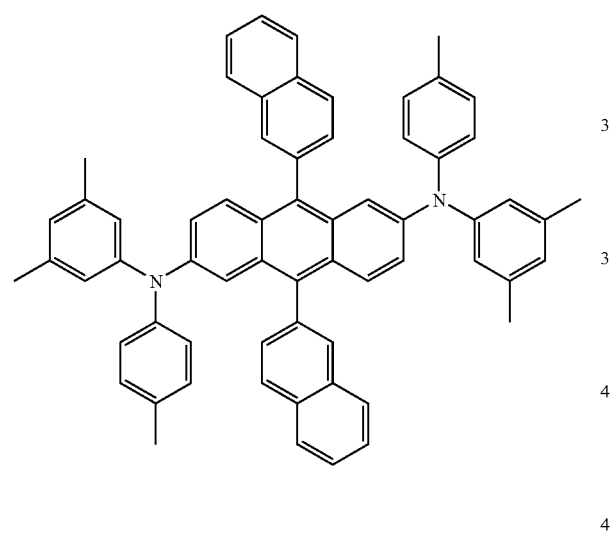
G-143
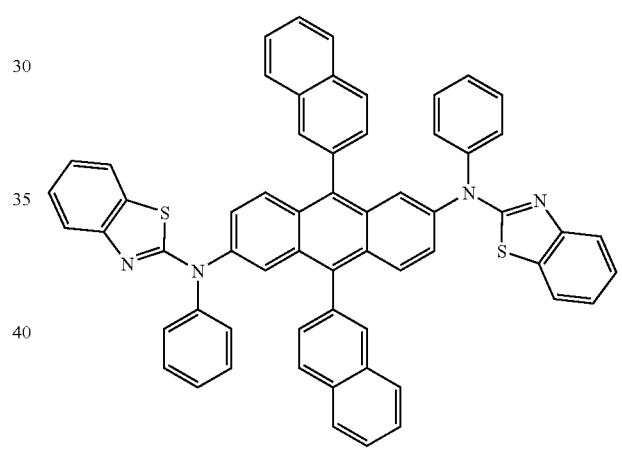
G-141
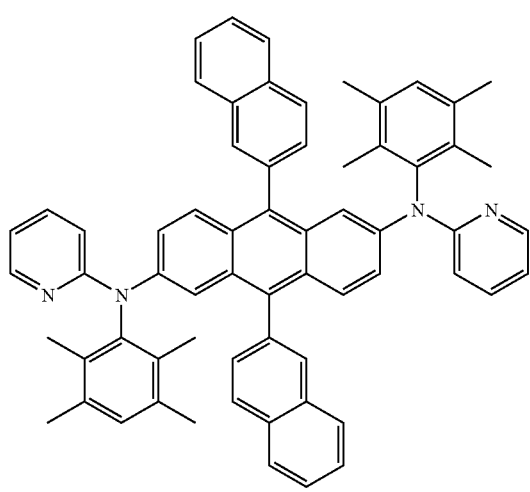
G-144
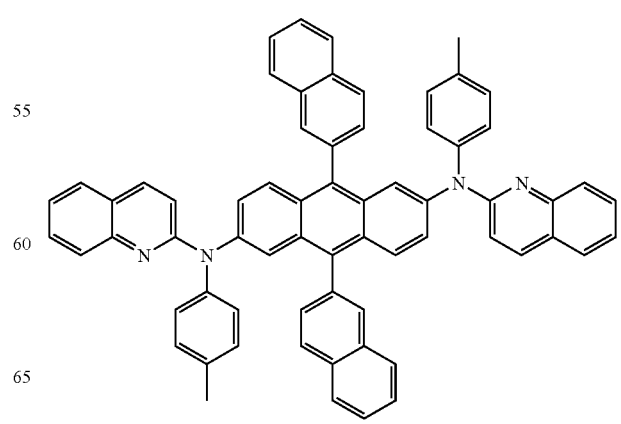

-continued
G-145
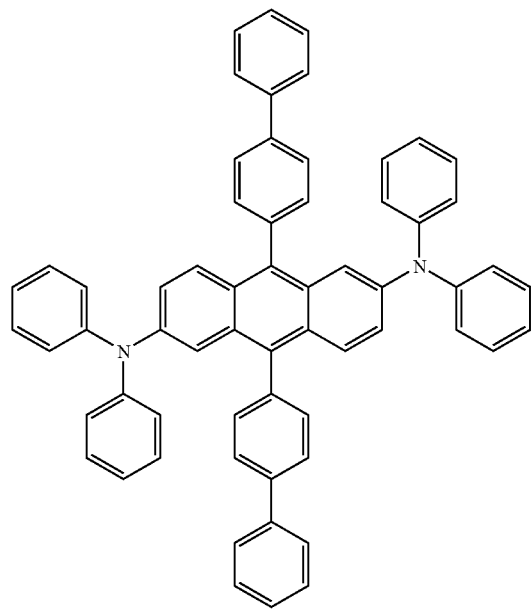
G-146
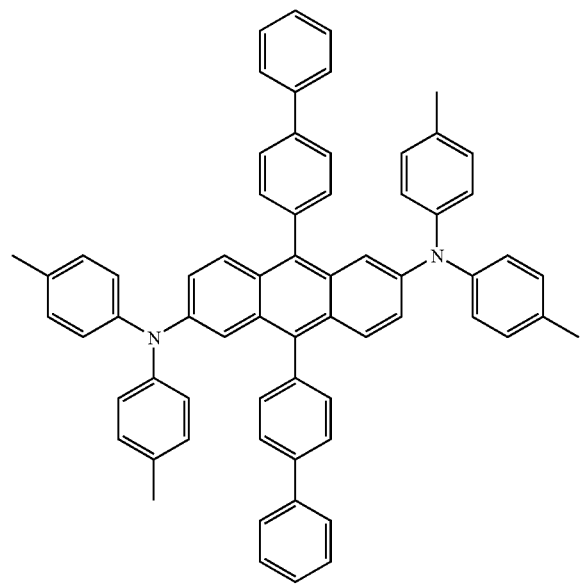
G-147
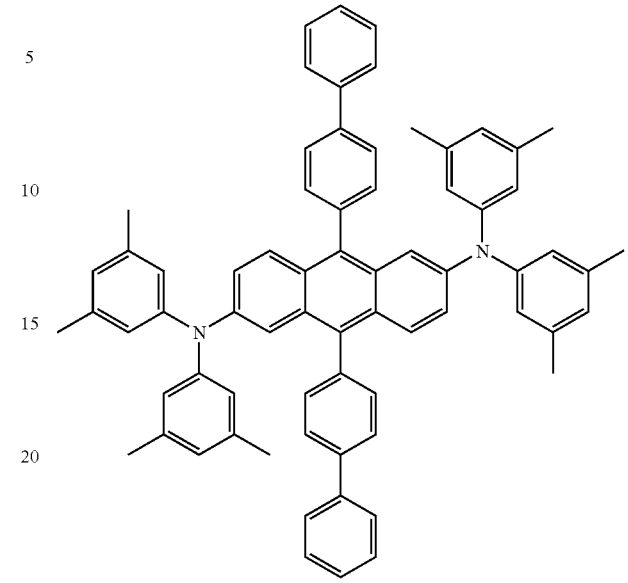
G-148
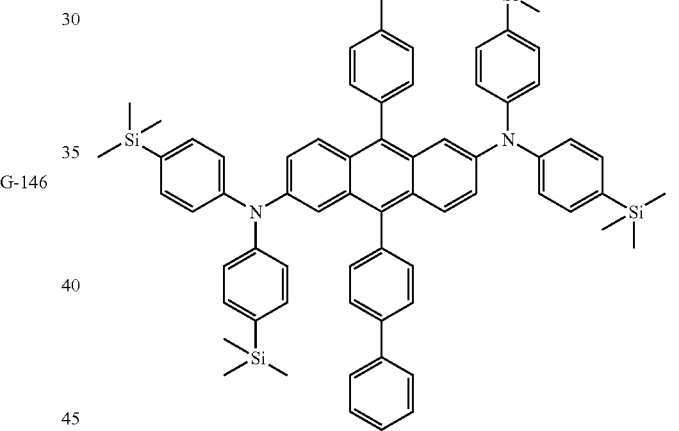
G-149
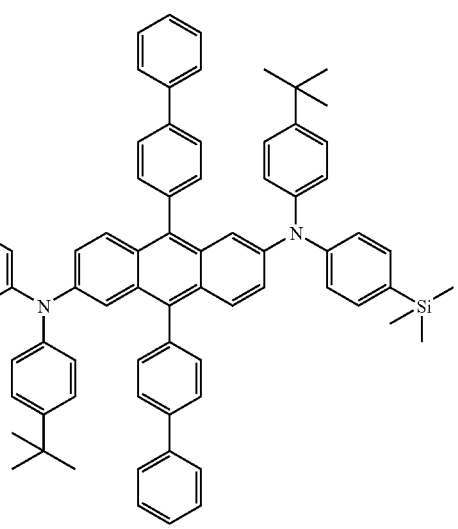

G-150
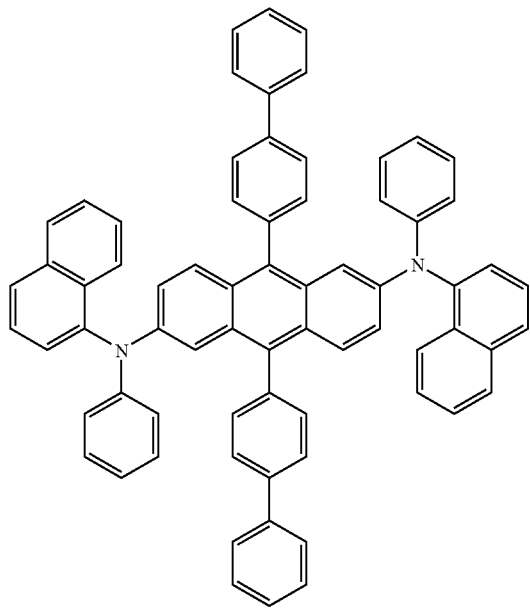
G-152
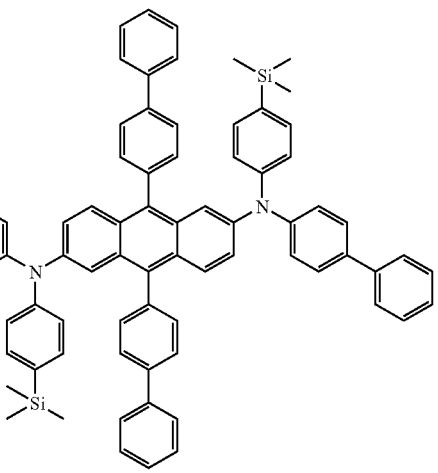
G-151
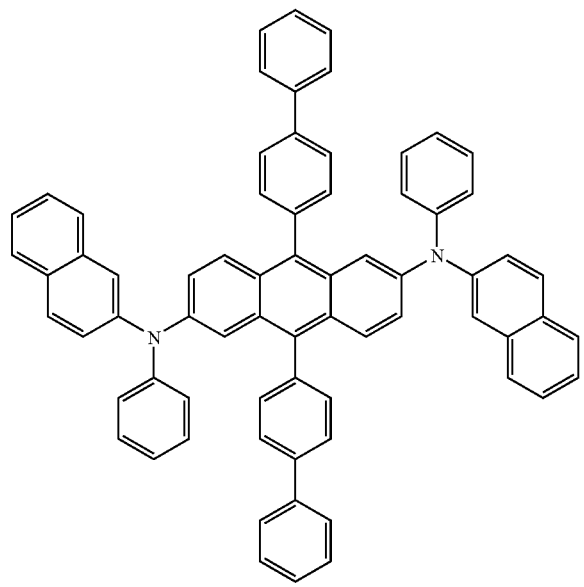
G-153
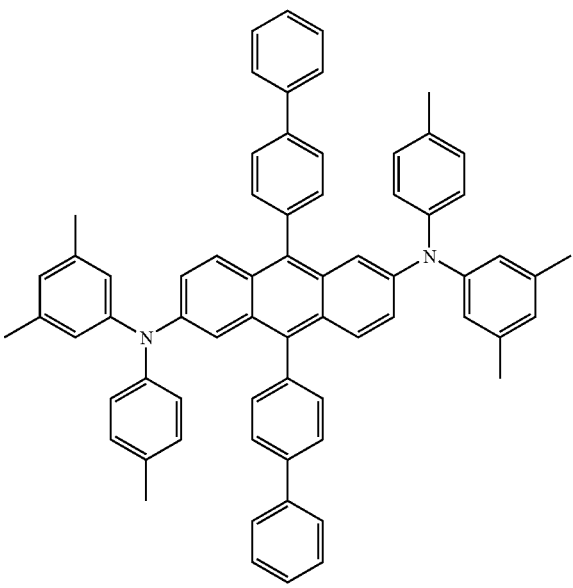

G-154
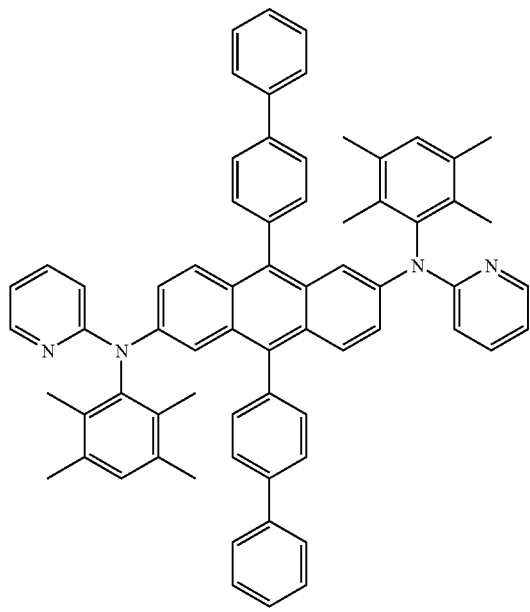
G-155
G-156
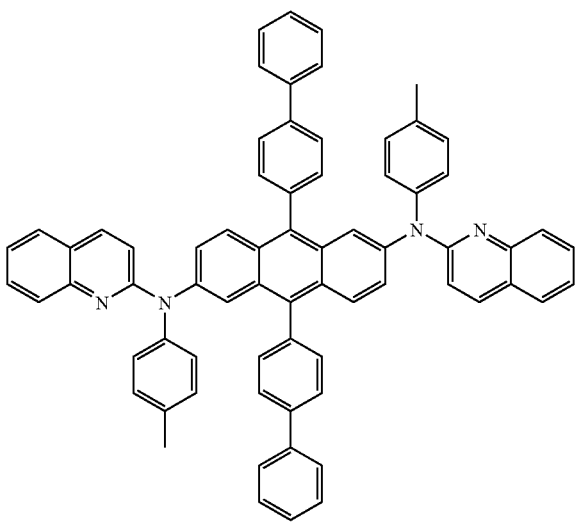
Specific examples of the compound represented by Formula 2 include the following compounds H-01 through H-32:
H-1
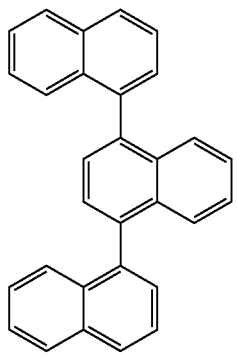
H-2
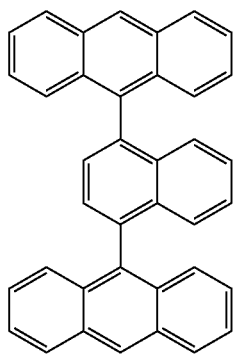

H-3
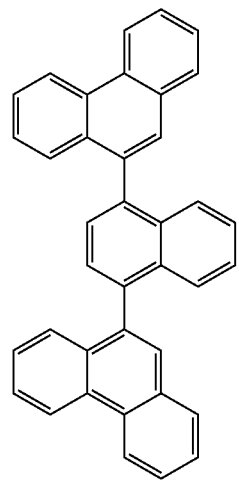
H-4
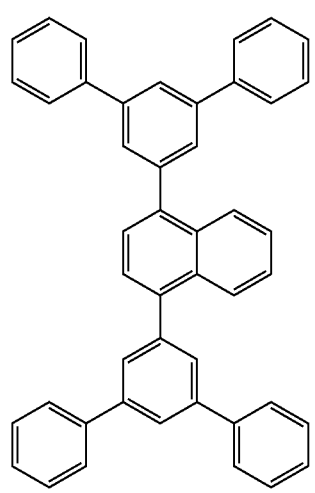
H-5
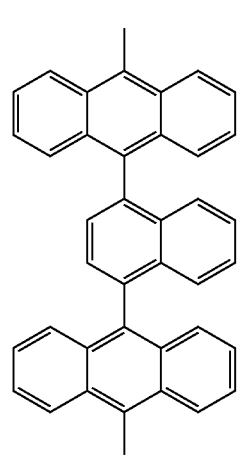
H-6
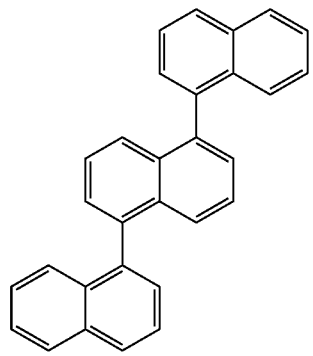
H-7
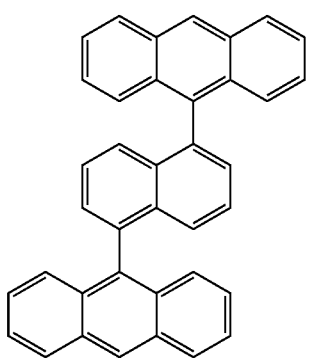
H-8
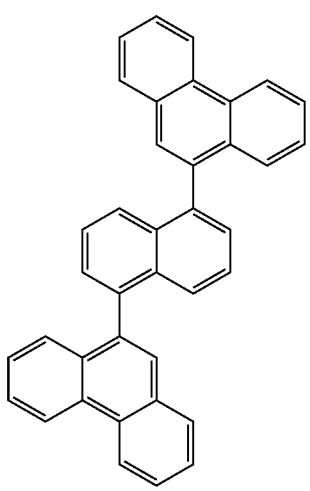

H-9
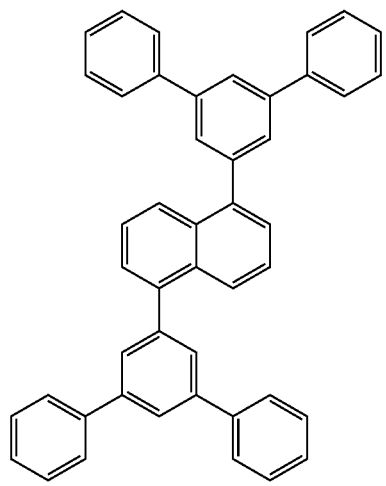
H-10
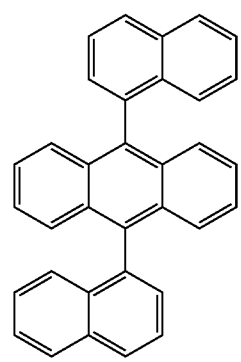
H-11
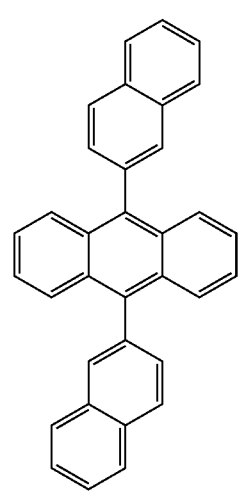
H-12
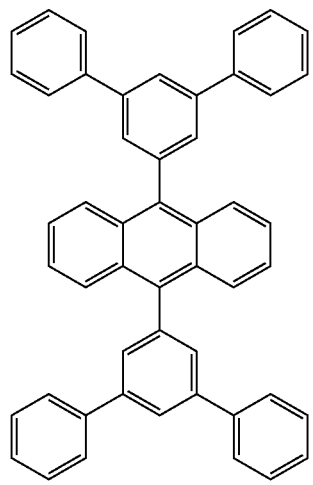
H-13
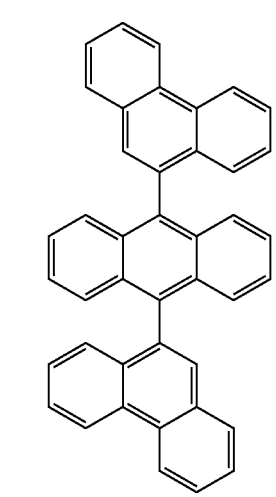
H-14
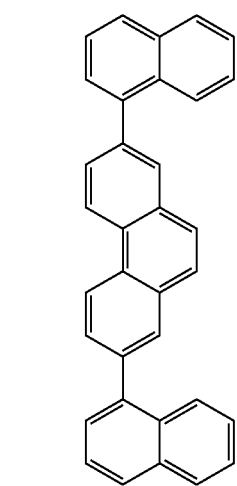

H-15
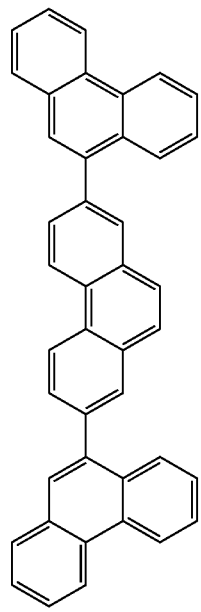
H-16
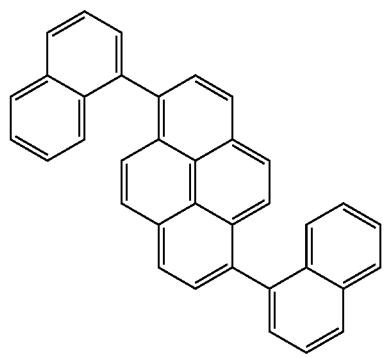
H-17
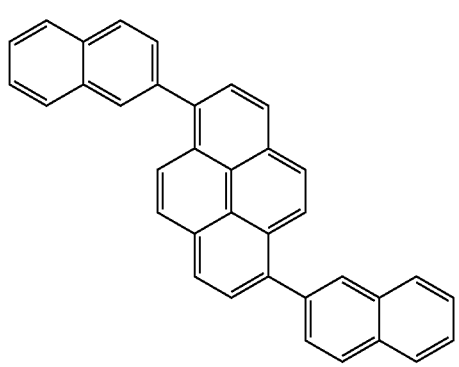
H-18
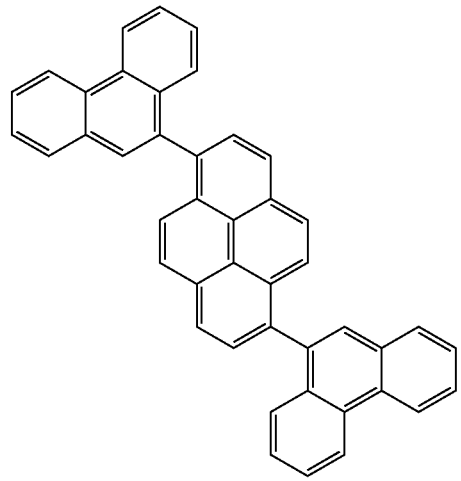
H-19
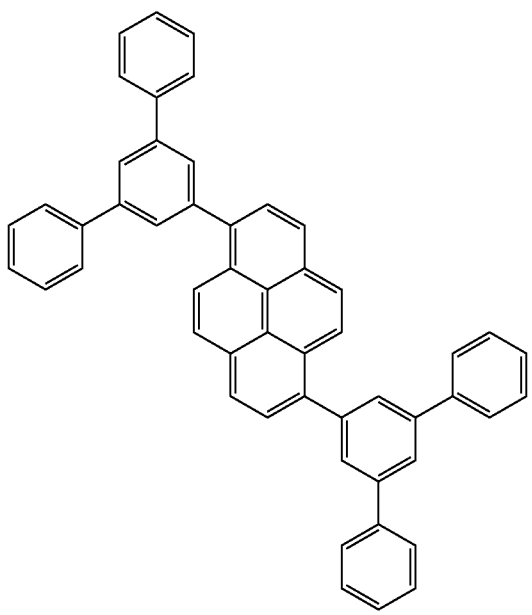
H-20
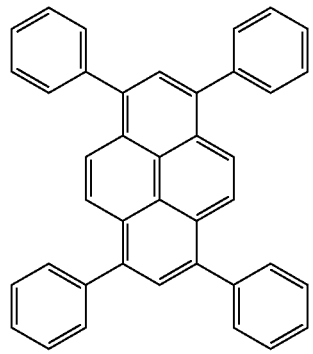

H-21
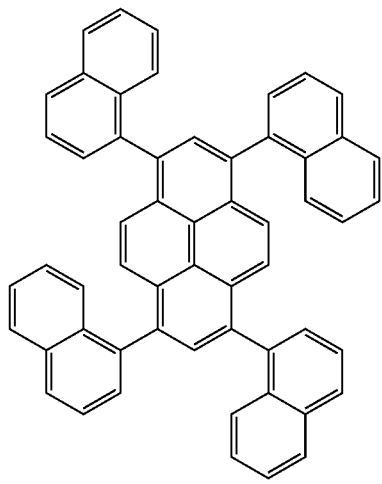
H-22
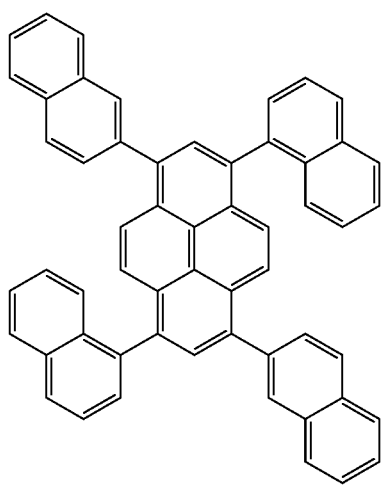
H-23
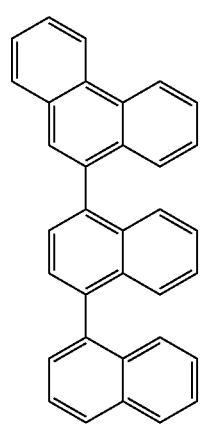
H-24
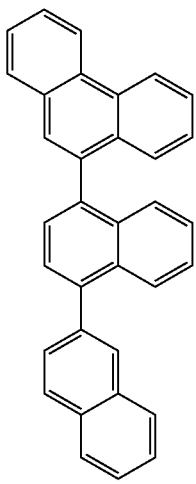
H-25
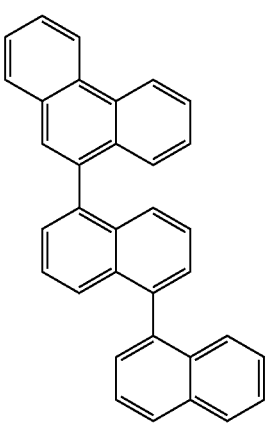
H-26
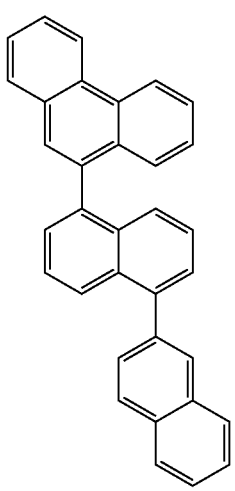

H-27
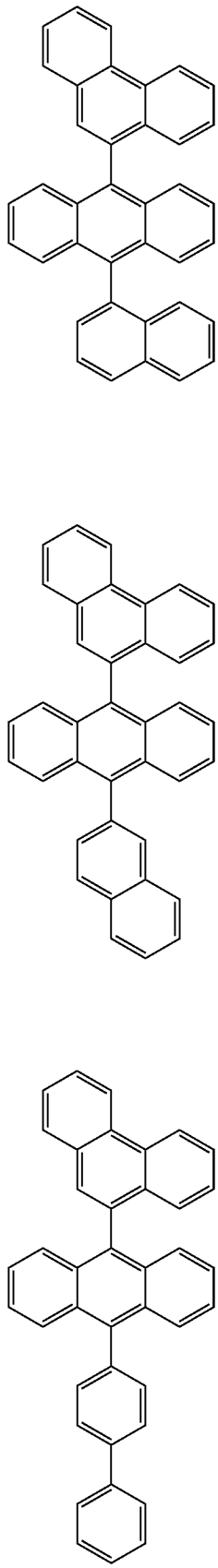
H-28
H-29
H-30
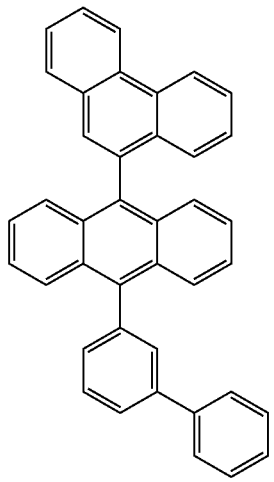
H-31
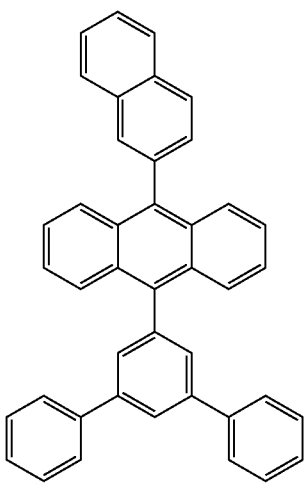
H-32
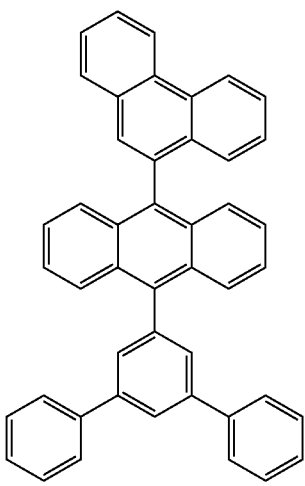
It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawing, which is included to provide a further understanding of the invention and is incorporated in and constitute a part of this application, illustrates embodiment(s) of the invention and together with the description serve to explain the principle of the invention. In the drawing:

FIG. 1 illustrates the respective structural formulae of 4,4'-bis[N-(1-naphthyl)-N-phenylamino]biphenyl (NPD), copper (II) phthalocyanine (CuPc), tris(8-hydroxyquinolate)aluminum ($Alq_3$), H-1, H-2, H-3 and D-1, which are compounds used in Examples of the present invention.

DETAILED DESCRIPTION OF THE INVENTION

Reference will now be made in detail to the preferred embodiments of the present invention, examples of which are illustrated in the accompanying drawing. Wherever possible, the same reference numbers will be used throughout the drawing to refer to the same or like parts.

Hereinafter, a synthesis method of a green fluorescent compound of the present invention will be described, using, as an example, compounds G-02, G-68 and G-101 from among the green phosphorescent compounds used in the organic electroluminescent device in accordance with the present invention.

SYNTHESIS EXAMPLE

1. Synthesis of G-02

(1) Synthesis of 2,6-dibromoanthraquinone

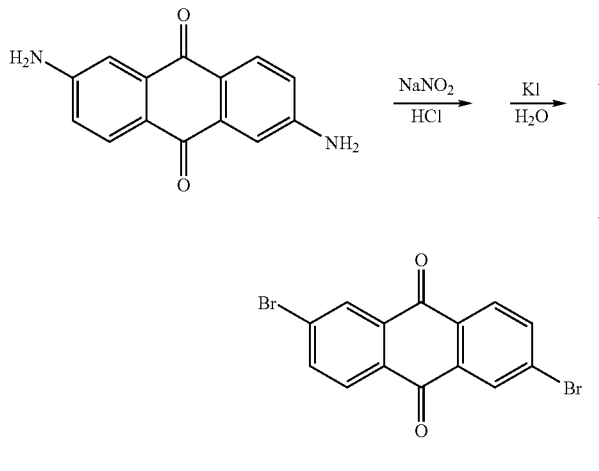

50 g of 2,6-diaminoanthraquinone was dissolved in 500 mL of concentrated HCl in a 1000 mL beaker on an ice bath and 25 g of an aqueous $NaNO_2$ solution was gradually added dropwise thereto, and the resulting solution was warmed to room temperature. Then, 25 g of an aqueous KI solution was gradually added dropwise to the resulting solution and the mixture was stirred for 24 hours at room temperature. After the reaction was complete, the reaction materials were filtered and washed with water. The washed materials were recrystallized from methylene chloride (MC) and MeOH, thereby obtaining 30 g of brown 2,6-dibromoanthraquinone.

(2) Synthesis of 2,6-dibromoanthracene

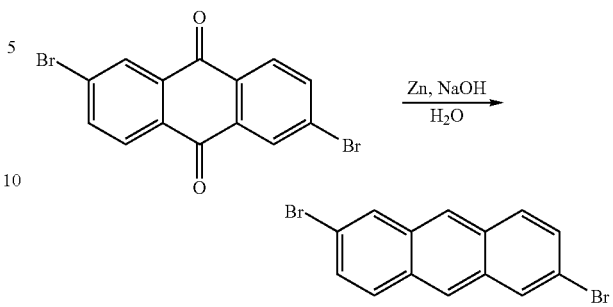

30 g of 2,6-dibromoanthraquinone, 5 g of Zn and 25 g of NaOH were stirred in 200 mL of water at 100° C. for 24 hours and when the reaction was complete, the reaction materials were filtered. The thus-obtained organic material and inorganic material were dissolved in chloroform and the resulting mixture was re-filtered. The obtained filtrate was applied to a silica gel short column, thereby separating the inorganic material. The separated material was recrystallized from MC and MeOH, thereby obtaining 15 g of 2,6-dibromoanthracene.

(3) Synthesis of G-02

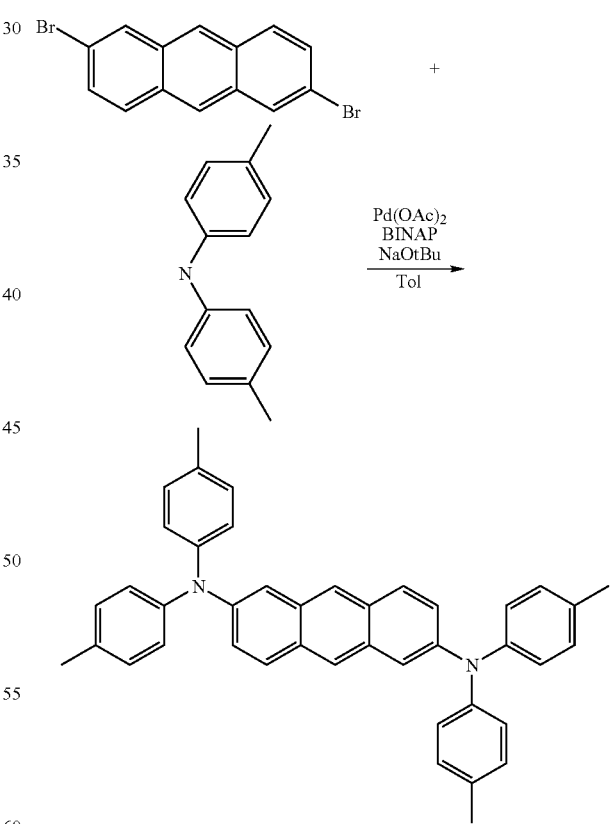

2 g of 2,6-dibromoanthracene, 5 g of 4,4'-ditolylamine, 0.05 g of Pd $(OAC)_2$, 0.09 g of BINAP and 6 g of NaOtBu were dissolved in 100 mL of toluene and the mixture was stirred under reflux for 24 hours. After the reaction was complete, toluene was first removed, MeOH was added thereto. The resulting mixture was filtered and the obtained organic material was applied to a silica gel short column using methylene chloride (MC) as an eluent. The eluted material was recrystallized from MC and MeOH, thereby obtaining 1.5 g of G-02.

2. Synthesis of G-68

(1) Synthesis of 2,6-dibromo-9,10-diphenylanthracene

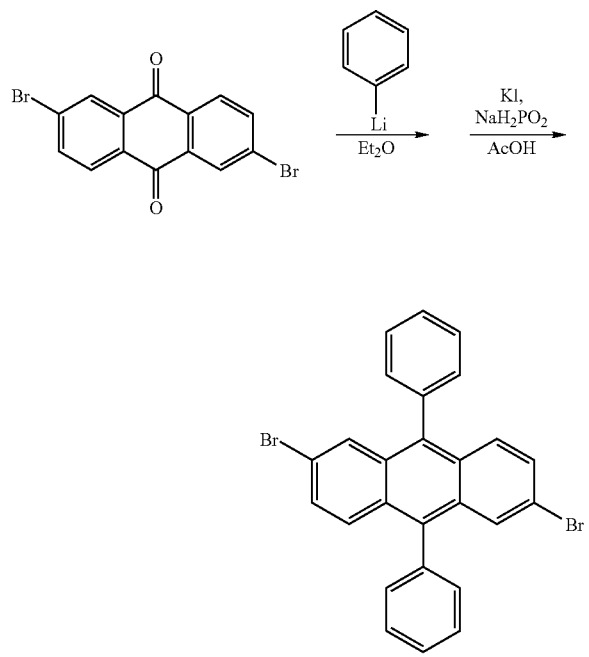

6 g of phenyl lithium was dissolved in Et$_2$O, and the resulting solution was gradually added dropwise to a solution containing 5 g of 2,6-dibromoanthraquinone dissolved in Et$_2$O. This reaction was carried out on a dry ice bath. Then, the temperature of the reaction material was elevated to room temperature, thereby obtaining white solids. The obtained solids were dissolved in 100 mL of AcOH, followed by addition of KI and NaH$_2$PO$_2$ and the resulting mixture was stirred at 130° C. for 24 hours. After the reaction was complete, the resulting material was filtered with addition of water. The filtrate was then recrystallized from MC and MeOH, thereby obtaining 4.5 g of 2,6-dibromo-9,10-diphenylanthracene.

(2) Synthesis of G-68

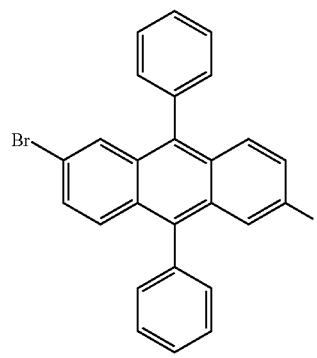

+

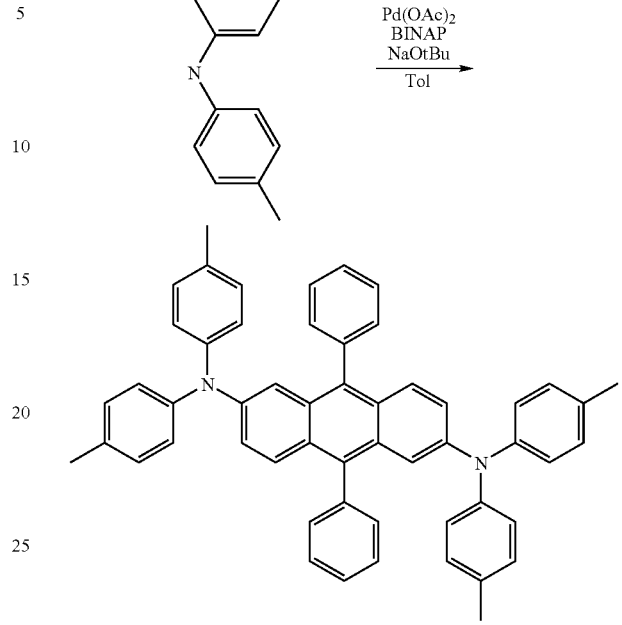

4.5 g of 2,6-dibromo-9,10-diphenylanthracene, 8 g of 4,4'-ditolylamine, 0.10 g of Pd(OAC)$_2$, 0.18 g of BINAP and 12 g of NaOtBu were dissolved in 150 mL of toluene and the resulting solution was stirred under reflux for 24 hours. After the reaction was complete, toluene was first removed, MeOH was added thereto. The resulting mixture was filtered and the organic material thus obtained was applied to a silica gel short column using methylene chloride (MC) as an eluent. The eluted materials were recrystallized from MC and MeOH, thereby obtaining 2.5 g of G-68.

3. Synthesis of G-101

(1) Synthesis of 2,6-dibromo-9,10-di-1-naphthylanthracene

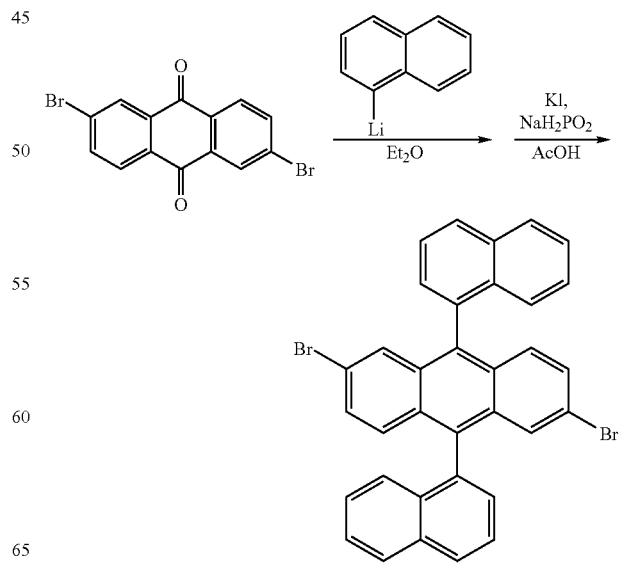

5 g of 1-naphthyl lithium was dissolved in Et$_2$O, and the resulting solution was gradually added dropwise to a solution containing 5 g of 2,6-dibromoanthraquinone dissolved in Et$_2$O. This reaction was carried out on a dry ice bath. Then, the temperature of the reaction material was elevated to room temperature, thereby obtaining an intermediate product. The obtained intermediate product was filtered, thereby obtaining white solids. The white solids thus obtained were dissolved in 100 mL of AcOH, followed by addition of KI and NaH$_2$PO$_2$ and the mixture was stirred at 130° C. for 24 hours. When the reaction was complete, the reaction material was filtered with addition of water. The filtrate was recrystallized from MC and MeOH, thereby obtaining 4 g of 2,6-dibromo-9,10-di-1-naphthylanthracene.

(2) Synthesis of G-101

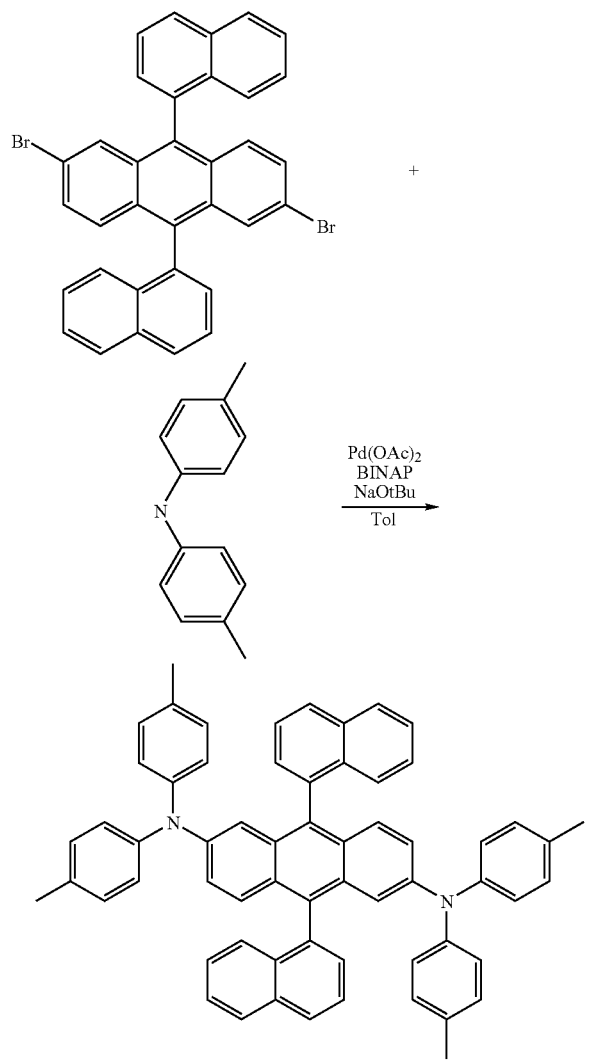

4 g of 2,6-dibromo-9,10-di-1-naphthylanthracene, 8 g of 4,4'-ditolylamine, 0.1 g of Pd(OAC)$_2$, 0.18 g of BINAP and 12 g of NaOtBu were dissolved in 150 mL of toluene and the resulting solution was stirred under reflux for 24 hours. After the reaction was complete, toluene was first removed, MeOH was added thereto. The resulting mixture was filtered and the organic material thus obtained was applied to a silica gel short column using methylene chloride (MC) as an eluent. The eluted materials were recrystallized from MC and MeOH, thereby obtaining 2.3 g of G-101.

Now, the present invention will be described in more detail with reference to the following examples. These examples are provided only for illustrating the present invention and should not be construed as limiting the scope and spirit of the present invention.

EXAMPLES

Examples 1 through 8

An indium tin oxide (ITO) glass was patterned to have an emitting area of 3 mm×3 mm and cleaned. The substrate was mounted on a vacuum chamber and a standard pressure was set to 1×10$^{-6}$ torr. Then, respective organic material films were sequentially formed on ITO, in order of CuPC (200 Å), NPD (400 Å), EML (200 Å), Alq$_3$ (300 Å), LiF (5 Å) and Al (1000 Å), thereby preparing an organic electroluminescent device.

Comparative Examples 1 and 2

An organic electroluminescent device was prepared in the same manner as the Examples 1 through 8, except that hosts other than compounds in accordance with the present invention were used.

Characteristics and performance of organic electroluminescent devices were compared between Examples 1 through 8 and Comparative Examples 1 and 2. The results thus obtained are shown in Table 1 below. In Table 1, the respective performance values refer to values measured at electric current of 0.9 mA, and a lifetime refers to a period of time (hours) taking a drop of luminance from an initial value of 1000 nits to 500 nits.

TABLE 1

|  | EML | Voltage (V) | Luminance (cd/m$^2$) | Current efficiency (cd/A) | CIE(X Y) | Lifetime (hours) |
| --- | --- | --- | --- | --- | --- | --- |
| Ex. 1 | G-03 | 6.9 | 1233 | 12.3 | (0.44 0.58) | 10,000 |
| Ex. 2 | G-12 | 6.4 | 1025 | 10.3 | (0.41 0.55) | 10,000 |
| Ex. 3 | G-39 | 7.0 | 1130 | 13.0 | (0.36 0.58) | 8,000 |
| Ex. 4 | G-42 | 6.8 | 1164 | 11.6 | (0.37 0.60) | 10,000 |

TABLE 1-continued

|  | EML | Voltage (V) | Luminance (cd/m$^2$) | Current efficiency (cd/A) | CIE(X Y) | Lifetime (hours) |
|---|---|---|---|---|---|---|
| Ex. 5 | G-68 | 6.2 | 1267 | 12.7 | (0.36 0.61) | 10,000 |
| Ex. 6 | G-72 | 6.7 | 1308 | 13.1 | (0.38 0.60) | 8,000 |
| Ex. 7 | G-140 | 7.1 | 1207 | 12.1 | (0.37 0.58) | 7,000 |
| Ex. 8 | G-153 | 7.0 | 1344 | 13.4 | (0.36 0.56) | 6,000 |
| Comp. Ex. 1 | Alq$_3$ | 7.8 | 786 | 7.9 | (0.37 0.64) | 2,000 |
| Comp. Ex. 2 | D-a | 8.3 | 603 | 6.0 | (0.56 0.43) | 1,000 |

Examples 9 through 28

An indium tin oxide (ITO) glass was patterned to have an emitting area of 3 mm×3 mm and cleaned. The substrate was mounted on a vacuum chamber and a standard pressure was set to 1×10$^{-6}$ torr. Then, respective organic material films were sequentially formed on ITO, in order of CuPC (200 Å), NPD (400 Å), host (see FIG. 1)+dopant (Formula 1) (0.5%-10%) (200 Å), Alq$_3$ (300 Å), LiF (5 Å) and Al (1000 Å), thereby preparing an organic electroluminescent device.

Comparative Examples 3 through 5

An organic electroluminescent device was prepared in the same manner as the Examples 9 through 28, except that dopants other than compounds in accordance with the present invention were used.

Characteristics and performance of organic electroluminescent devices were compared between Examples 9 through 28 and Comparative Examples 3 through 5. The results thus obtained are shown in Table 2 below. In Table 2, the respective performance values refer to values measured at electric current of 0.9 mA, and a lifetime refers to a period of time (hours) taking a drop of luminance from an initial value of 1000 nits to 500 nits.

Examples 29 through 48

An indium tin oxide (ITO) glass was patterned to have an emitting area of 3 mm×3 mm and cleaned. The substrate was mounted on a vacuum chamber and a standard pressure was set to 1×10$^{-6}$ torr. Then, respective organic material films were sequentially formed on ITO, in order of CuPC (200 Å), NPD (400 Å), host (Formula 2)+dopant (Formula 1) (0.5% -10%) (200 Å), Alq$_3$ (300 Å), LiF (5 Å) and Al (1000 Å), thereby preparing an organic electroluminescent device.

Comparative Examples 6 through 8

An organic electroluminescent device was prepared in the same manner as the Examples 29 through 48, except that dopants other than compounds in accordance with the present invention were used.

Characteristics and performance of organic electroluminescent devices were compared between Examples 29 through 48 and Comparative Examples 6 through 8. The results thus obtained are shown in Table 3 below. In Table 3, the respective performance values refer to values measured at electric current of 0.9 mA, and a lifetime refers to a period of time (hours) taking a drop of luminance from an initial value of 1000 nits to 500 nits.

TABLE 2

|  | Dopant | Host | Doping conc. | Voltage (V) | Luminance 휘도 (cd/m$^2$) | Current efficiency (cd/A) | CIE(X Y) | Life time (hours) |
|---|---|---|---|---|---|---|---|---|
| Ex. 9 | G-02 | H-1 | 2% | 6.8 | 1783 | 17.8 | (0.26 0.65) | 36,000 |
| Ex. 10 | G-19 | H-1 | 3% | 6.8 | 1692 | 16.9 | (0.27 0.64) | 40,000 |
| Ex. 11 | G-36 | H-2 | 3% | 6.5 | 1716 | 17.1 | (0.28 0.65) | 35,000 |
| Ex. 12 | G-42 | H-3 | 3% | 6.6 | 1820 | 18.2 | (0.29 0.67) | 40,000 |
| Ex. 13 | G-64 | H-3 | 3% | 6.5 | 1905 | 19.0 | (0.31 0.65) | 45,000 |
| Ex. 14 | G-68 | H-1 | 1% | 6.6 | 2037 | 20.4 | (0.29 0.66) | 55,000 |
| Ex. 15 | G-68 | H-1 | 3% | 6.6 | 2011 | 20.1 | (0.29 0.66) | 50,000 |
| Ex. 16 | G-68 | H-3 | 3% | 6.5 | 1968 | 29.7 | (0.29 0.66) | 35,000 |
| Ex. 17 | G-78 | H-1 | 3% | 6.9 | 1815 | 18.1 | (0.30 0.66) | 38,000 |
| Ex. 18 | G-85 | H-1 | 3% | 6.5 | 2140 | 21.4 | (0.28 0.67) | 35,000 |
| Ex. 19 | G-102 | H-1 | 1% | 6.4 | 2065 | 20.7 | (0.31 0.65) | 40,000 |
| Ex. 20 | G-116 | H-2 | 3% | 6.7 | 2005 | 20.0 | (0.28 0.67) | 40,000 |
| Ex. 21 | G-120 | H-2 | 3% | 6.9 | 2019 | 20.2 | (0.30 0.66) | 35,000 |
| Ex. 22 | G-124 | H-1 | 3% | 6.4 | 1956 | 19.6 | (0.27 0.63) | 40,000 |
| Ex. 23 | G-131 | H-1 | 3% | 6.4 | 2251 | 22.5 | (0.31 0.64) | 40,000 |
| Ex. 24 | G-133 | H-1 | 3% | 6.2 | 2150 | 22.5 | (0.29 0.64) | 40,000 |
| Ex. 25 | G-146 | H-1 | 1% | 6.3 | 2269 | 22.7 | (0.31 0.64) | 50,000 |
| Ex. 26 | G-146 | H-1 | 3% | 6.4 | 2196 | 22.0 | (0.31 0.64) | 50,000 |
| Ex. 27 | G-146 | H-2 | 3% | 6.3 | 2068 | 20.7 | (0.31 0.63) | 45,000 |
| Ex. 28 | G-148 | H-1 | 3% | 6.4 | 2093 | 20.9 | (0.28 0.63) | 40,000 |
| Comp. Ex. 3 | D-1 | H-1 | 2% | 6.6 | 1608 | 16.8 | (0.34 0.65) | 25,000 |
| Comp. Ex. 4 | D-1 | H-2 | 1% | 6.3 | 1638 | 16.4 | (0.33 0.66) | 20,000 |
| Comp. Ex. 5 | D-1 | H-3 | 3% | 6.7 | 1520 | 15.2 | (0.36 0.63) | 18,000 |

TABLE 3

|  | Dopant | Host | Doping conc. | Voltage (V) | Luminance 휘도 (cd/m$^2$) | Current efficiency (cd/A) | CIE(X Y) | Life time (hours) |
|---|---|---|---|---|---|---|---|---|
| Ex. 29 | G-02 | H-11 | 2% | 6.8 | 1783 | 17.8 | (0.26 0.65) | 36,000 |
| Ex. 30 | G-19 | H-11 | 3% | 6.8 | 1692 | 16.9 | (0.27 0.64) | 40,000 |
| Ex. 31 | G-36 | H-4 | 3% | 6.5 | 1716 | 17.1 | (0.28 0.65) | 35,000 |
| Ex. 32 | G-42 | H-14 | 3% | 6.6 | 1820 | 18.2 | (0.29 0.67) | 40,000 |
| Ex. 33 | G-64 | H-14 | 3% | 6.5 | 1905 | 19.0 | (0.31 0.65) | 45,000 |
| Ex. 34 | G-68 | H-11 | 1% | 6.6 | 2037 | 20.4 | (0.29 0.66) | 55,000 |
| Ex. 35 | G-68 | H-11 | 3% | 6.6 | 2011 | 20.1 | (0.29 0.66) | 50,000 |
| Ex. 36 | G-68 | H-14 | 3% | 6.5 | 1968 | 29.7 | (0.29 0.66) | 35,000 |
| Ex. 37 | G-78 | H-11 | 3% | 6.9 | 1815 | 18.1 | (0.30 0.66) | 38,000 |
| Ex. 38 | G-85 | H-11 | 3% | 6.5 | 2140 | 21.4 | (0.28 0.67) | 35,000 |
| Ex. 39 | G-102 | H-11 | 1% | 6.4 | 2065 | 20.7 | (0.31 0.65) | 40,000 |
| Ex. 40 | G-116 | H-4 | 3% | 6.7 | 2005 | 20.0 | (0.28 0.67) | 40,000 |
| Ex. 41 | G-120 | H-4 | 3% | 6.9 | 2019 | 20.2 | (0.30 0.66) | 35,000 |
| Ex. 42 | G-124 | H-11 | 3% | 6.4 | 1956 | 19.6 | (0.27 0.63) | 40,000 |
| Ex. 43 | G-131 | H-11 | 3% | 6.4 | 2251 | 22.5 | (0.31 0.64) | 40,000 |
| Ex. 44 | G-133 | H-11 | 3% | 6.2 | 2150 | 22.5 | (0.29 0.64) | 40,000 |
| Ex. 45 | G-146 | H-11 | 1% | 6.3 | 2269 | 22.7 | (0.31 0.64) | 50,000 |
| Ex. 46 | G-146 | H-11 | 3% | 6.4 | 2196 | 22.0 | (0.31 0.64) | 50,000 |
| Ex. 47 | G-146 | H-4 | 3% | 6.3 | 2068 | 20.7 | (0.31 0.63) | 45,000 |
| Ex. 48 | G-148 | H-11 | 3% | 6.4 | 2093 | 20.9 | (0.28 0.63) | 40,000 |
| Comp. Ex. 6 | D-1 | H-11 | 2% | 6.6 | 1608 | 16.8 | (0.34 0.65) | 25,000 |
| Comp. Ex. 7 | D-1 | H-4 | 1% | 6.3 | 1638 | 16.4 | (0.33 0.66) | 20,000 |
| Comp. Ex. 8 | D-1 | H-14 | 3% | 6.7 | 1520 | 15.2 | (0.36 0.63) | 18,000 |

The present invention provides a an organic electroluminescent device having higher color purity, higher luminance and longer lifetime than conventional organic electroluminescent devices, via the use of the compound of Formula 1 as a emitting material of the emitting layer of the EL device, or the use of the compound of Formula 1 as a dopant for an emitting layer of the EL device, and the use of the compound of Formula 1 is used as a dopant and the compound of Formula 2 is used as a host of the emitting layer of the EL device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescent device comprising a structure having an anode, an emitting layer, and a cathode stacked therein, wherein a dopant of the emitting layer is selected from the group consisting of G-03 to G-06, G-11, G-14, G-16 to G-19, G-21 to G-24, G-26 to G-66, G-71, G-72, G-77, G-78, G-80 to G-85, G-87 to G-90, G-92 to G-99, G-101 to G-124, G-126 to G-129, and G-132 to G-156 below:

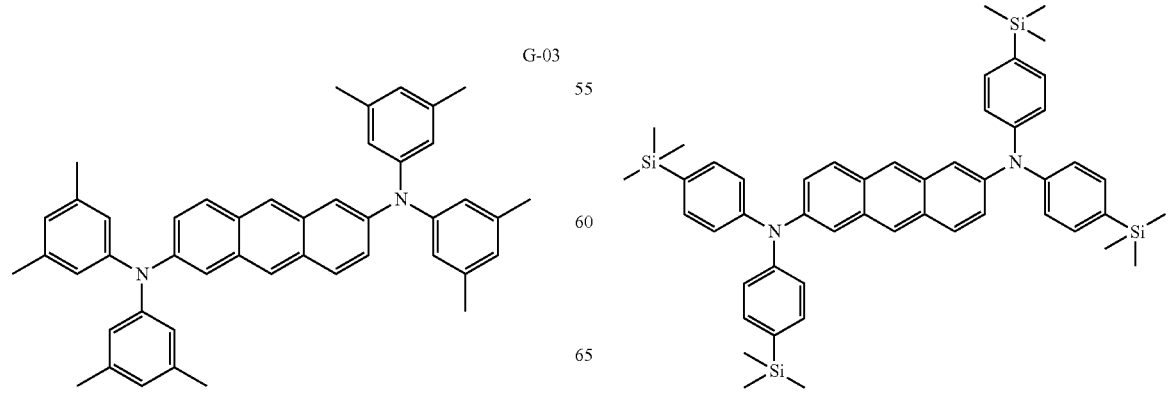

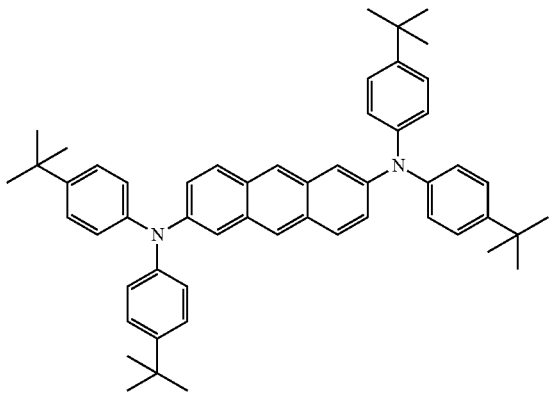

-continued
G-06
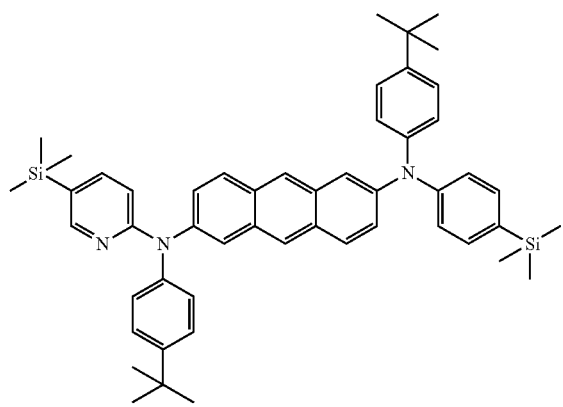
G-11
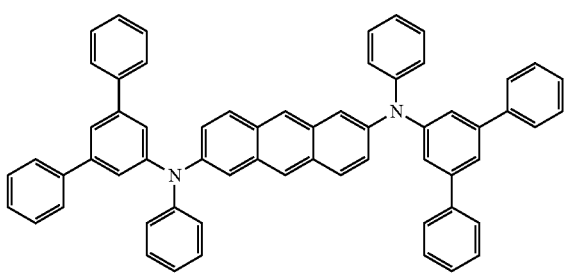
G-14
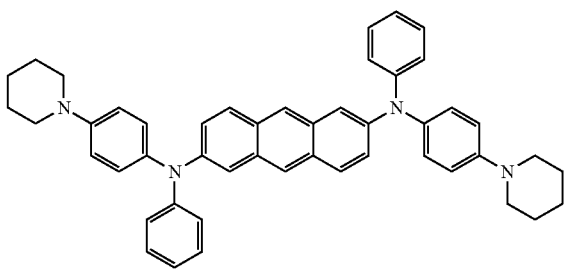
G-16
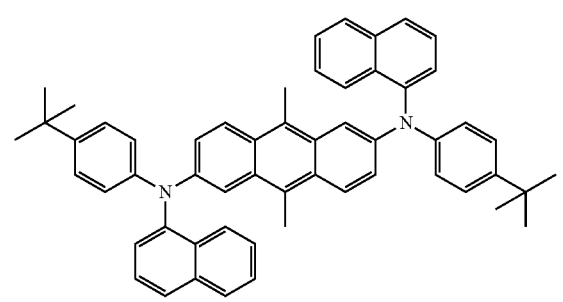
G-17
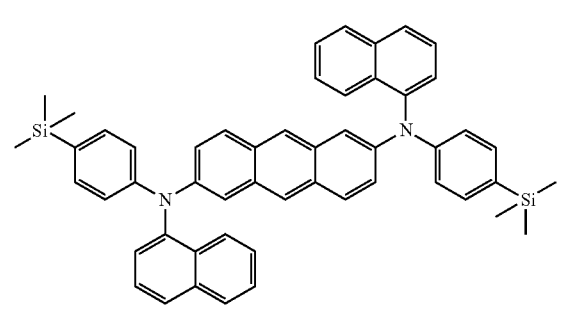
-continued
G-18
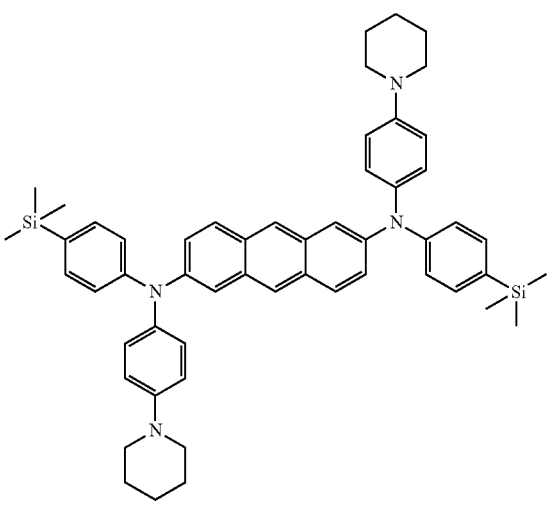
G-19
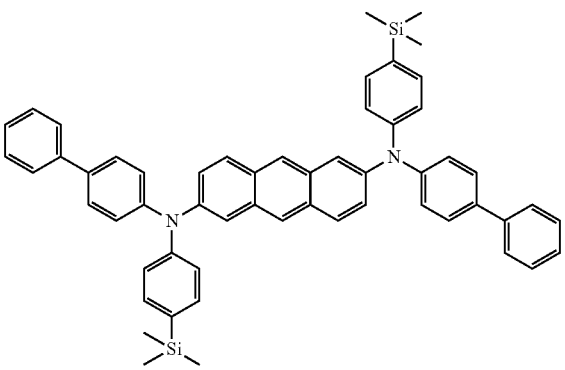
G-21
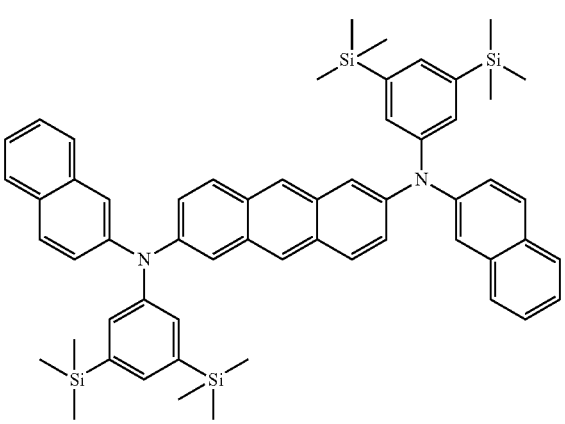

G-22
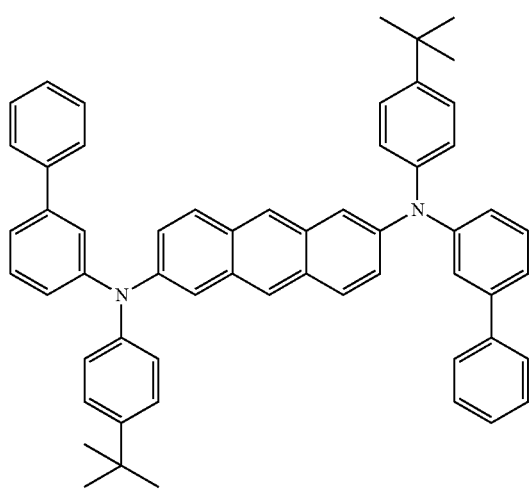
G-23
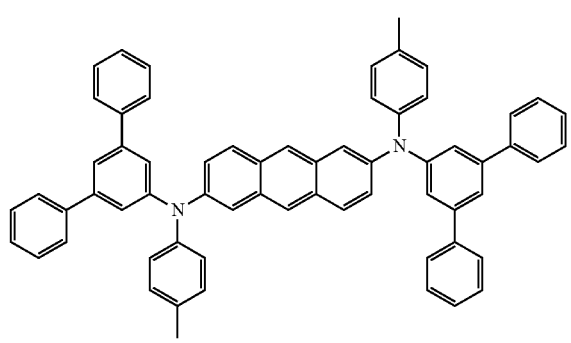
G-24
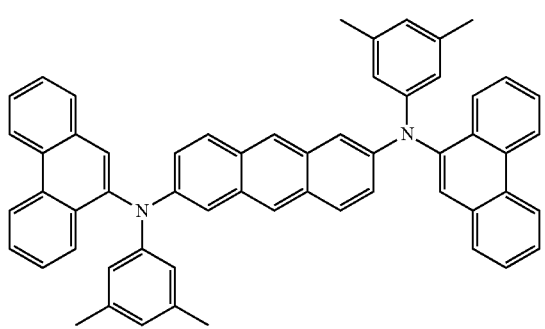
G-26
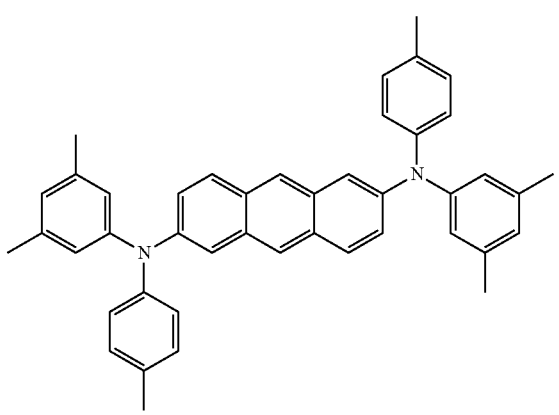
G-27
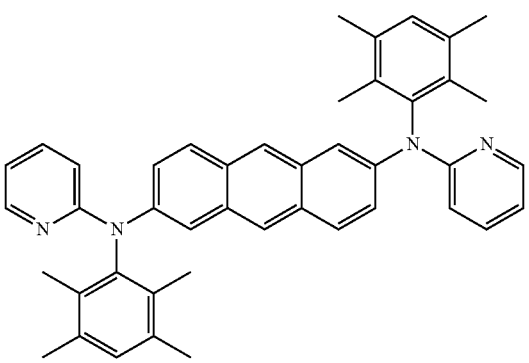
G-28
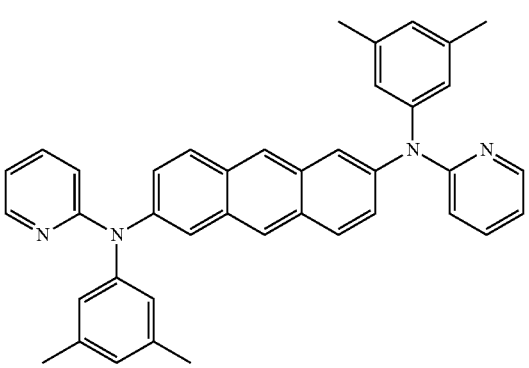
G-29
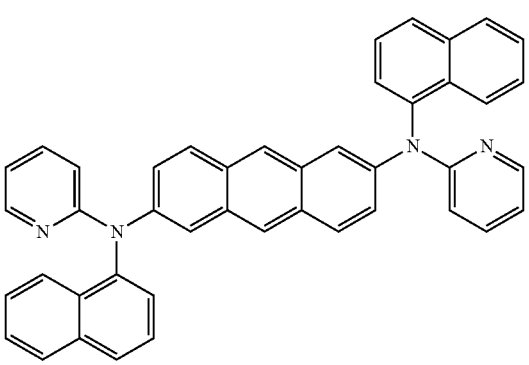
G-30
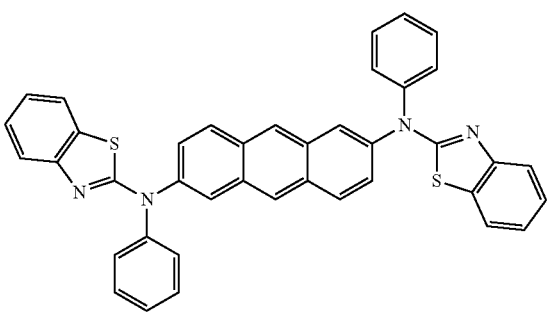

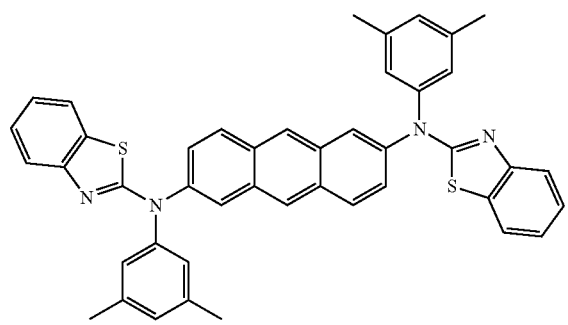

G-39
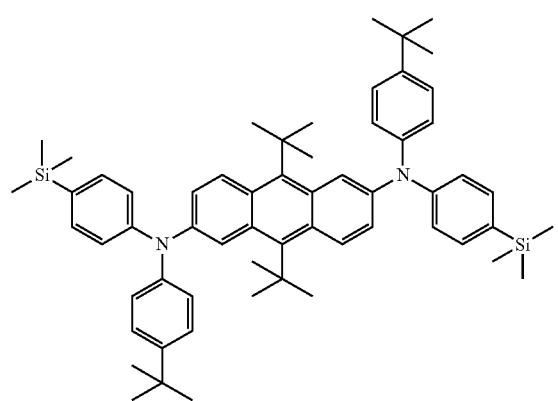
G-43
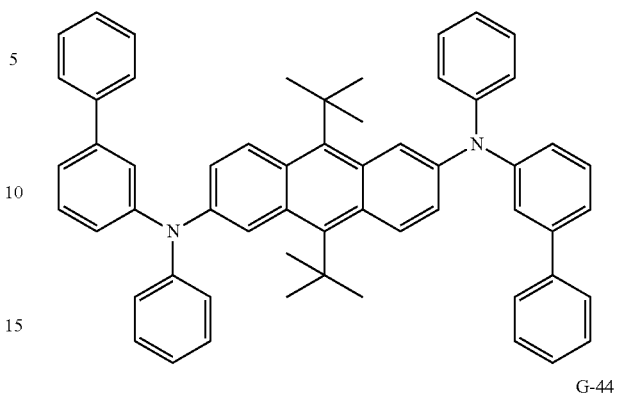
G-40
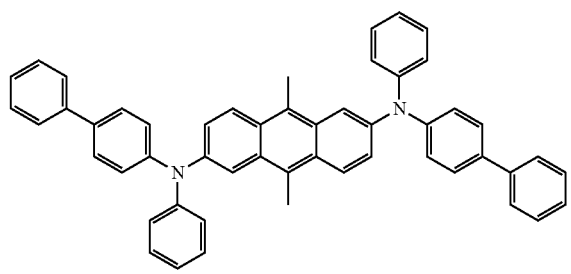
G-44
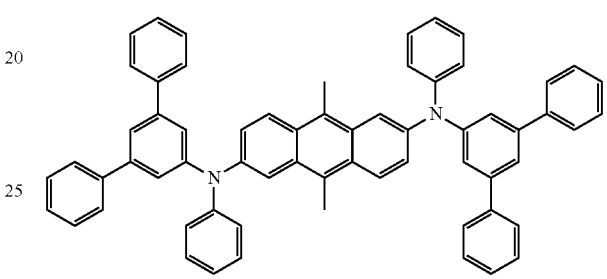
G-41
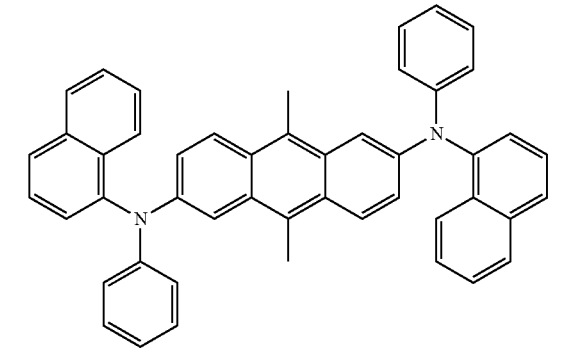
G-45
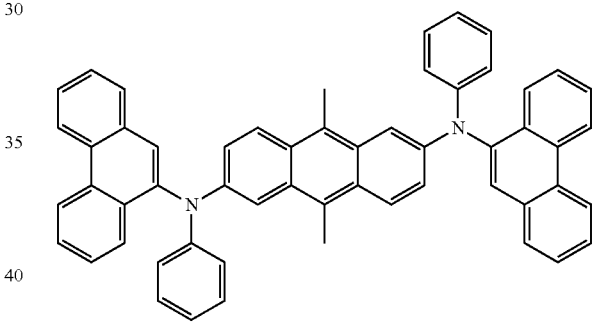
G-42
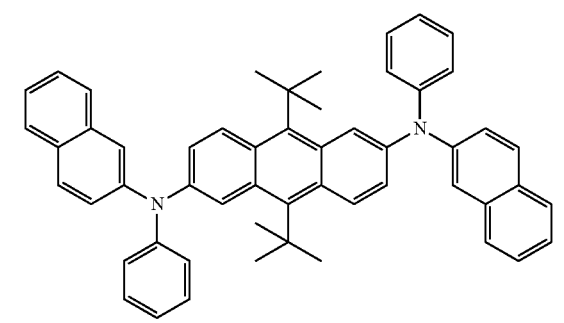
G-46
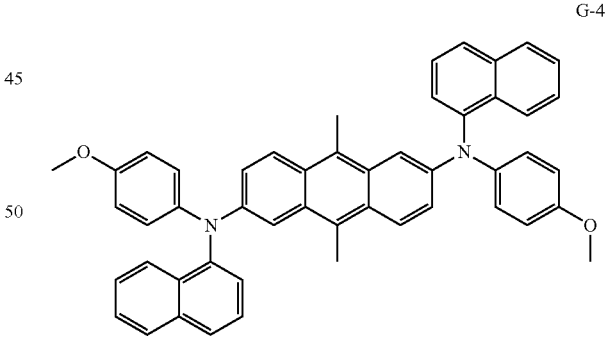
G-47
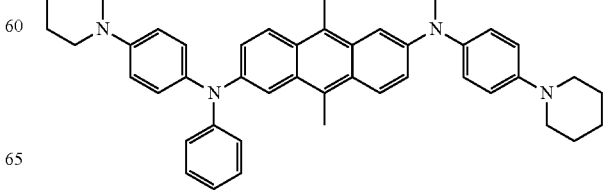

G-48
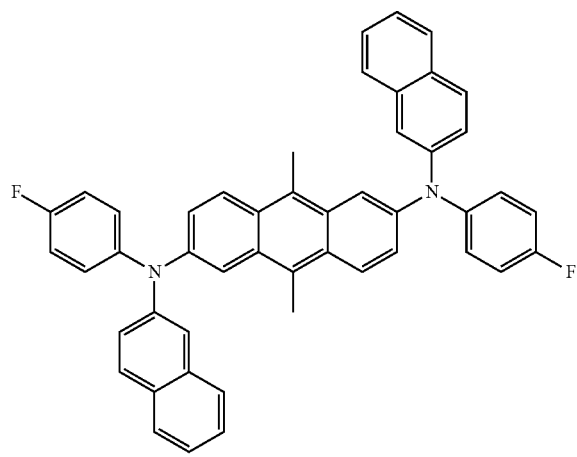
G-49
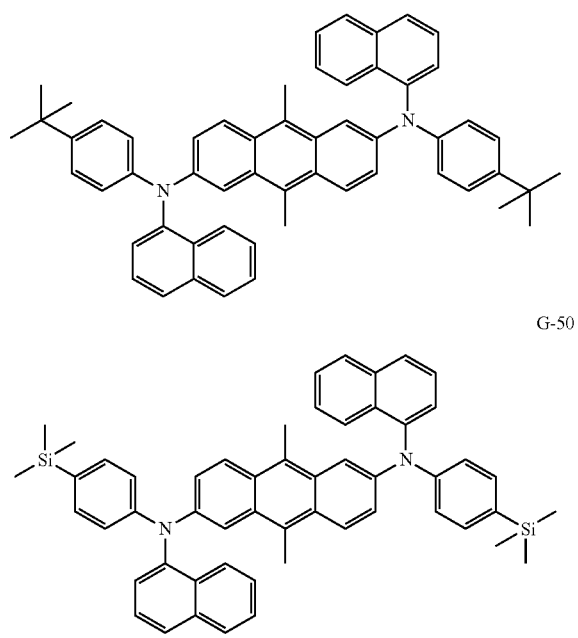
G-50
G-51
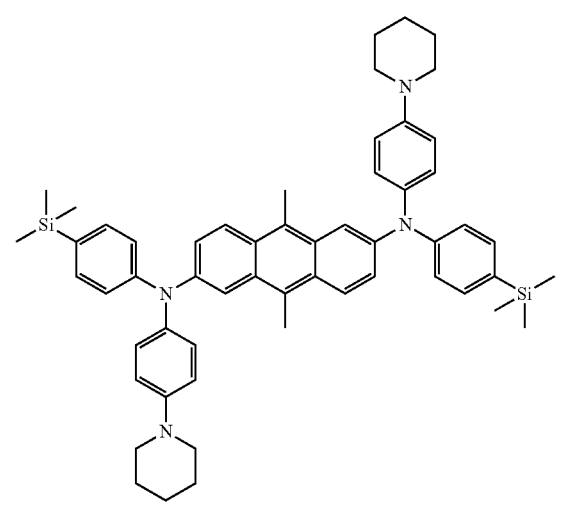
G-52
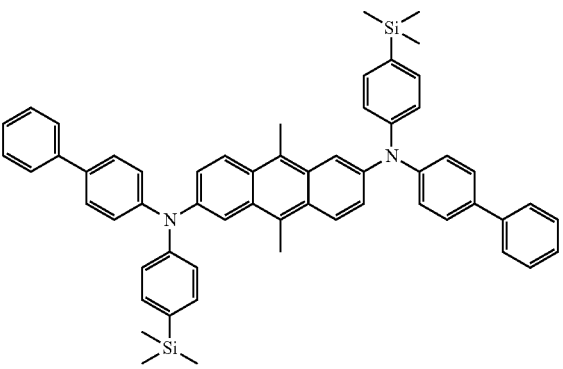
G-53
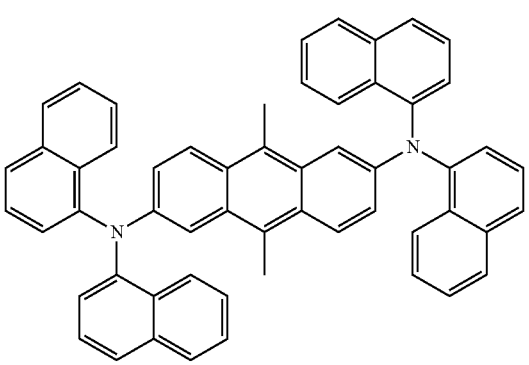
G-54
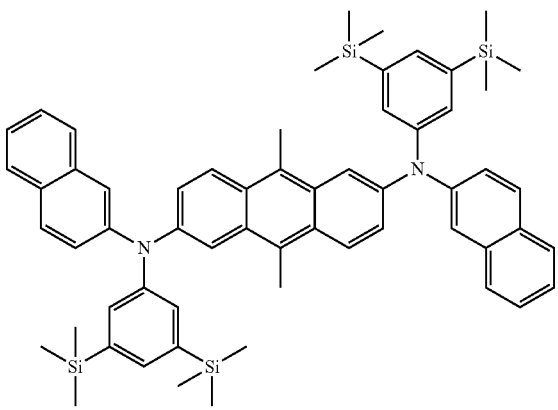

-continued
G-55
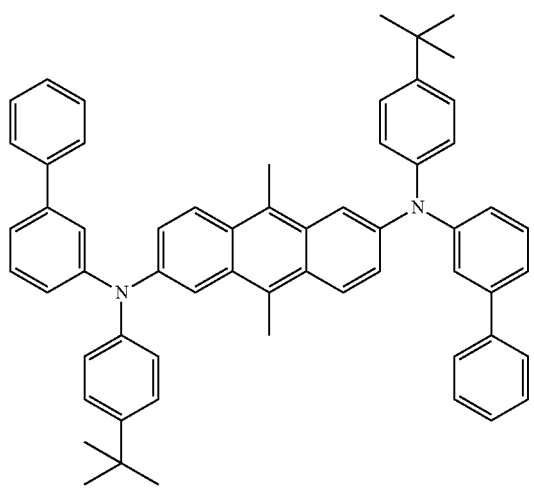
G-56
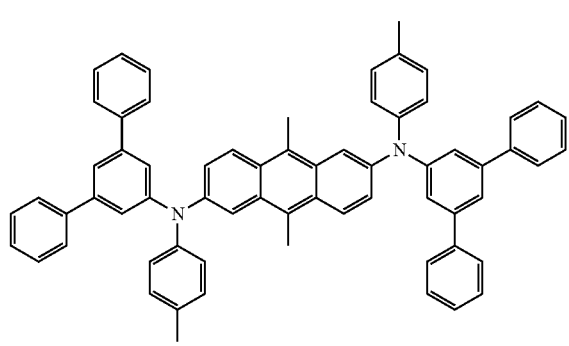
G-57
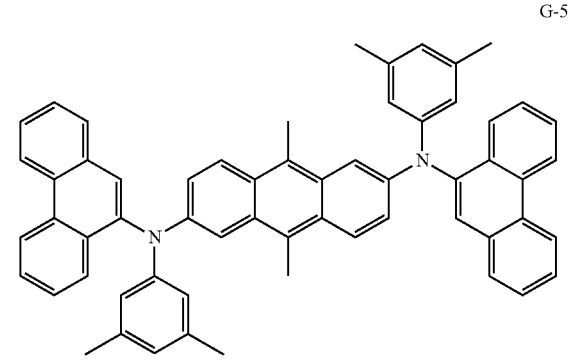
-continued
G-58
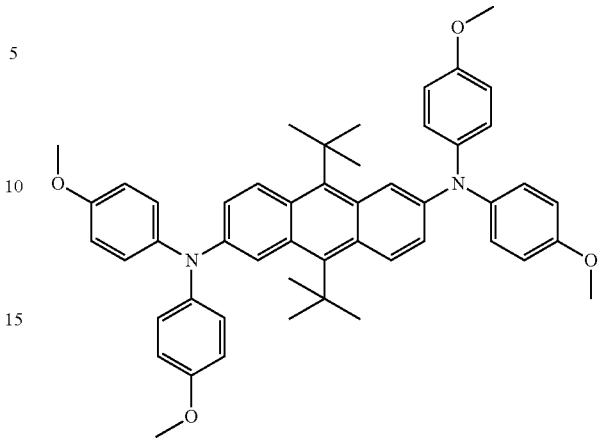
G-59
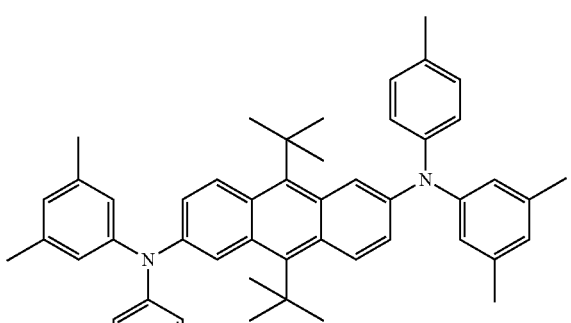
G-60
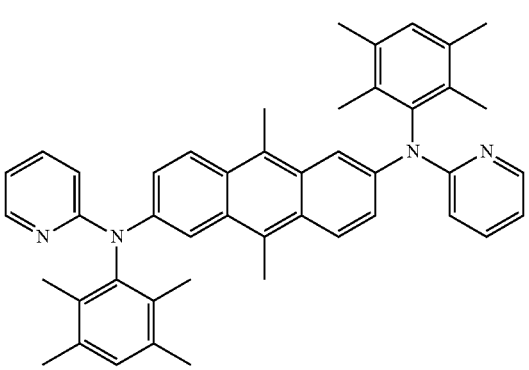
G-61
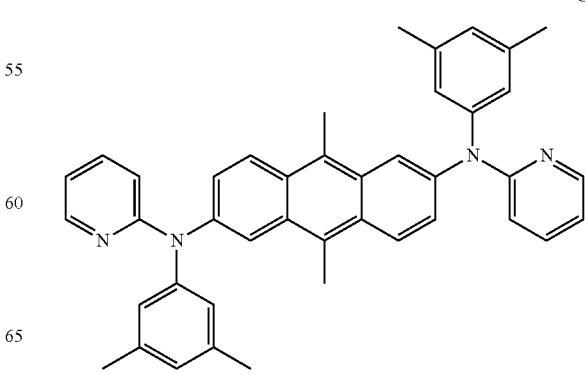

G-62
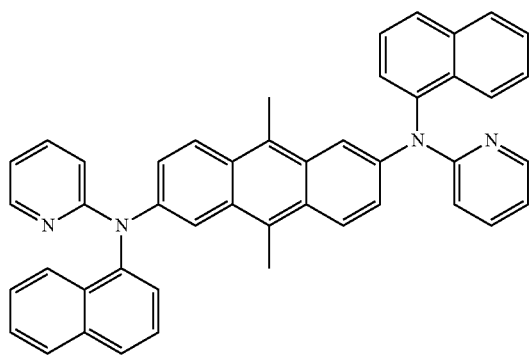
G-63
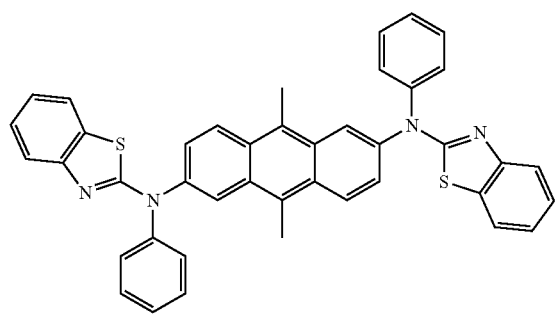
G-64
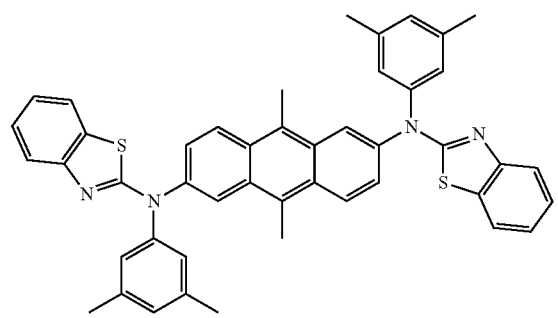
G-65
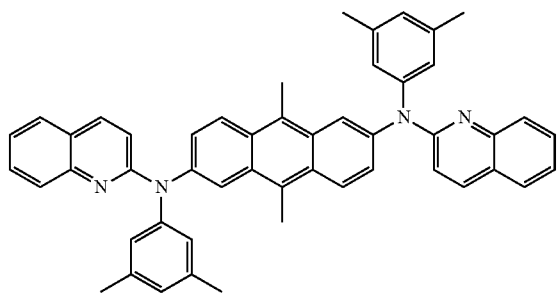
G-66
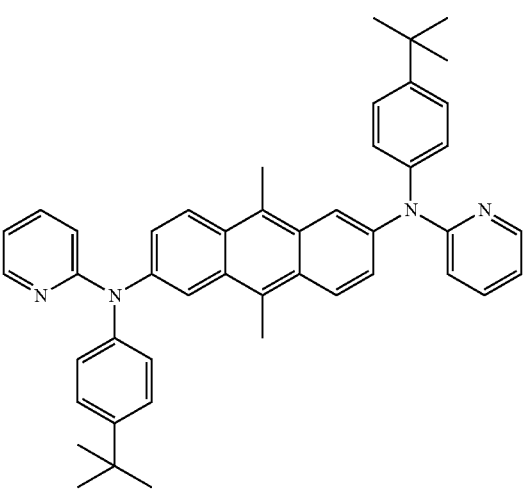
G-71
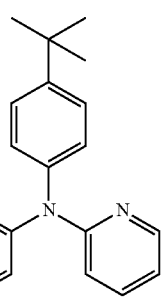
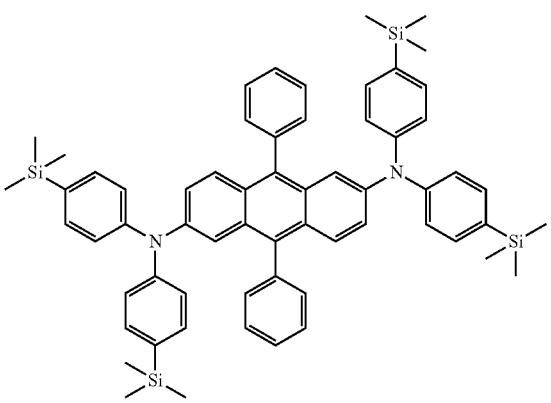
G-72
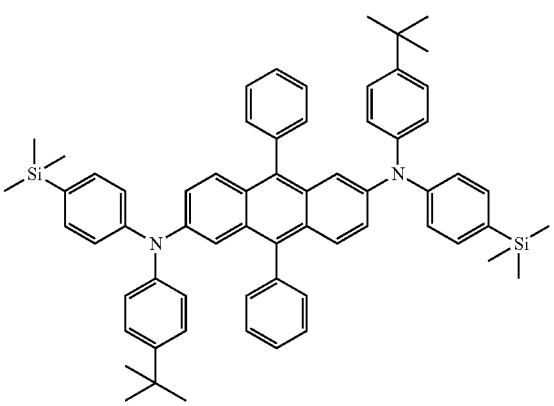
G-77
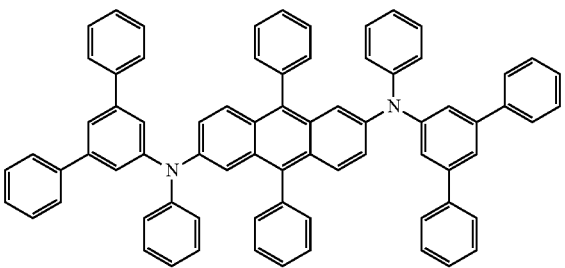

-continued
G-78
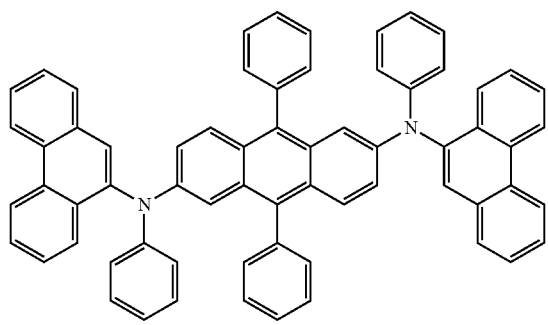
G-83
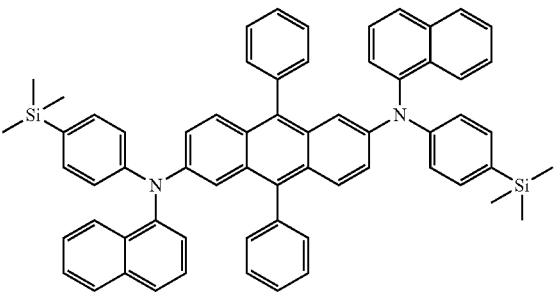
G-80
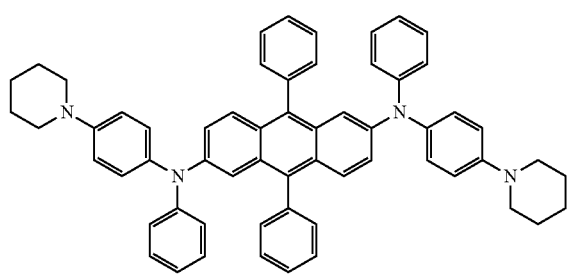
G-84
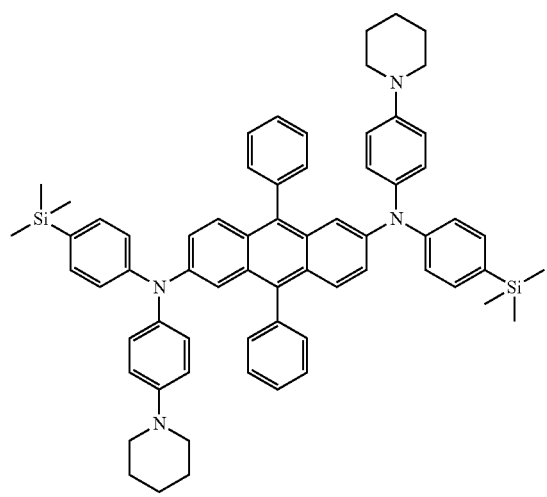
G-81
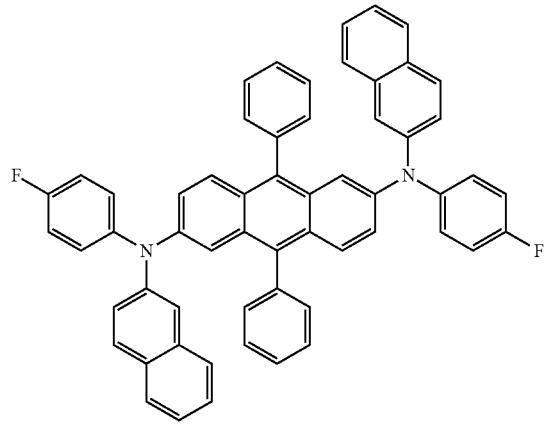
G-85
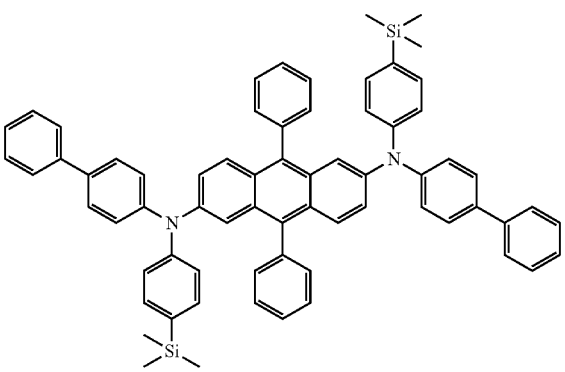
G-82
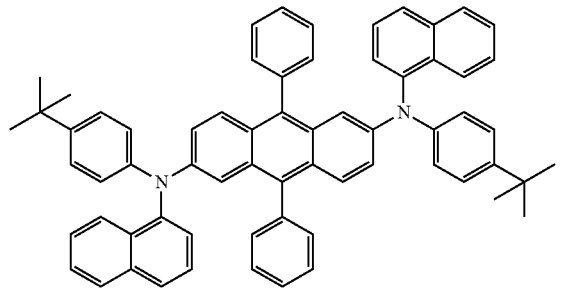
G-87
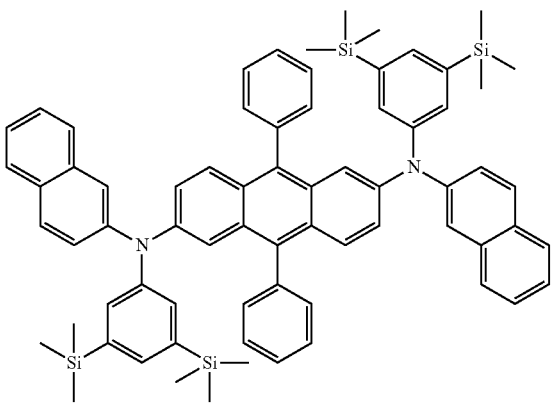

-continued
G-88
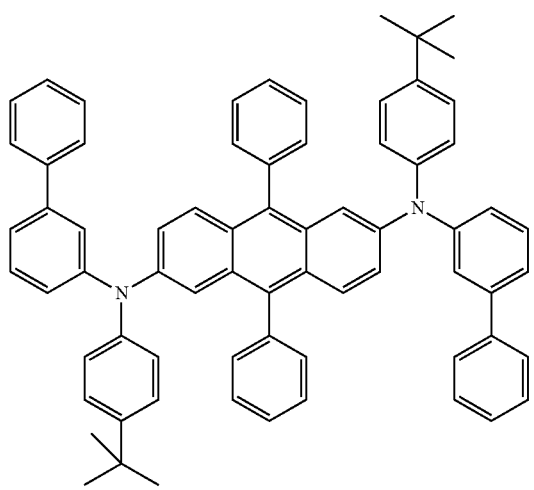
G-89
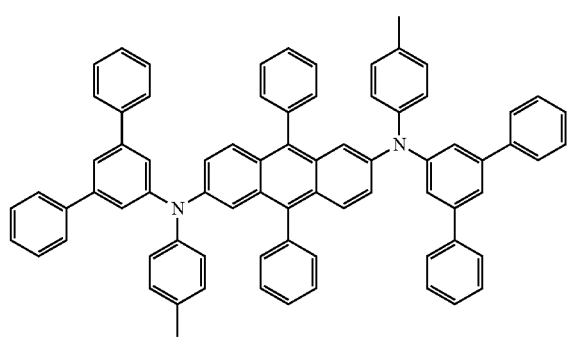
G-90
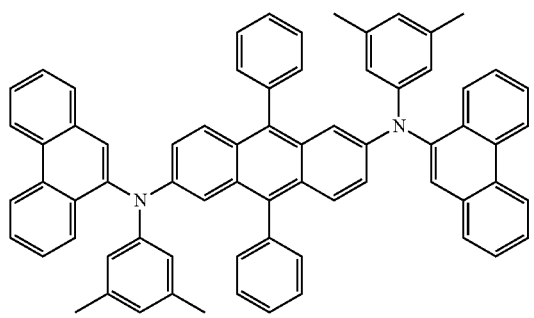
G-92
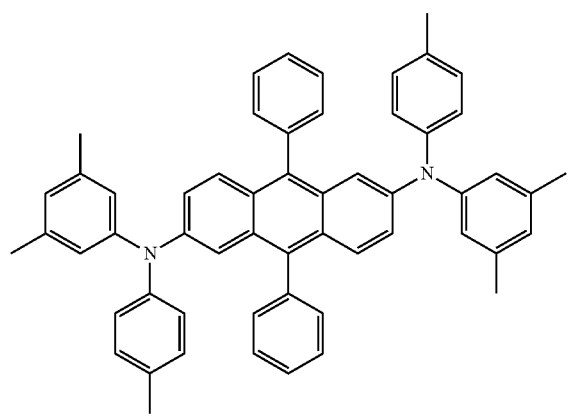
-continued
G-93
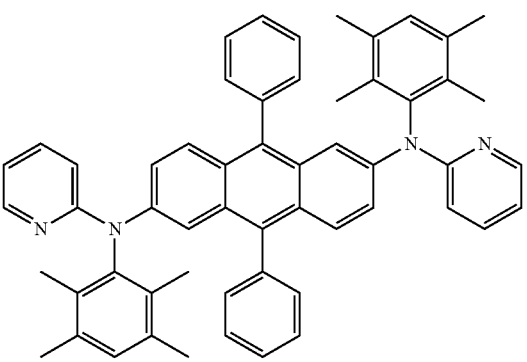
G-94
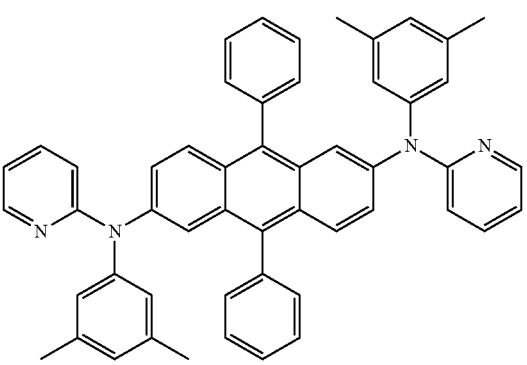
G-95
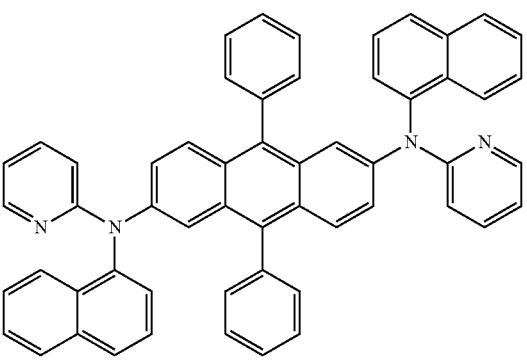
G-96
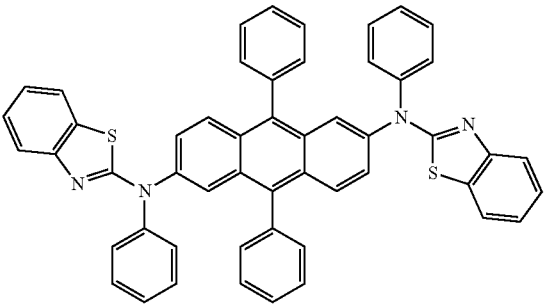

G-97
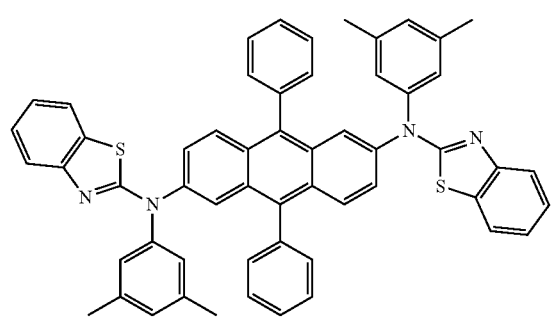
G-98
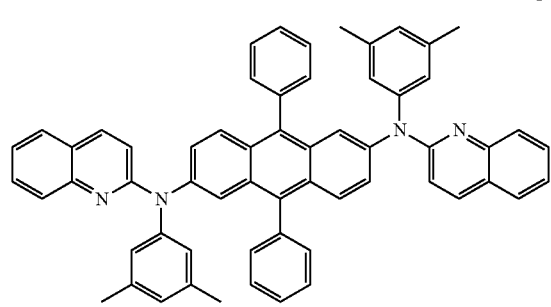
G-99
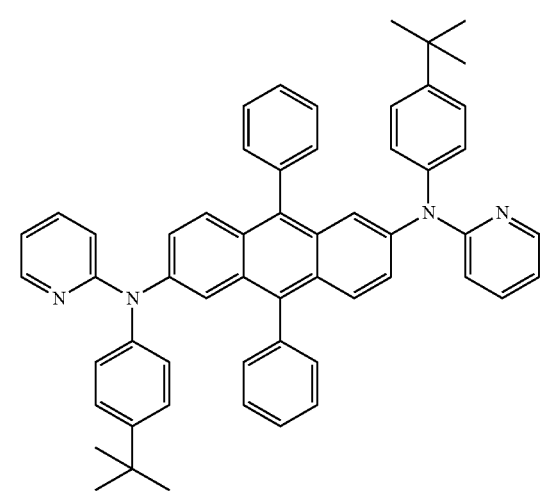
G-101
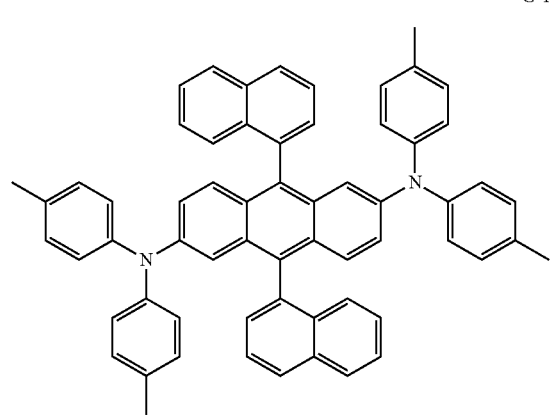
G-102
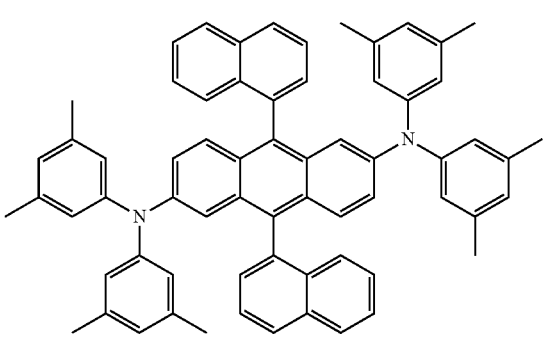
B-103
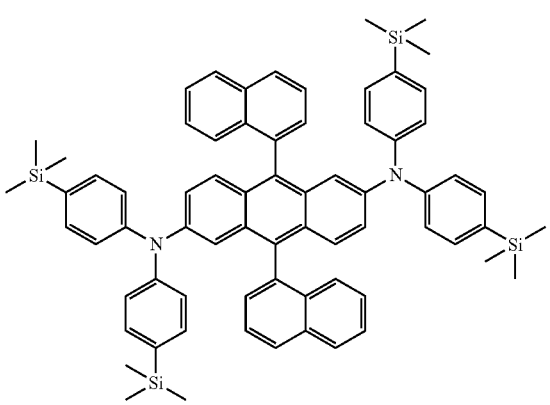
G-104
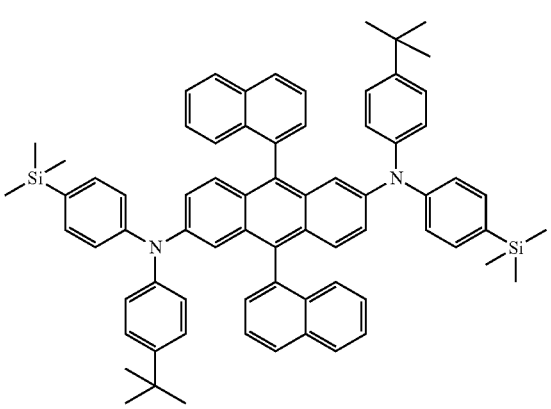
G-105
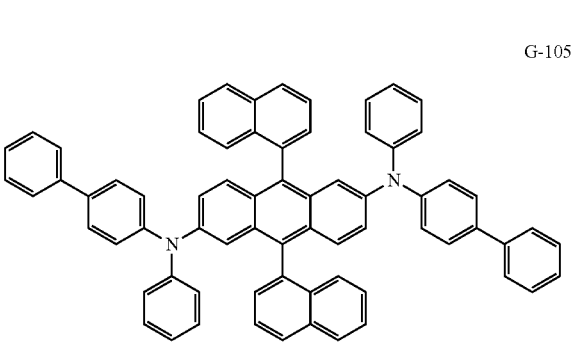

-continued
G-106
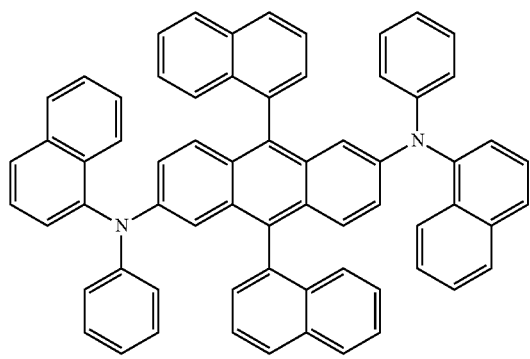
G-107
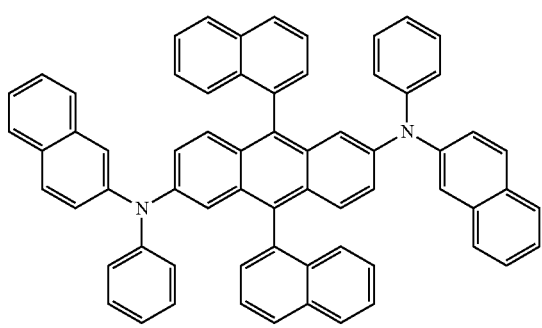
G-108
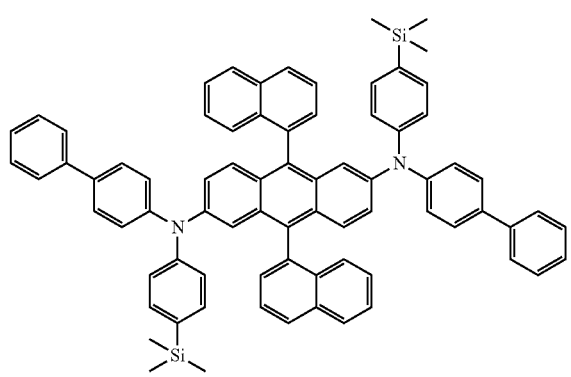
G-109
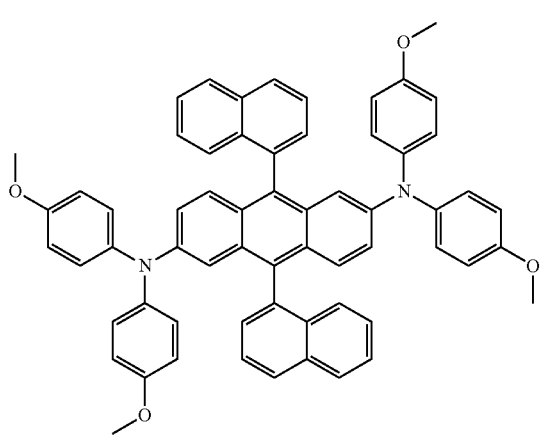
-continued
G-110
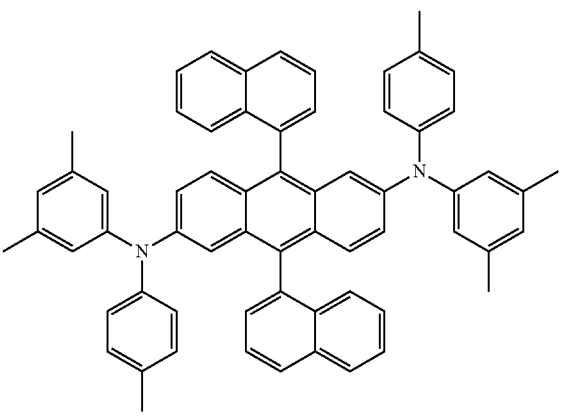
G-111
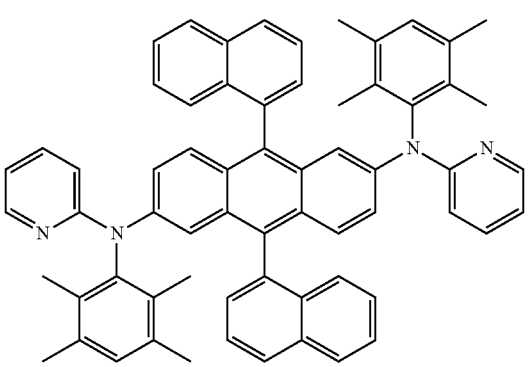
G-112
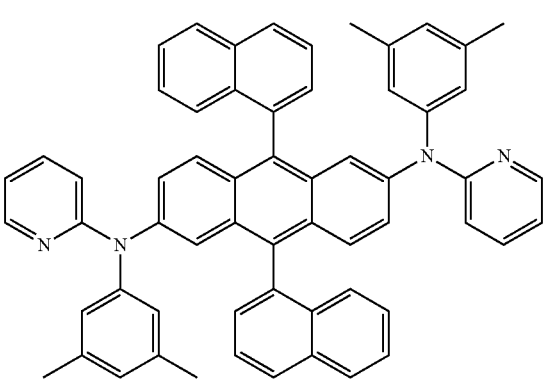
G-113
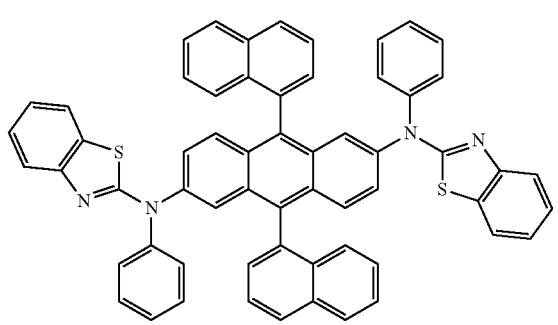

G-114
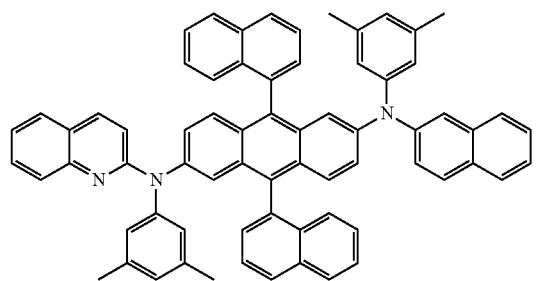
G-115
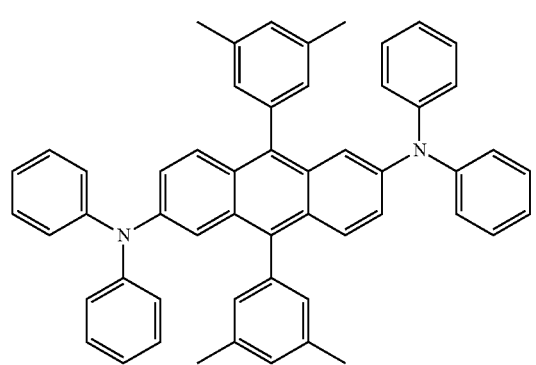
G-116
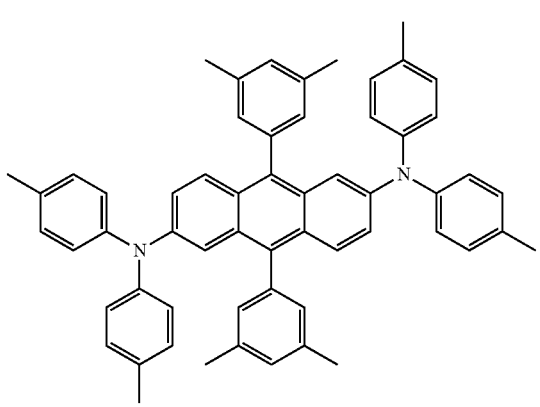
G-117
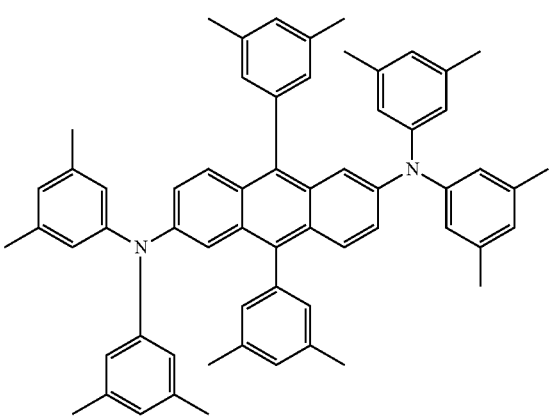
G-118
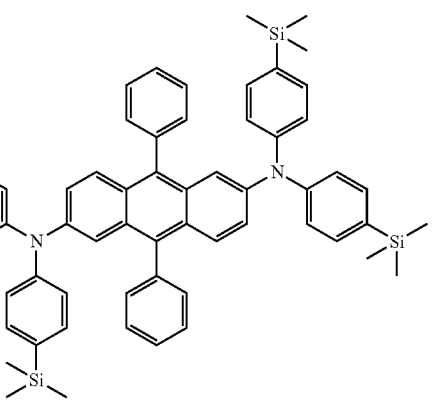
G-119
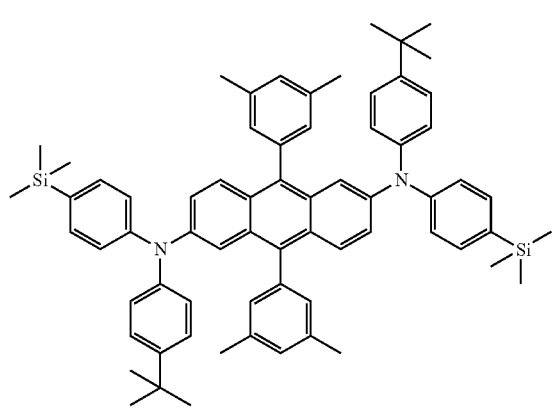
G-120
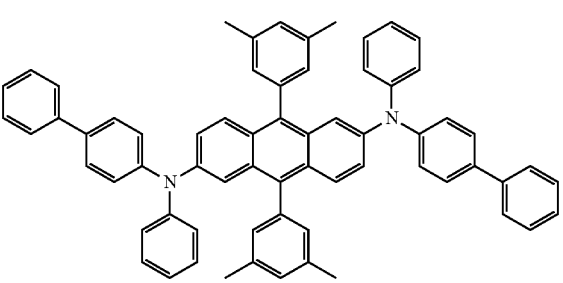
G-121
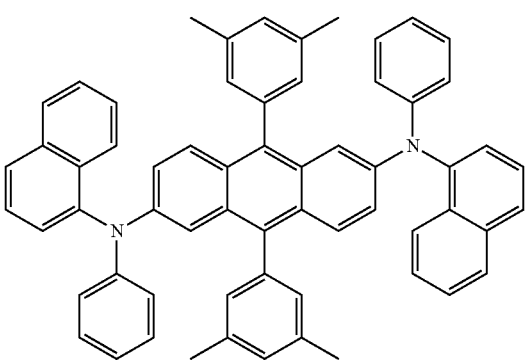

G-122
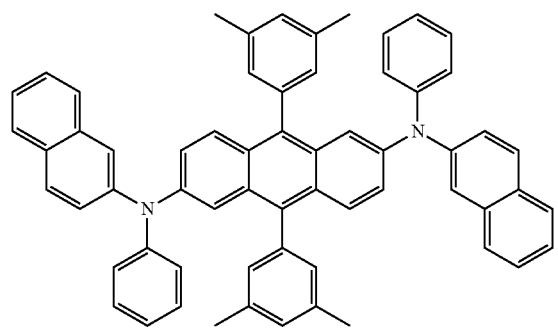
G-123
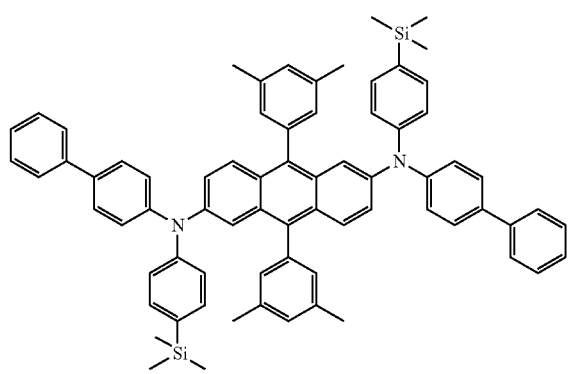
G-124
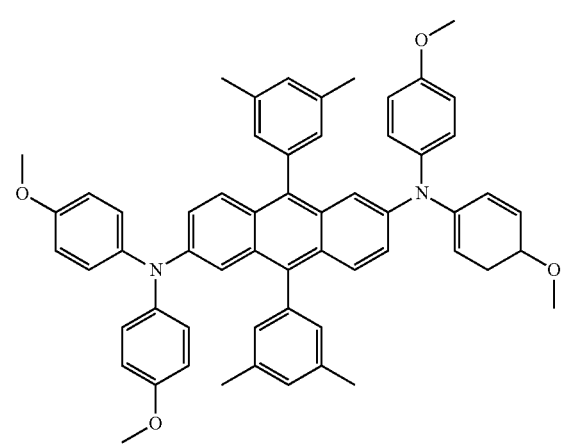
G-126
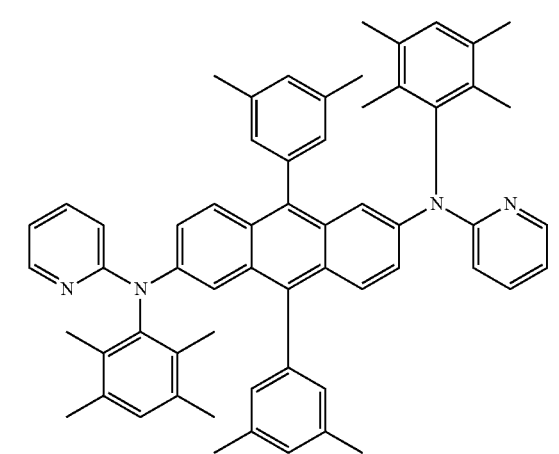
G-127
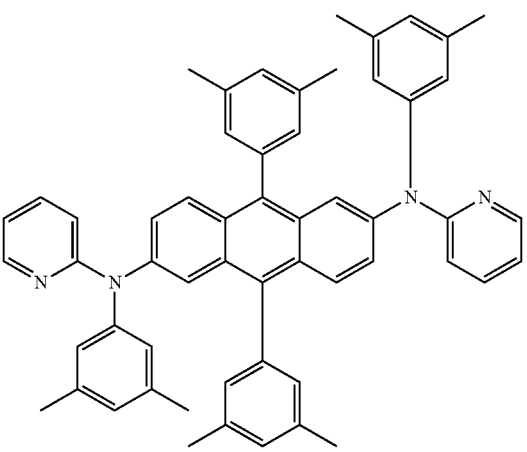
G-128
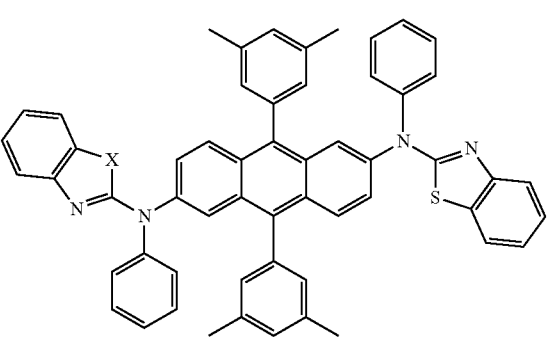
G-129
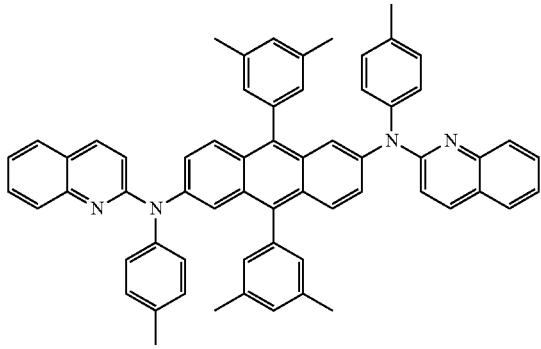
G-132
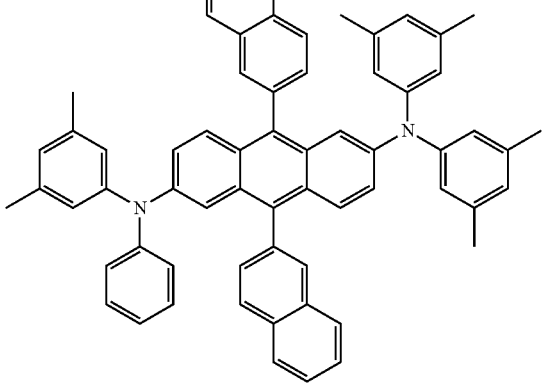

G-133
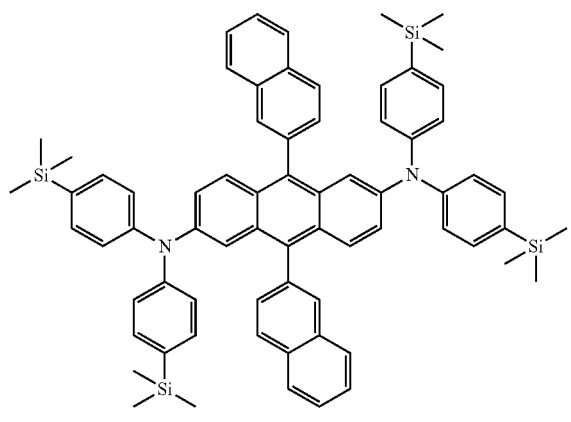
G-134
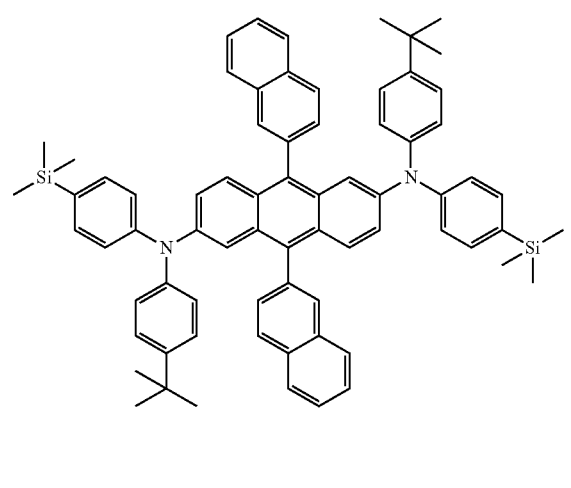
G-135
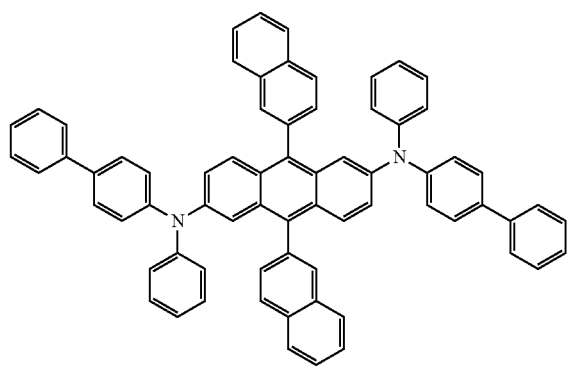
G-136
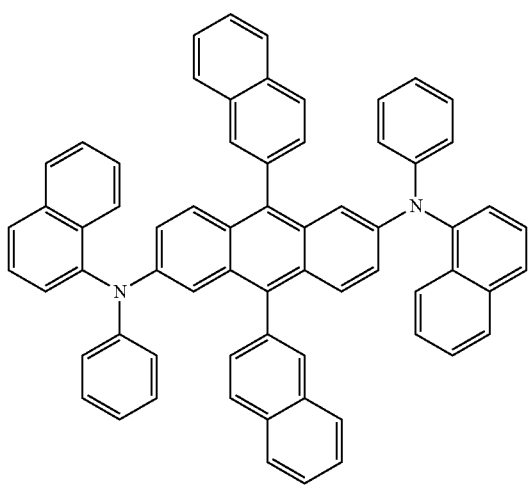
G-137
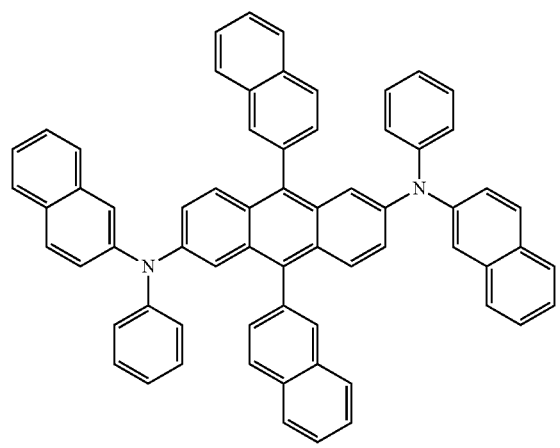
G-138
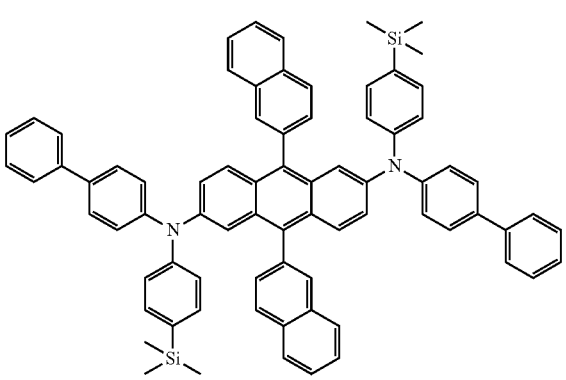

G-139
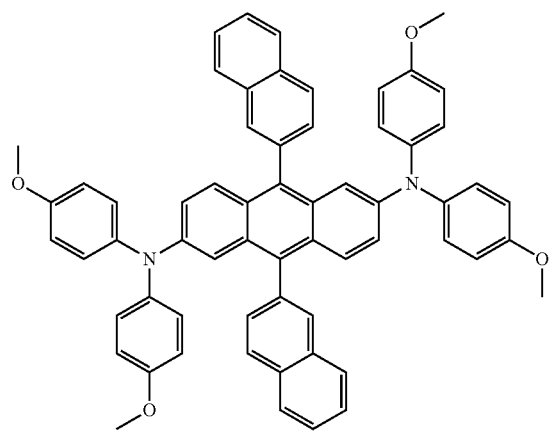
G-140
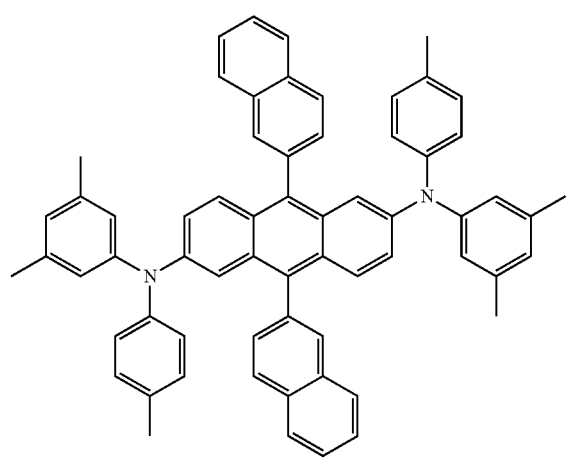
G-141
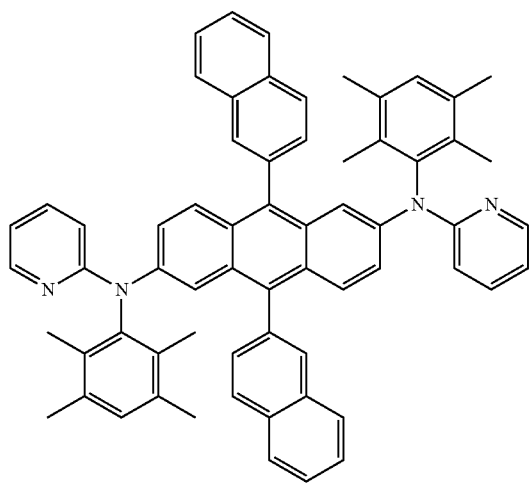
G-142
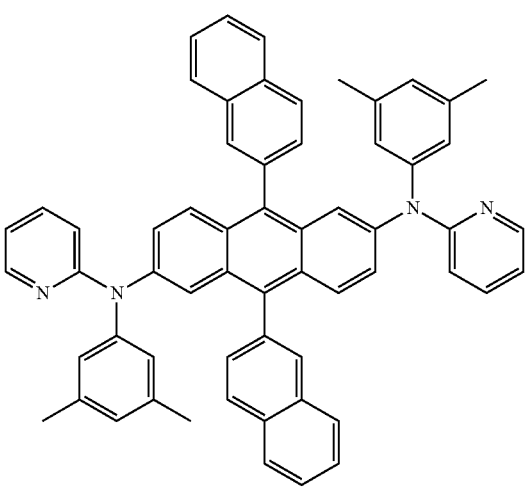
G-143
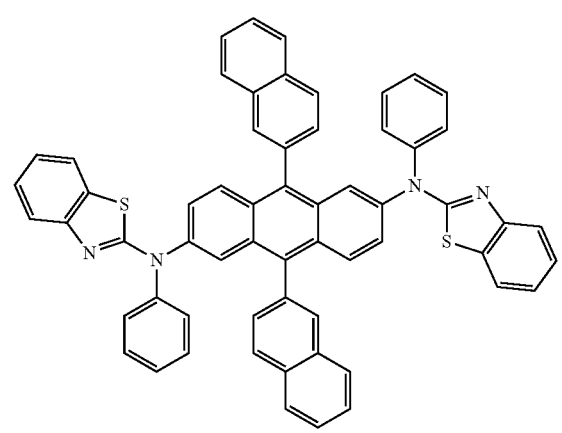
G-144
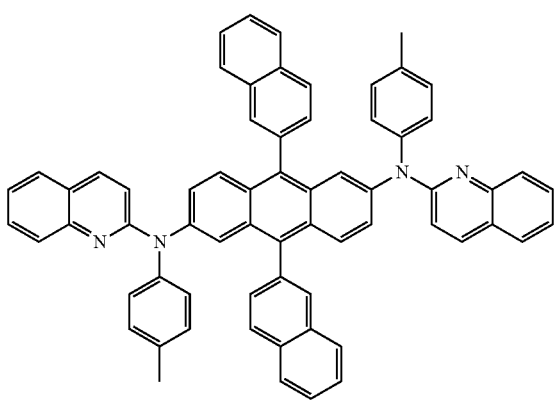

G-145
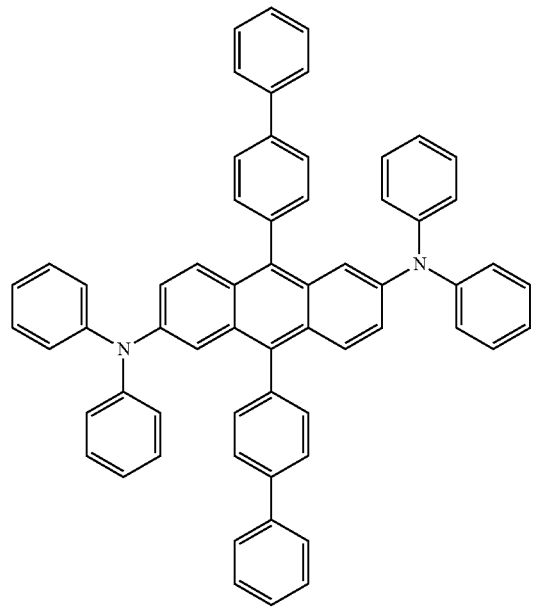
G-146
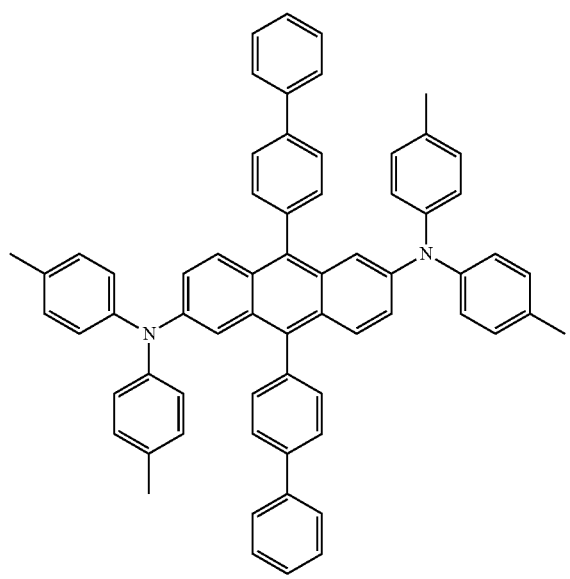
G-147
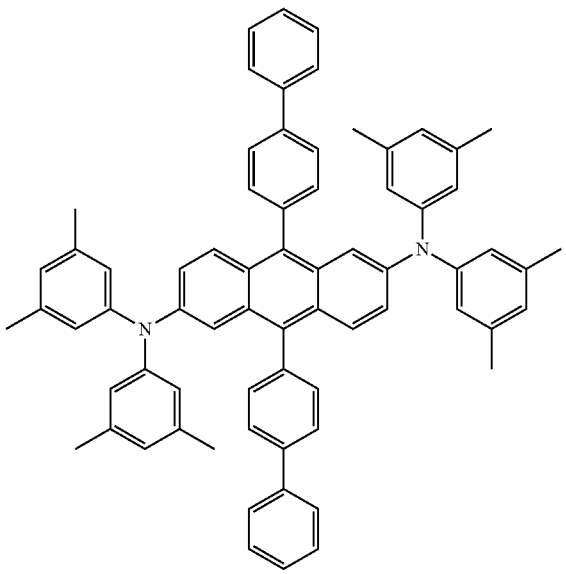
G-148
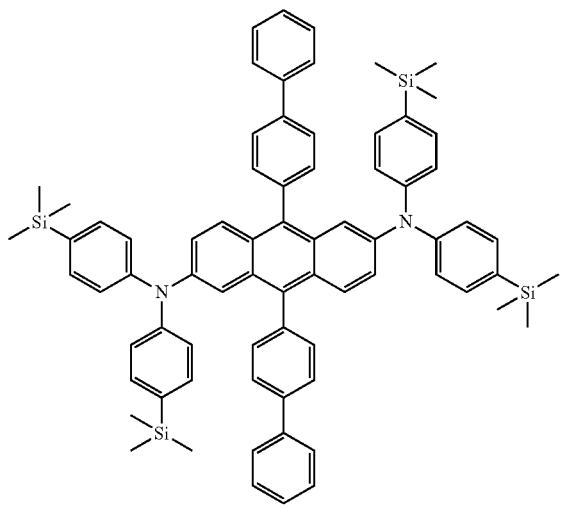
G-149
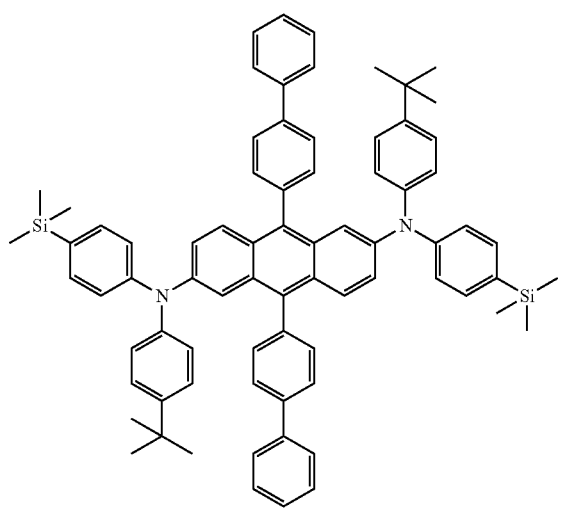

G-150
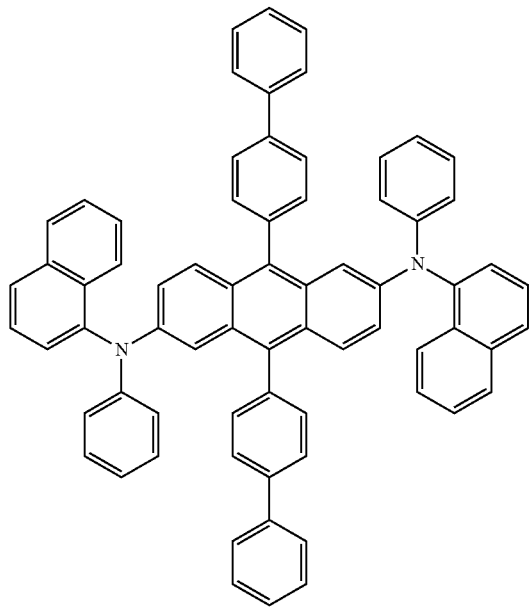
G-151
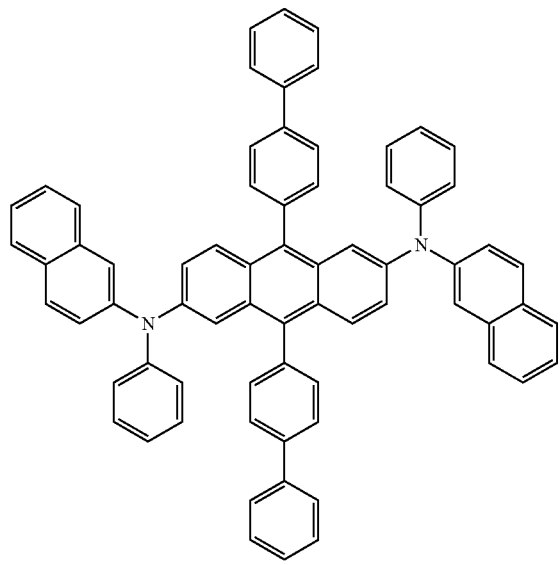
G-152
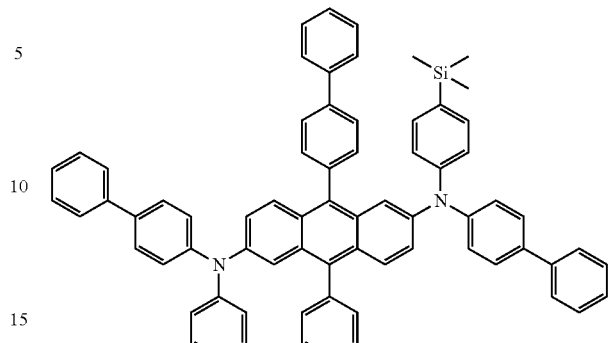
G-153
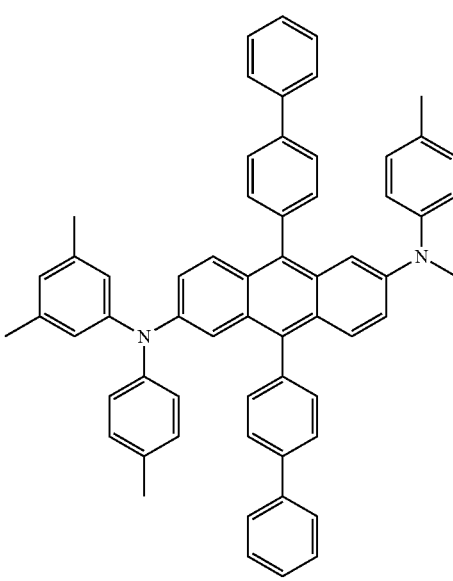
G-154
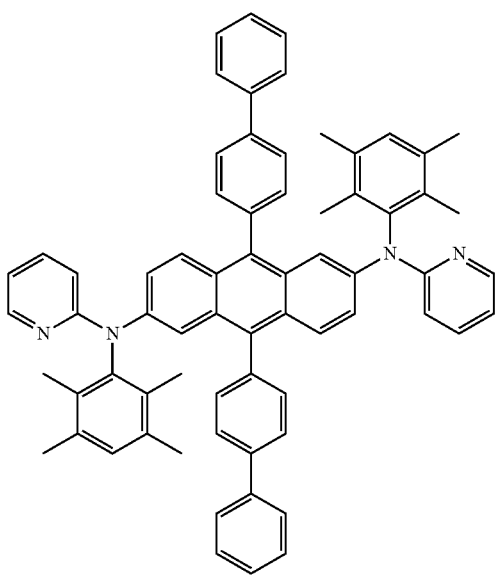

G-155
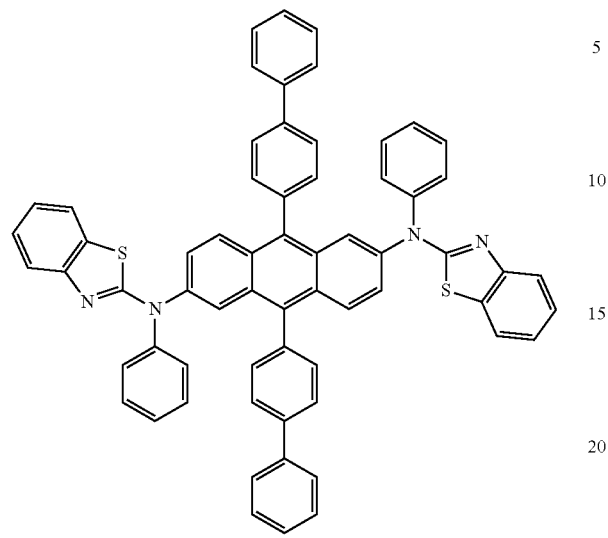
G-156
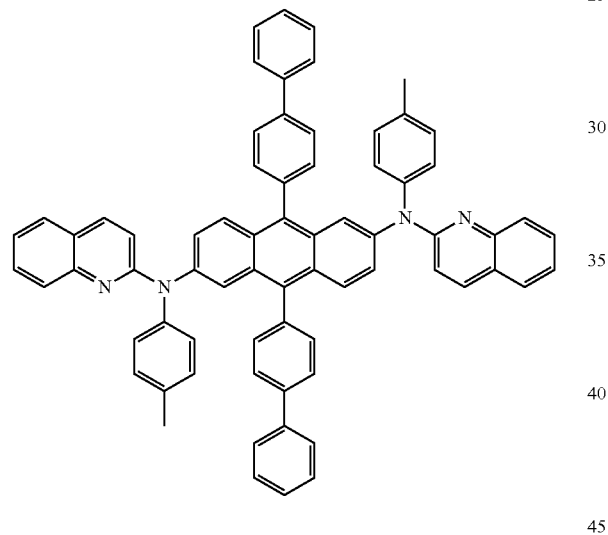
and a host of the emitting layer is selected from the group consisting of the H-2 to H-5, H-7 to H-32 below:
H-2
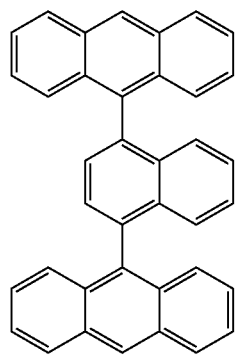
H-3
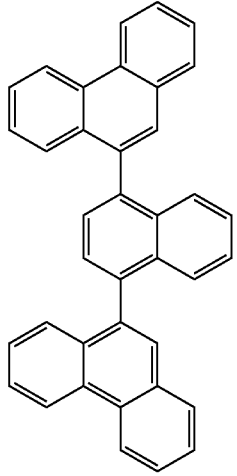
H-4
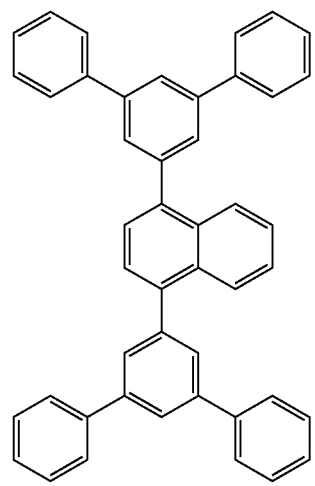
H-6
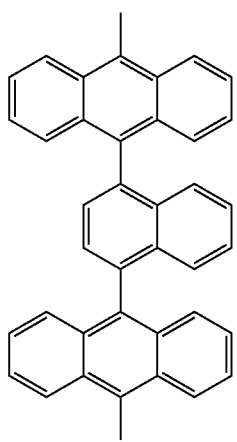

H-7
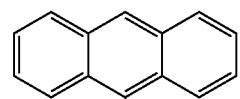
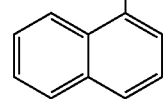
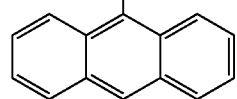
H-8
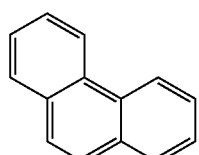
H-9
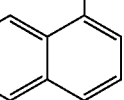
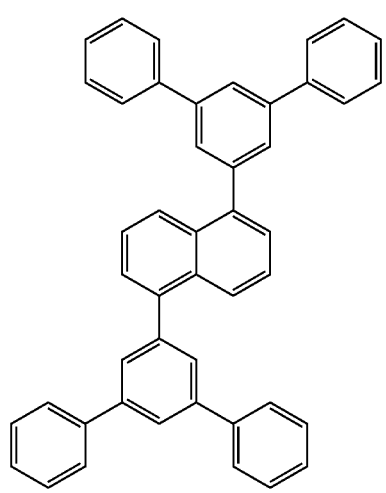
H-10
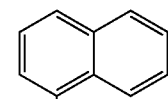
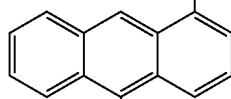
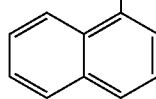
H-12
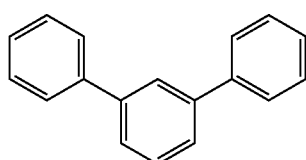
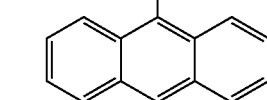
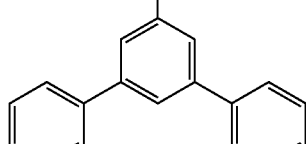
H-13
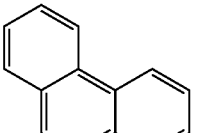
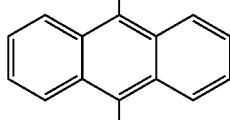
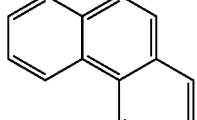

H-14
H-15
H-16
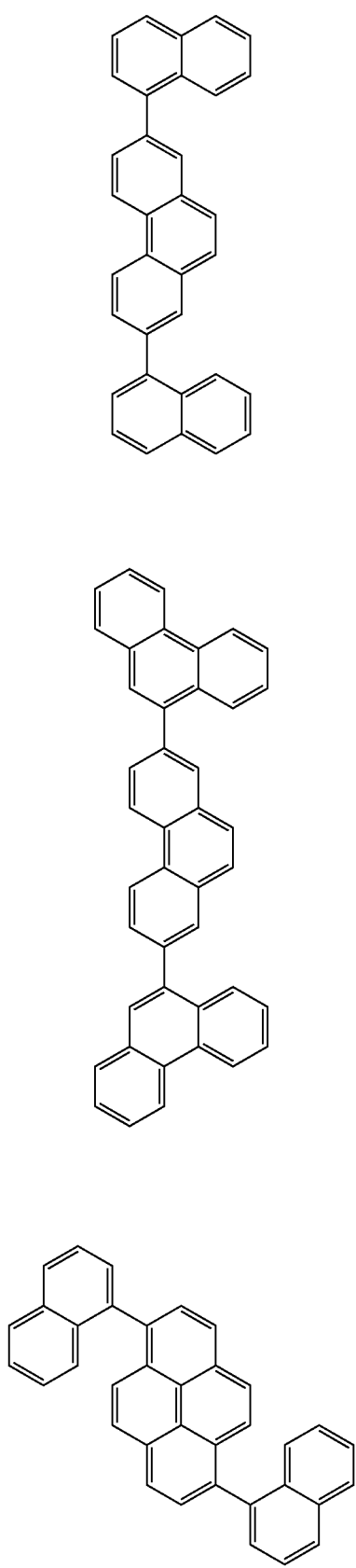
H-17
H-18
H-19
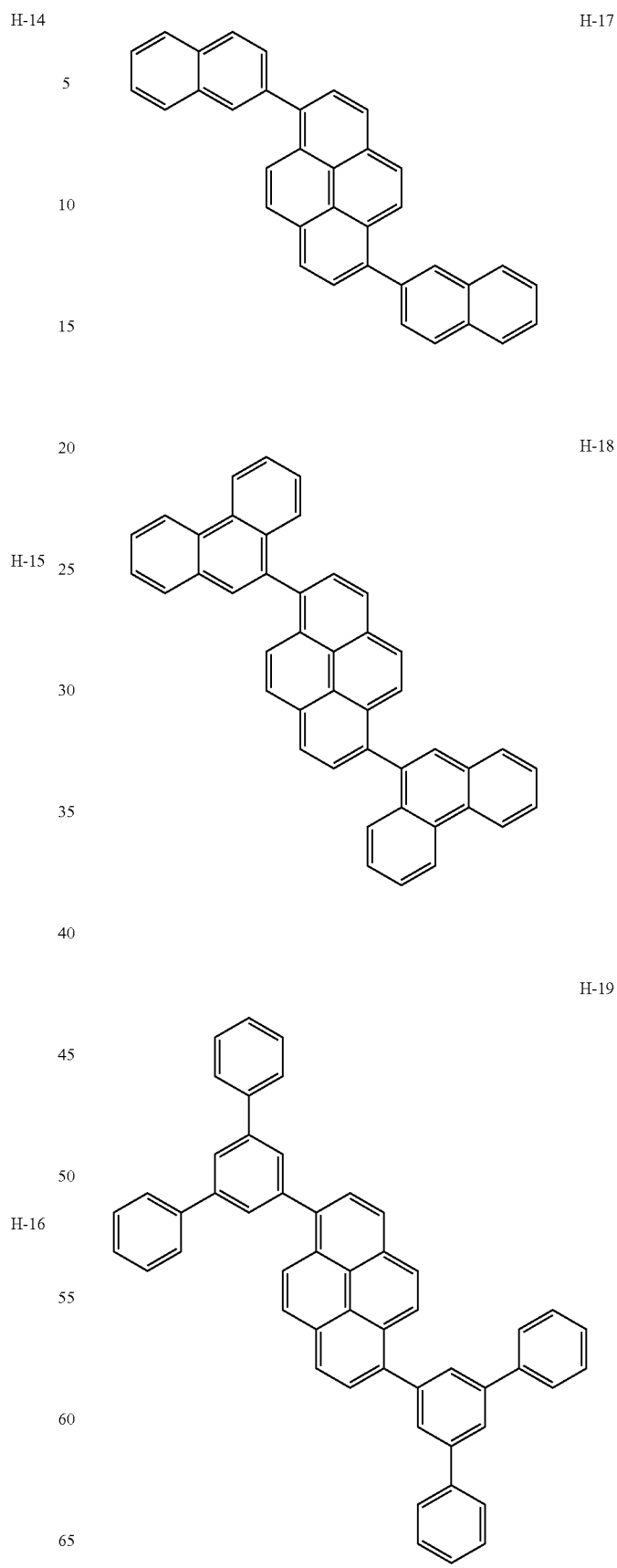

H-20
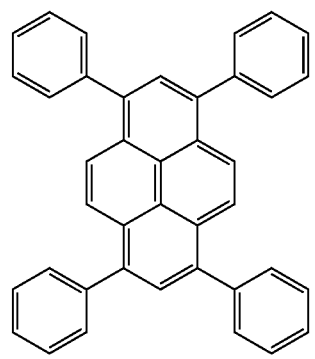
H-21
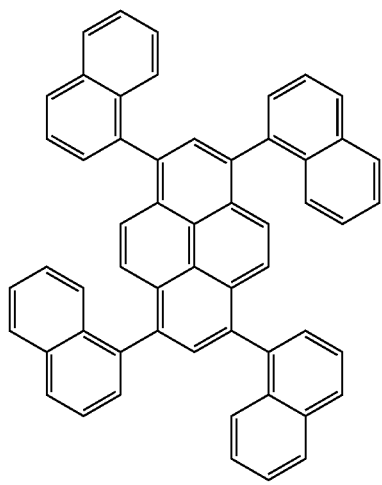
H-22
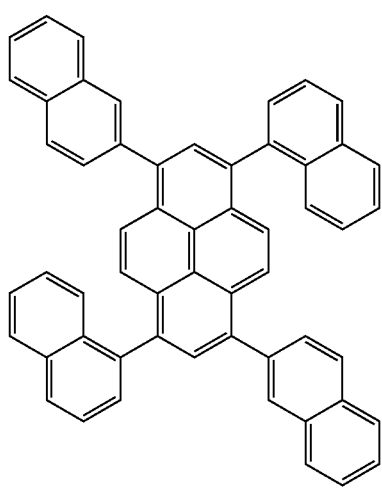
H-23
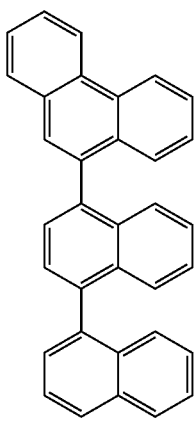
H-24
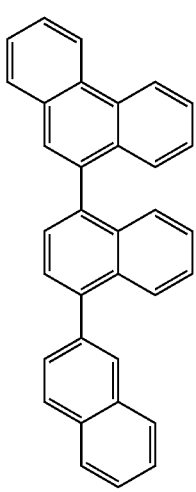
H-25
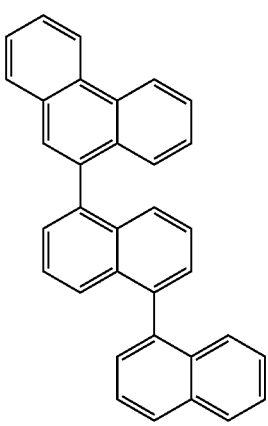

H-26
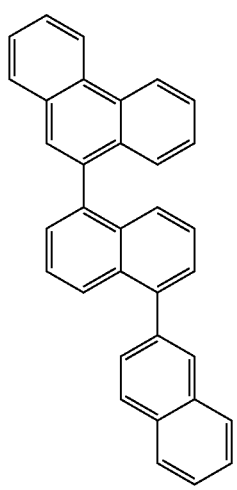
H-27
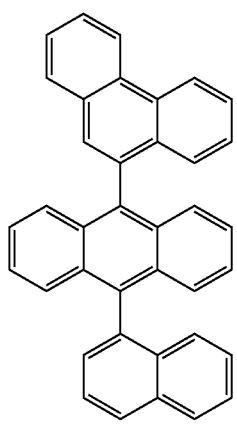
H-28
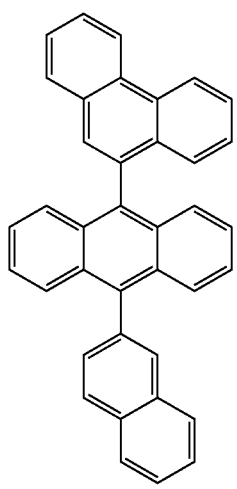
H-29
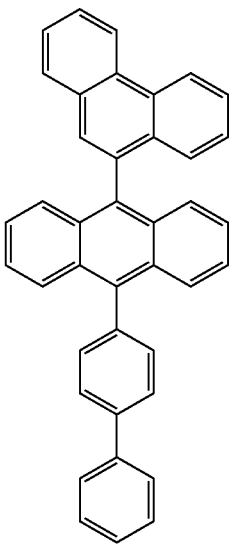
H-30
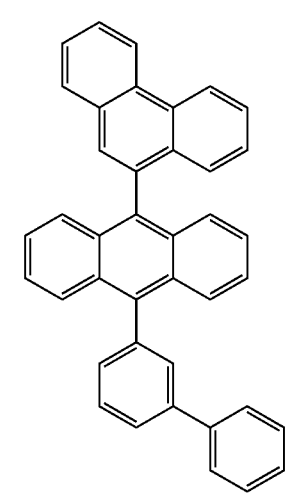
H-31
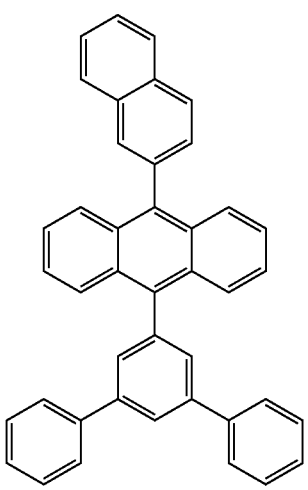

H-32

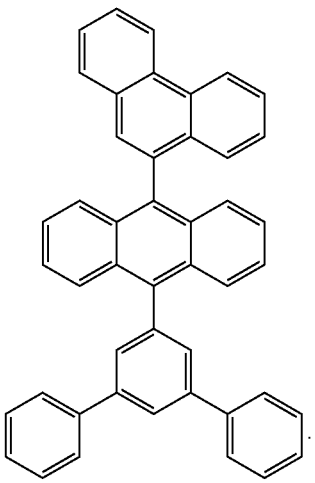

2. The device according to claim 1, wherein an emitting color of the device is orange.

3. The device according to claim 1, wherein an emitting color of the device is green.

4. The device according to claim 2, wherein a coordinate of the orange color is CIE X=0.45~0.60, CIE Y=0.30~0.50.

5. The device according to claim 3, wherein a coordinate of the green color is CIE X=0.00~0.45, CIE Y=0.35 ~0.85.

6. The device according to claim 1, wherein the doping concentration of the dopant is in the range of 0.5 to 10% by weight.

7. The device according to claim 1, wherein the host of the emitting layer is selected from the group consisting of H-2 to H-5, H-7 to H-115, and H-23 to H-32.

8. The device according to claim 7, wherein the host of the emitting layer is selected from the group consisting of H-2 to H-5, H-7 to H-10, and H-12 to H-32.

9. The device according to claim 1, 7 or 8, wherein the dopant of the emitting layer is selected from the group consisting of G-34 to G-66, G-101 to G-129, and G132 to G-156.

10. The device according to claim 1, 7 or 8, wherein the dopant of the emitting layer is selected from the group consisting of G-3, G-19, G-36, G-39, G-42, G-64, G-72, G-78, G-85, G-101, G-102, G-116, G-120, G-124, G-140, G-148, and G-153.

11. The device according to claim 8, wherein the host of the emitting layer is H-11, and the dopant of the emitting layer is selected from the group consisting of G-133 and G-146.

12. The device according to claim 11, wherein the dopant of the emitting layer is G-133.

13. The device according to claim 11, wherein the dopant of the emitting layer is G-146.

14. The device according to claim 7, wherein the host of the emitting layer is H-2.

15. The device according to claim 7, wherein the host of the emitting layer is H-3.

16. The device according to claim 7, wherein the host of the emitting layer is H-4.

* * * * *